(12) United States Patent
Nagahama

(10) Patent No.: US 12,148,787 B2
(45) Date of Patent: Nov. 19, 2024

(54) IMAGE SENSOR AND ELECTRONIC APPARATUS

(71) Applicant: Sony Semiconductor Solutions Corporation, Kanagawa (JP)

(72) Inventor: Yoshihiko Nagahama, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 674 days.

(21) Appl. No.: 17/284,699

(22) PCT Filed: Oct. 15, 2019

(86) PCT No.: PCT/JP2019/040372
§ 371 (c)(1),
(2) Date: Apr. 12, 2021

(87) PCT Pub. No.: WO2020/080327
PCT Pub. Date: Apr. 23, 2020

(65) Prior Publication Data
US 2021/0343776 A1 Nov. 4, 2021

(30) Foreign Application Priority Data
Oct. 17, 2018 (JP) ................................ 2018-195638

(51) Int. Cl.
*H01L 27/146* (2006.01)
*H04N 25/76* (2023.01)
(Continued)

(52) U.S. Cl.
CPC .............. *H01L 27/14641* (2013.01); *H01L 27/14621* (2013.01); *H01L 27/14627* (2013.01);
(Continued)

(58) Field of Classification Search
CPC ......... H01L 27/14634; H01L 27/14636; H01L 27/1464; H01L 27/14641; H01L 27/14645;
(Continued)

(56) References Cited

U.S. PATENT DOCUMENTS

2006/0197007 A1* 9/2006 Iwabuchi .......... H01L 27/14687
250/208.1
2010/0176271 A1* 7/2010 Rim .................. H01L 27/14634
250/208.1
(Continued)

FOREIGN PATENT DOCUMENTS

| CN | 101151730 A | 3/2008 |
|---|---|---|
| CN | 101840925 A | 9/2010 |

(Continued)

OTHER PUBLICATIONS

International Search Report issued in International Patent Application No. PCT/JP2019/040372 on Jan. 14, 2020 and English translation of same. 5 pages.
Written Opinion issued in International Patent Application No. PCT/JP2019/040372 on Jan. 14, 2020. 5 pages.

*Primary Examiner* — Omar F Mojaddedi
(74) *Attorney, Agent, or Firm* — K&L Gates LLP

(57) ABSTRACT

A first substrate having a plurality of photoelectric transducers formed on the first substrate, a second substrate having a pixel transistor for each of sets of two or more of the photoelectric transducers as a constituent unit, the pixel transistor being shared by the set and formed on the second substrate, and a second wiring which is connected to a first wiring formed on the second substrate via one contact, and is connected to a plurality of first elements, the first wiring leading to a second element shared by a plurality of first elements among a plurality of elements formed on the first (Continued)

substrate, each of the plurality of first elements being formed for each of the photoelectric transducers are included.

13 Claims, 43 Drawing Sheets

(51) Int. Cl.
*H04N 25/778* (2023.01)
*H04N 25/79* (2023.01)

(52) U.S. Cl.
CPC .......... *H01L 27/14634* (2013.01); *H01L 27/14636* (2013.01); *H01L 27/1464* (2013.01); *H01L 27/14645* (2013.01); *H01L 27/1469* (2013.01)

(58) Field of Classification Search
CPC ......... H01L 27/14603; H01L 27/14612; H01L 27/14625; H04N 25/76; H04N 25/79; H04N 25/778
See application file for complete search history.

(56) References Cited

U.S. PATENT DOCUMENTS

| | | | | |
|---|---|---|---|---|
| 2010/0238331 | A1* | 9/2010 | Umebayashi | H01L 27/1469 257/E31.097 |
| 2011/0096215 | A1* | 4/2011 | Choi | H01L 27/14612 257/E31.085 |
| 2017/0013211 | A1* | 1/2017 | Kato | H01L 27/14609 |
| 2017/0062501 | A1* | 3/2017 | Velichko | H01L 27/14641 |
| 2017/0317117 | A1* | 11/2017 | Ukigaya | H01L 27/14645 |

FOREIGN PATENT DOCUMENTS

| | | |
|---|---|---|
| CN | 102387324 A | 3/2012 |
| CN | 104247400 A | 12/2014 |
| EP | 2230691 A2 | 9/2010 |
| JP | 2010-245506 A | 10/2010 |
| JP | 2011-091400 A | 5/2011 |
| KR | 101648200 B1 | 8/2016 |
| KR | 20180008394 A | 1/2018 |
| WO | WO-2007105478 A1 | 9/2007 |
| WO | WO-2016/089551 A1 | 6/2016 |
| WO | WO-2018186192 A1 | 10/2018 |

* cited by examiner

IMAGE SENSOR AND ELECTRONIC APPARATUS

TECHNICAL FIELD

The present disclosure relates to an image sensor and an electronic apparatus, such as a camera, provided with the image sensor.

BACKGROUND ART

In an image capturing device such as complementary metal-oxide-semiconductor (CMOS), in one example, a configuration in which a first semiconductor substrate having a pixel region and a second semiconductor substrate having a logic circuit are stacked on top of each other is known (e.g., refer to Patent Document 1 or other related arts).

CITATION LIST

Patent Document

Patent Document 1: JP 2010-245506 A

SUMMARY OF THE INVENTION

Problems to be Solved by the Invention

The image capturing device disclosed in Patent Document 1 has a photoelectric transducer and a pixel transistor, both disposed on the same semiconductor substrate. The pixel transistor reads out an electric signal corresponding to the amount of light received by the photoelectric transducer. However, such a configuration fails to reduce the area of the substrate (the space of the substrate's surface on which circuit components such as transistors are formed) satisfactorily.

Thus, in one example, it is conceivable to stack individually the substrate on which the photoelectric transducer is formed (first substrate) and the substrate on which the pixel transistor is formed (second substrate) on top of each other. In such a configuration, in one example, it is assumed that a plurality of photoelectric transducers having a one-to-one correspondence with a plurality of pixels shares one pixel transistor. In this case, among elements (e.g., circuit components such as transistors) disposed on the first substrate, a plurality of first elements provided for respective corresponding photoelectric transducers is commonly connected to a second element to be a shared element.

The configuration described above is necessary to connect the plurality of first elements on the first substrate to the wiring that leads to the second element shared by the first elements and formed on the second substrate, using a contact one by one. This will increase the number of contacts for the wiring, causing the area to be large.

The present disclosure is intended to provide an image sensor and an electronic apparatus capable of reducing the substrate mounting area.

Solutions to Problems

In order to achieve the above-mentioned object, an image sensor according to the present disclosure is an image sensor including a first substrate having a plurality of photoelectric transducers formed on the first substrate, a second substrate having a pixel transistor for each of sets of two or more of the photoelectric transducers as a constituent unit, the pixel transistor being shared by the set and formed on the second substrate, and a second wiring which is connected to a first wiring formed on the second substrate via one contact, and is connected to a plurality of first elements, the first wiring leading to a second element shared by a plurality of first elements among a plurality of elements formed on the first substrate, each of the plurality of first elements being formed for each of the photoelectric transducers.

The term "element" used herein is a concept that includes the entirety or a part of circuit components, such as photoelectric transducers, transistors, and wirings (including electrodes), formed on a substrate (a semiconductor substrate). In addition, the term "pixel transistor" is a transistor that is used to read out an electric signal corresponding to the amount of light received by the photoelectric transducer and can be shared by a plurality of photoelectric transducers (pixels). In one example, the pixel transistor includes at least an amplification transistor that amplifies and outputs an electric signal supplied from the photoelectric transducer.

(Mode of operation) The image sensor of the present disclosure is provided with the first wiring and the second wiring. The first wiring formed on the second substrate leads to the second element shared by the plurality of first elements on the first substrate. The second wiring is connected to the first wiring via one contact and is connected to the plurality of first elements. In other words, the second wiring aggregates a plurality of first elements and is connected, via one contact, to the wiring leading to the second element shared (commonly connected) by the plurality of first elements. This makes it sufficient to set the number of contacts formed in the first wiring for connecting the plurality of first elements as a constituent unit for aggregation to the first wiring to one. Thus, it is possible to reduce the number of contacts and the area of the first wiring.

Further, the image sensor of the present disclosure has the first substrate on which the photoelectric transducer is formed and the second substrate on which the pixel transistor is formed. The first substrate and the second substrate are individually stacked on top of each other. Thus, it is possible to reduce the substrate's area.

Effects of the Invention

According to the present disclosure, it is possible to reduce the substrate's area. Note that the advantageous effects described here are not necessarily limitative, and any of the advantageous effects described in the present disclosure may be attained.

MODE FOR CARRYING OUT THE INVENTION

An example of an image sensor and an electronic apparatus according to an embodiment of the present disclosure is now described in detail with reference to the attached drawings. The description is given in the order below.

1. Schematic configuration example of image sensor
2. First embodiment (configuration example of image sensor)
3. Second embodiment (configuration example of image sensor)
4. Third embodiment (configuration example of image sensor)
5. Fourth embodiment (configuration example of image sensor)
6. Fifth embodiment (configuration example of image sensor)
7. Sixth embodiment (configuration example of image sensor)
8. Seventh embodiment (configuration example of electronic apparatus)
9. Modification
10. Application example
11. Usage example

1. Schematic Configuration Example of Image Sensor

Figure 1:
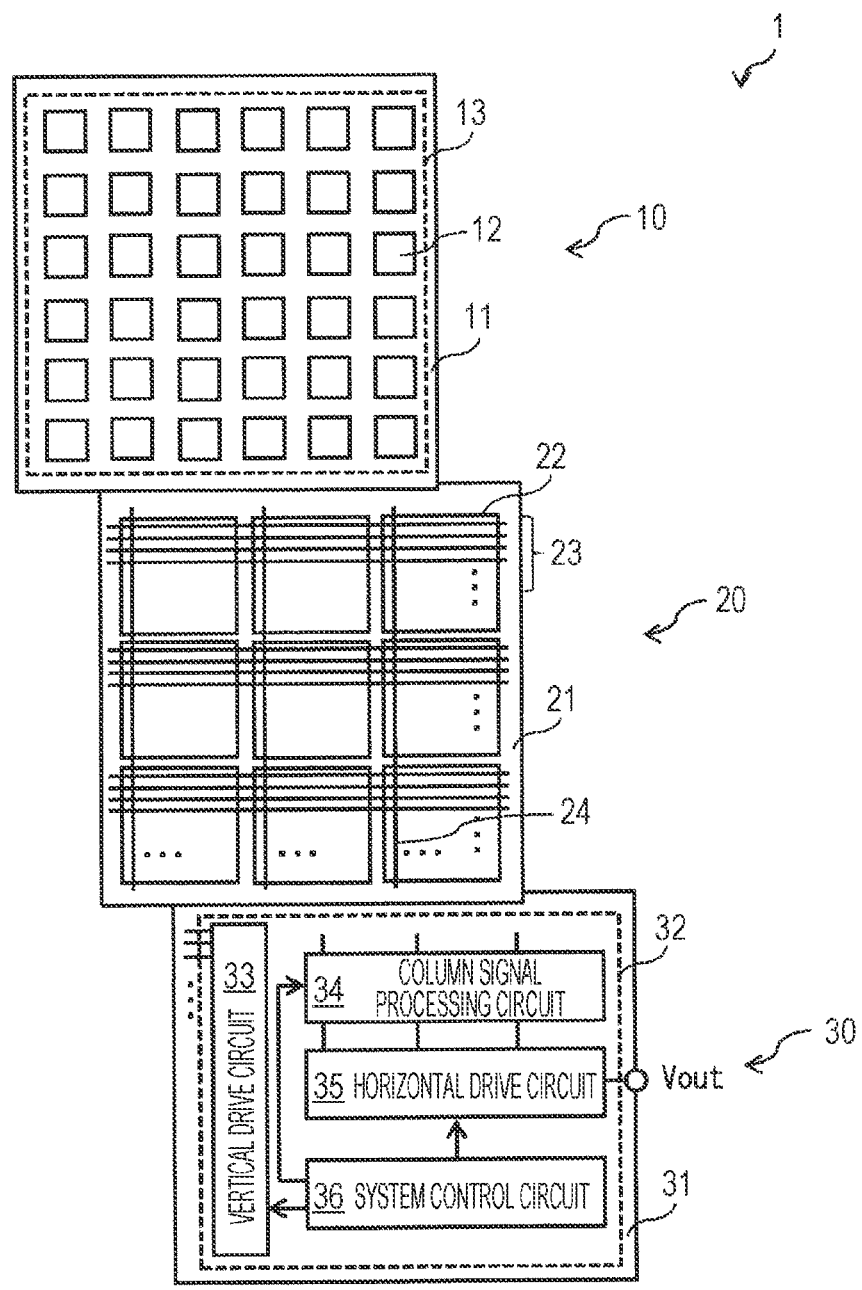
FIG. 1 is a diagram illustrating an example of a schematic configuration of an image sensor applied to each embodiment of the present disclosure.

FIG. 1 is a diagram illustrating an example of a schematic configuration of an image sensor 1 applied to each embodiment of the present disclosure. The image sensor 1 converts the received light into an electric signal and outputs it as a pixel signal. In this example, the image sensor 1 is configured as a CMOS image sensor.

FIG. 1 illustrates an example of a schematic configuration of the image sensor 1 according to an embodiment of the present disclosure. The image sensor 1 includes three substrates (a first substrate 10, a second substrate 20, and a third substrate 30). The image sensor 1 is an image capturing device having a three-dimensional structure in which three substrates (first substrate 10, second substrate 20, and third substrate 30) are joined together. The first substrate 10, the second substrate 20, and the third substrate 30 are stacked in this order on top of each other.

The first substrate 10 has a plurality of sensor pixels 12 that performs the photoelectric conversion. The sensor pixels 12 are disposed on a semiconductor substrate 11. The plurality of sensor pixels 12 is provided in a matrix in a pixel region 13 of the first substrate 10. The second substrate 20 has one readout circuit 22 for every four sensor pixels 12. The readout circuit 22 outputs a pixel signal based on the electric charge output from the sensor pixel 12 to a semiconductor substrate 303. The second substrate 20 has a plurality of pixel drive lines 23 extending in the row direction and a plurality of vertical signal lines 24 extending in the column direction. The third substrate 30 has a logic circuit 32 formed on a semiconductor substrate 31. The logic circuit 32 processes a pixel signal. The logic circuit 32 has, in one example, a vertical drive circuit 33, a column signal processing circuit 34, a horizontal drive circuit 35, and a system control circuit 36. The logic circuit 32 (specifically, the horizontal drive circuit 35 thereof) outputs the output voltage Vout for each sensor pixel 12 to the outside. The logic circuit 32 can have, in one example, a low-resistance region including a silicide prepared by performing a process using self-aligned silicide (salicide) such as $CoSi_2$ or NiSi, on the surface of the impurity diffusion region in contact with a source electrode and a drain electrode.

The vertical drive circuit 33 selects a plurality of sensor pixels 12, in one example, sequentially in row units. The column signal processing circuit 34 performs, in one example, correlated double sampling (CDS) processing on the pixel signal output from each sensor pixel 12 in the row selected by the vertical drive circuit 33. The column signal processing circuit 34 extracts, in one example, the signal level of the pixel signal by the CDS processing and holds pixel data corresponding to the amount of light received by each sensor pixel 12. The horizontal drive circuit 35 sequentially outputs, in one example, the pixel data held in the column signal processing circuit 34 to the outside. The system control circuit 36 controls, in one example, the driving of each block (i.e., the vertical drive circuit 33, the column signal processing circuit 34, and the horizontal drive circuit 35) in the logic circuit 32.

Figure 2:
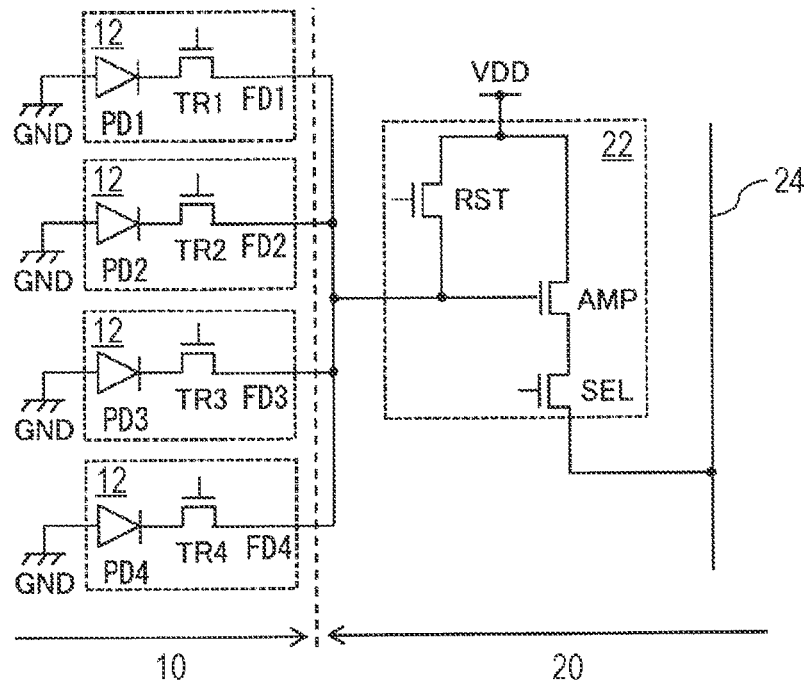
FIG. 2 is a diagram illustrating an example of a sensor pixel and a readout circuit of FIG. 1.

FIG. 2 is a diagram illustrating an example of a sensor pixel 12 and a readout circuit 22. The description below is given of a case where the four sensor pixels 12 share one readout circuit 22 as illustrated in FIG. 2. The term "share" used herein means that the outputs of the four sensor pixels 12 are input to the common readout circuit 22.

The sensor pixels 12 each have a constituent component common to each other. In FIG. 2, an identification number (i.e., 1, 2, 3, or 4) is attached to the end of the reference numeral denoting the component of each sensor pixel 12 to distinguish the components of each sensor pixel 12 from each other. In the case where it is necessary to distinguish the components of each sensor pixel 12 from each other, the identification number is attached to the end of the reference numeral of the component of each sensor pixel 12. However, in the case where it is not necessary to distinguish the components of each sensor pixel 12 from each other, the identification number at the end of the reference numeral of the component of each sensor pixel 12 can be omitted.

The sensor pixels 12 each have, in one example, a photodiode PD, a transfer transistor TR electrically connected to the photodiode PD, and a floating diffusion FD that temporarily holds the electric charge output from the photodiode PD via the transfer transistor TR. The photodiode PD corresponds to a specific implementation example of the "photoelectric transducer" of the present disclosure. The photodiode PD performs the photoelectric conversion to generate an electric charge corresponding to the amount of received light. The photodiode PD has the cathode electrically connected to the source of the transfer transistor TR and the anode electrically connected to the reference potential line (e.g., ground). The transfer transistor TR has the drain electrically connected to the floating diffusion FD and the gate electrically connected to the pixel drive line 23. The transfer transistor TR is, in one example, a complementary metal-oxide-semiconductor (CMOS) transistor.

The floating diffusion regions FDs of the sensor pixels 12 that share one readout circuit 22 are electrically connected to each other and are also electrically connected to the input terminal of the common readout circuit 22. The readout circuit 22 has, in one example, a reset transistor RST, a selection transistor SEL, and an amplification transistor AMP. Moreover, the selection transistor SEL can be omitted if necessary. The reset transistor RST has the source (the input terminal of the readout circuit 22) electrically connected to the floating diffusion FD and the drain electrically connected to a power supply line VDD and the drain of the amplification transistor AMP. The reset transistor RST has the gate electrically connected to the pixel drive line 23 (see FIG. 1). The amplification transistor AMP has the source electrically connected to the drain of the selection transistor SEL and the gate electrically connected to the source of the reset transistor RST. The selection transistor SEL (the output terminal of the readout circuit 22) has the source electrically connected to the vertical signal line 24 and the gate electrically connected to the pixel drive line 23 (see FIG. 1).

The transfer transistor TR, when turned on, transfers the electric charge of the photodiode PD to the floating diffusion FD. The reset transistor RST resets the potential of the floating diffusion FD to a predetermined potential. The reset transistor RST, when turned on, resets the potential of the floating diffusion FD to the potential of the power supply line VDD. The selection transistor SEL controls the output timing of the pixel signal from the readout circuit 22. The amplification transistor AMP generates a voltage signal, as a pixel signal, corresponding to the level of electric charge held in the floating diffusion FD. The amplification transistor AMP constitutes a source follower amplifier and outputs a pixel signal with a voltage corresponding to the level of electric charge generated by the photodiode PD. In the case where the selection transistor SEL is turned on, the amplification transistor AMP amplifies the potential of the floating diffusion FD and outputs a voltage corresponding to the amplified potential to the column signal processing circuit 34 via the vertical signal line 24. The reset transistor RST, the amplification transistor AMP, and the selection transistor SEL are, in one example, CMOS transistors.

As described above, for each constituent unit in which four sensor pixels 12 share one readout circuit 22 (can be referred to hereinafter as "shared constituent unit" or "shared constituent unit circuit"), four photoelectric transducer PDs, four transfer transistors TRs, one amplification transistor AMP, one reset transistor RST, and one selection transistor SEL are included. The transfer transistors TRs have a one-to-one correspondence with the photoelectric transducer PDs. In this example, four pixels (the sensor pixels 12 including at least the photoelectric transducer PD) share a combination of one amplification transistor AMP, one reset transistor RST, and one selection transistor SEL. In this example, the combination of one amplification transistor AMP, one reset transistor RST, and one selection transistor SEL corresponds to a "pixel transistor".

Further, as described above, a plurality of photodiodes PDs having a one-to-one correspondence with a plurality of pixels is formed on the first substrate 10 that corresponds to the "first substrate" of the present disclosure. More specifically, the transfer transistor TR used for transferring an electric signal output from the photodiode PD to the pixel transistor is also formed on the first substrate 10 for each of the plurality of photodiode PDs. In this description, two photodiode PDs, that are included in the plurality of photodiode PDs formed on the first substrate 10, correspond to the "first photoelectric transducer" and the "second photoelectric transducer", respectively. Then, the transfer transistor TR connected to the photodiode PD corresponding to the first photoelectric transducer corresponds to the "first transfer transistor", and the transfer transistor TR connected to the photodiode PD corresponding to the second photoelectric transducer corresponds to the "second transfer transistor". In other words, the first photoelectric transducer and the second photoelectric transducer are formed on the first substrate 10. Thus, it can be considered that the first substrate 10 has the first transfer transistor connected to the first photoelectric transducer and the second transfer transistor connected to the second photoelectric transducer.

Further, for each set of two or more (four in this example) photodiodes PDs as a constituent unit, the pixel transistor shared by the set is formed on the second substrate 20 corresponding to the "second substrate" of the present disclosure. More specifically, the pixel transistor, which includes at least one amplification transistor AMP that amplifies and outputs an electric signal transferred from each of the two or more transfer transistors TR included in the set, is formed on the second substrate 20 for each one or more sets. In this description, it can be considered that the pixel transistor connected to the first photoelectric transducer and the second photoelectric transducer is formed on the second substrate.

Figure 3:
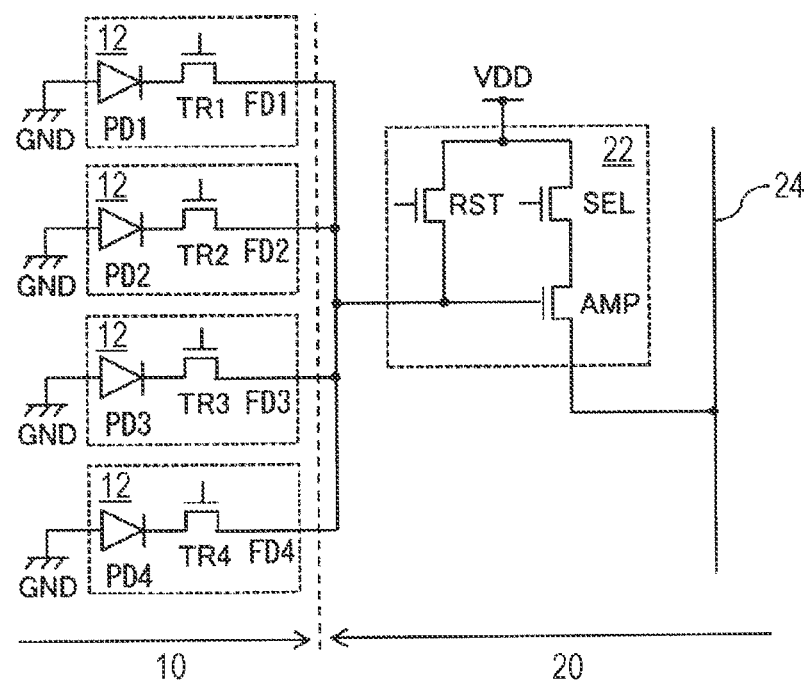
FIG. 3 is a diagram illustrating an example of a sensor pixel and a readout circuit of FIG. 1.
Figure 4:
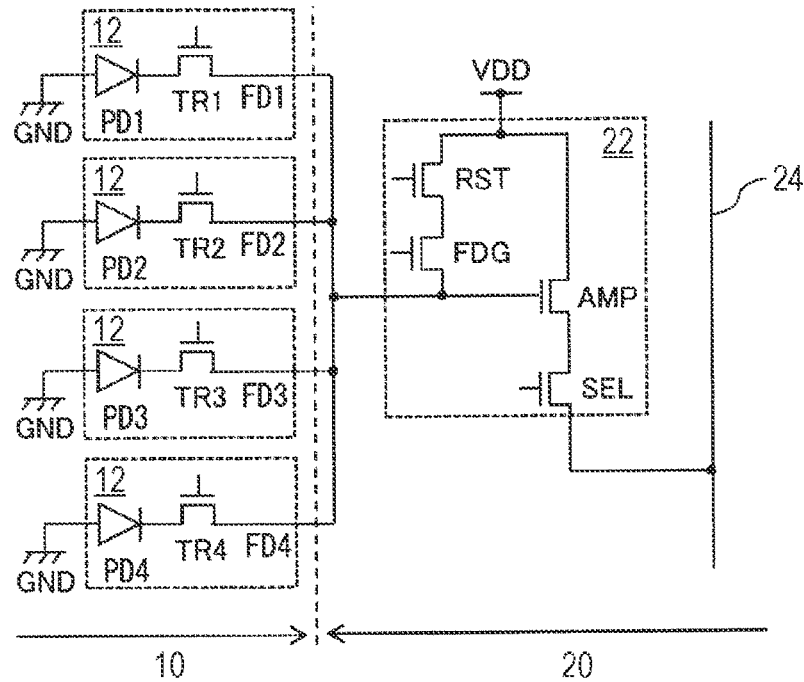
FIG. 4 is a diagram illustrating an example of a sensor pixel and a readout circuit of FIG. 1.
Figure 5:
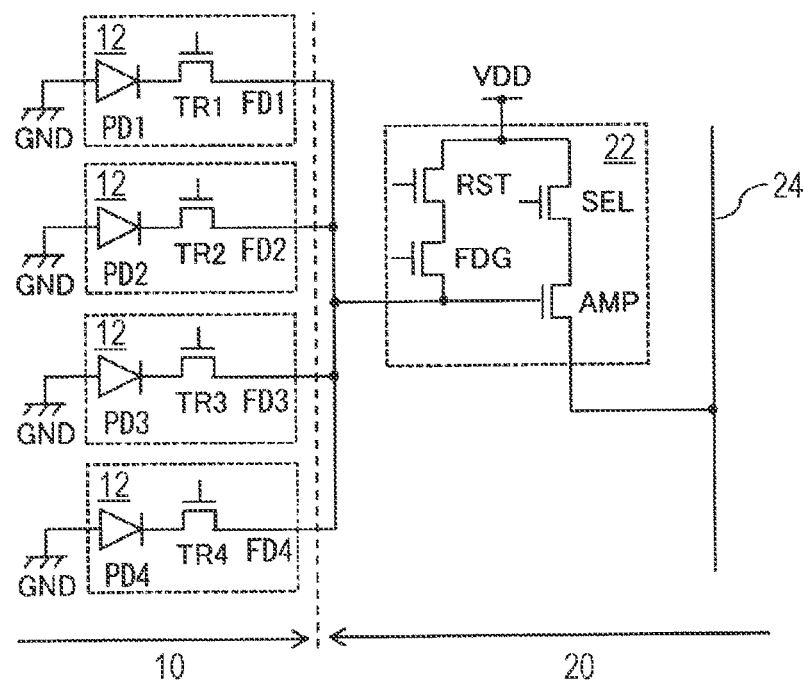
FIG. 5 is a diagram illustrating an example of a sensor pixel and a readout circuit of FIG. 1.

Moreover, as illustrated in FIG. 3, the selection transistor SEL can be provided between the power supply line VDD and the amplification transistor AMP. In this case, the drain of the reset transistor RST is electrically connected to the drain of the power supply line VDD and the selection transistor SEL. The source of the selection transistor SEL is electrically connected to the drain of the amplification transistor AMP, and the gate of the selection transistor SEL is electrically connected to the pixel drive line 23 (see FIG. 1). The source of the amplification transistor AMP (the output terminal of the readout circuit 22) is electrically connected to the vertical signal line 24, and the gate of the amplification transistor AMP is electrically connected to the source of the reset transistor RST. In addition, as illustrated in FIGS. 4 and 5, an FD transfer transistor FDG can be provided between the source of the reset transistor RST and the gate of the amplification transistor AMP.

The FD transfer transistor FDG is used for switching the conversion efficiency. The pixel signal is generally small upon shooting at a dark place. If the capacitance of the floating diffusion FD (FD capacitance C) is large in performing the charge-to-voltage conversion on the basis of the formula $Q=CV$, the V upon the conversion to the voltage by the amplification transistor AMP will be small. On the other hand, at a bright place, the pixel signal is large, so unless the FD capacitance C is large, the floating diffusion FD fails to receive the electric charge of the photodiode PD. Furthermore, the FD capacitance C is necessary to be large so that V upon the conversion to a voltage by the amplification transistor AMP does not become too large (in other words, to keep it small). In consideration of this fact, in the case where the FD transfer transistor FDG is turned on, the gate capacitance of the FD transfer transistor FDG increases, so the total FD capacitance C increases. On the other hand, in the case where the FD transfer transistor FDG is turned off, the total FD capacitance C is smaller. Thus, the on/off switching of the FD transfer transistor FDG makes the FD capacitance C variable, enabling the conversion efficiency to be switched.

Figure 6:
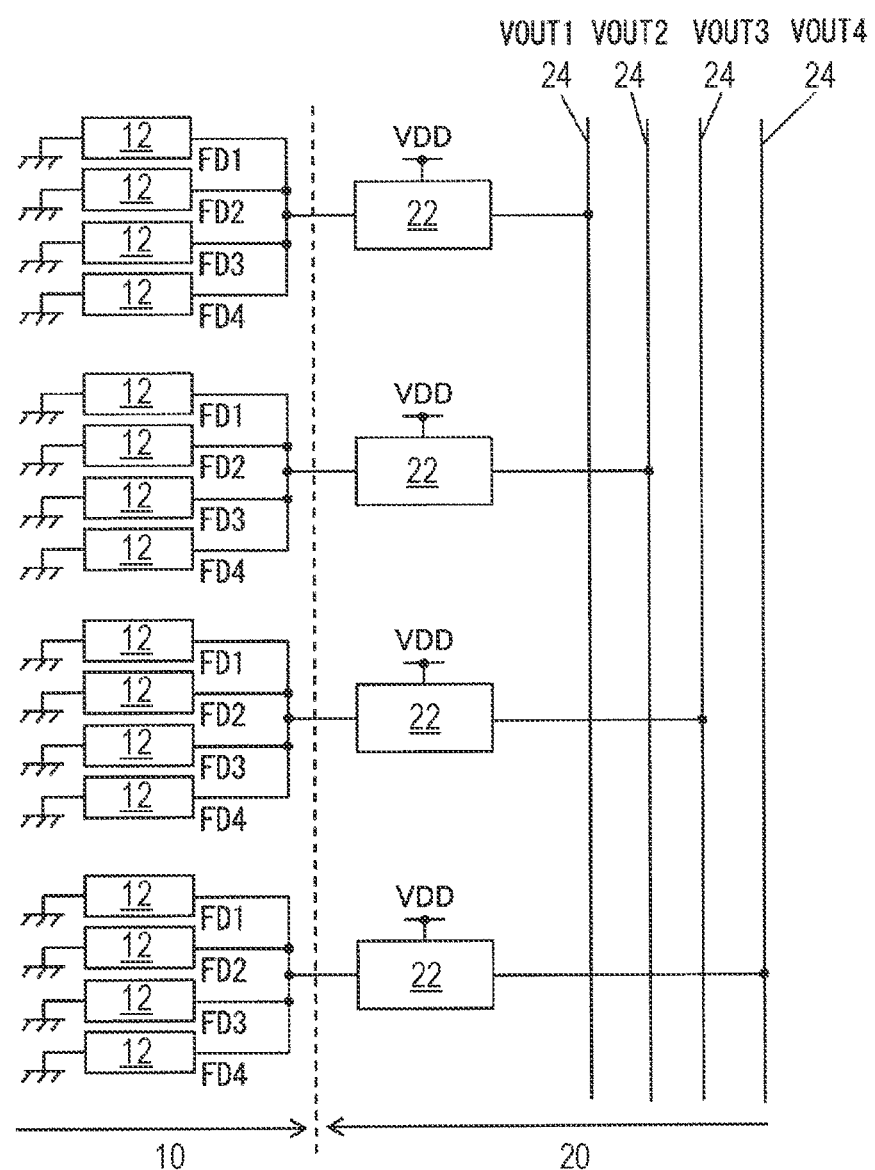
FIG. 6 is a diagram illustrating an example of a connection mode between a plurality of readout circuits and a plurality of vertical signal lines.

FIG. 6 is a diagram illustrating an example of a connection mode between a plurality of readout circuits 22 and a plurality of vertical signal lines 24. In the case where the plurality of readout circuits 22 is arranged side by side in the extending direction (e.g., the column direction) of the vertical signal lines 24, the plurality of vertical signal lines 24 can be assigned individually to the readout circuits 22. In one example, in the case where the four readout circuits 22 are arranged side by side in the extending direction (e.g., the column direction) of the vertical signal lines 24 as illustrated in FIG. 6, four vertical signal lines 24 can be assigned to the individual corresponding readout circuits 22. Moreover, in FIG. 6, to distinguish each vertical signal line 24, an identification number (1, 2, 3, or 4) is attached to the end of the reference numeral of each vertical signal line 24.

2. First Embodiment (Configuration Example of Image Sensor)

The configuration of the image sensor 1 according to the first embodiment is now described together with a method of manufacturing the same.

Figure 7:
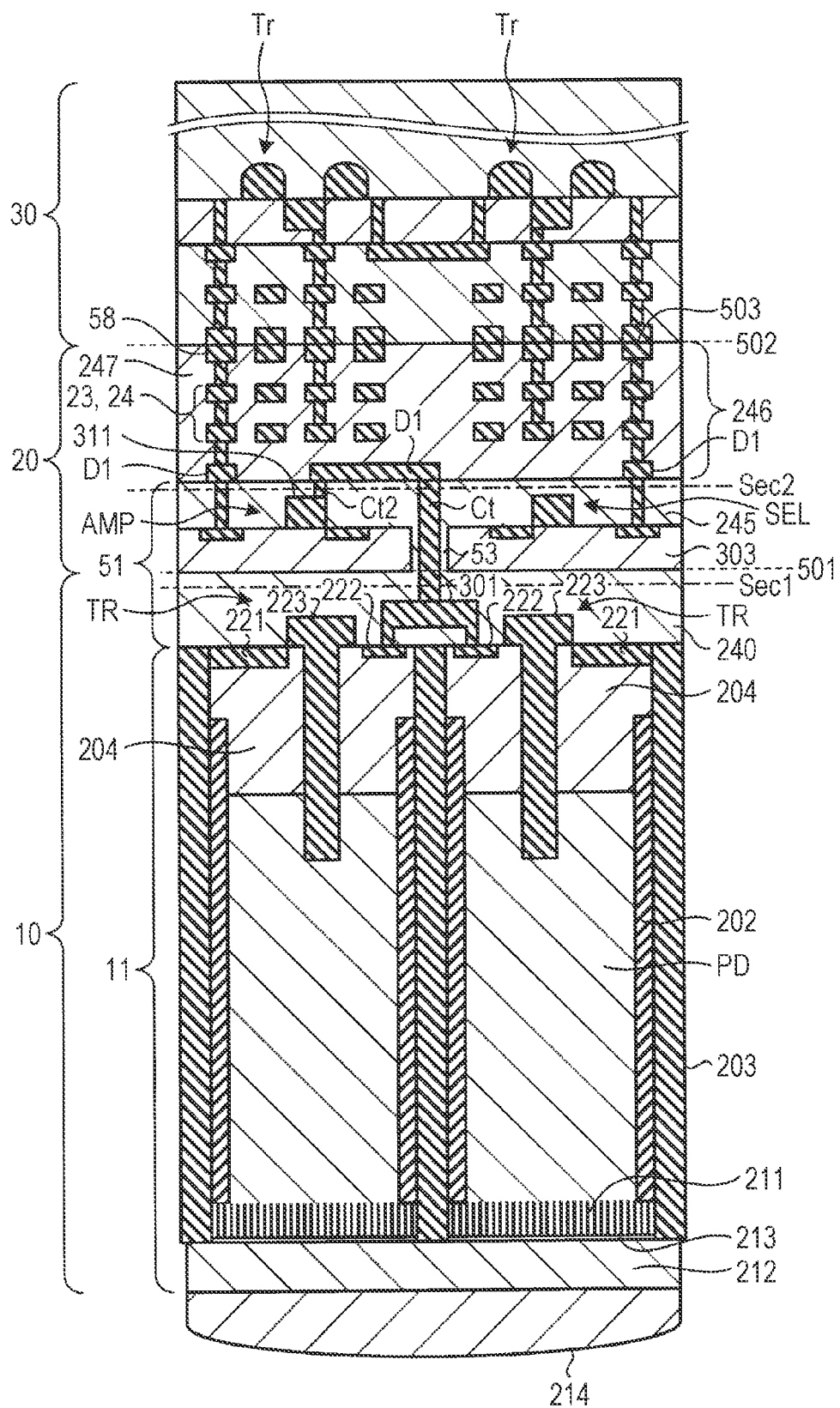
FIG. 7 is a diagram illustrating an example of a cross-sectional configuration in the vertical direction of the image sensor of FIG. 1.

FIG. 7 is a diagram illustrating a part of a cross-section corresponding to one shared constituent unit circuit of the image sensor 1 according to the present embodiment. As illustrated in FIG. 7, the image sensor 1 includes the first substrate 10, the second substrate 20, and the third substrate 30, which are stacked on top of each other and electrically connected. The third substrate 30 has a peripheral circuit formed thereon. In this example, the peripheral circuit includes the logic circuit 32 having the vertical drive circuit 33, the column signal processing circuit 34, the horizontal drive circuit 35, and the system control circuit 36. The peripheral circuit is formed on the third substrate 30. Besides, in one example, the entirety or a part of the elements (such as the vertical drive circuit 33, the column signal processing circuit 34, the horizontal drive circuit 35, and the system control circuit 36) included in the peripheral circuit can be formed on the first substrate 10 or the second substrate 20. In this example, the third substrate 30 includes at least the logic circuit 32. The logic circuit 32 corresponds to a "logic circuit formed on the second substrate for processing a signal generated by the first photoelectric transducer or the second photoelectric transducer". The third substrate 30 corresponds to the "third substrate" of the present disclosure. Moreover, a surface 501 illustrated in FIG. 7 indicates a surface on which the first substrate 10 and the second substrate 20 are joined together. In addition, a surface 502 illustrated in FIG. 7 indicates a surface on which the second substrate 20 and the third substrate 30 are joined together.

The image sensor 1 according to the present embodiment includes a first wiring and a second wiring. The first wiring is formed on the second substrate 20 and leads to a second element shared by a plurality of first elements provided for each photodiode PD among the plurality of elements formed on the first substrate 10. The second wiring is connected to the first wiring via one contact. The plurality of first elements is connected to the second wiring. In the example of FIG. 7, the image sensor 1 is provided with a wiring 301 ("second wiring") that connects the output terminal side ("first element") of the plurality of transfer transistors TRs to a wiring D1 ("first wiring") formed on the second substrate 20 via one contact. The wiring D1 leads to the gate ("second element") of the amplification transistor AMP shared (commonly connected) by the output terminal side of the plurality of transfer transistors TRs. Details thereof will be described later.

The configuration of the image sensor 1 illustrated in FIG. 7 is now described. As illustrated in FIG. 7, the first substrate 10 is configured by stacking an insulating layer 240 on top of the semiconductor substrate 11. The first substrate 10 has the insulating layer 240 as a part of an interlayer insulating film 51. The insulating layer 240 is provided in a gap between the semiconductor substrate 11 and the semiconductor substrate 303 described later. The semiconductor substrate 11 is configured as a silicon substrate. The semiconductor substrate 11 has, in one example, a P-type semiconductor region 204 (P-well) in a part of the surface or the vicinity thereof and has a conductive (N-type) photodiode PD different from the P-type semiconductor region 204 in other regions (regions deeper than the P-type semiconductor region 204).

The plurality of photodiode PDs is formed on the first substrate 10. In addition, a plurality of transfer transistors TRs having a one-to-one correspondence with the plurality of photodiode PDs is formed on the first substrate 10. In the example of FIG. 7, the photodiode PD is formed in the N-type semiconductor region, and a P-type semiconductor region 202 different from the photodiode PD is formed to cover the side surface thereof. The photodiodes PDs are electrically separated from each other by a pixel separation portion 203 used for separating (dividing) pixels. In one example, the pixel separation portion 203 includes a metal, an insulating film (e.g., $SiO_2$), a combination thereof, or the like.

On the lower surface of the photodiode PD, an insulating film 211 is formed to cover the first substrate 10. The insulating film 211 includes, in one example, a film having a fixed electric charge or the like. An additional insulating film as a planarization film 213 can be formed between the insulating film 211 and a color filter 212. The insulating film 211 includes a metal oxide film such as hafnium oxide, tantalum oxide, or aluminum oxide. The planarization film 213 includes an insulating film such as silicon oxide or silicon nitride. Moreover, the insulating film 211 and the planarization film 213 each can be provided in the form of a plurality of layers. An on-chip lens 214 is formed under the color filter 212. The on-chip lens 214 condenses the irradiated light, and the condensed light is guided to the photodiode PD through the color filter 212.

Further, an N-type transfer transistor TR is formed on the photodiode PD. More specifically, the P-type semiconductor region 204 (P-well) is formed on the photodiode PD in the first substrate 10, and an N-type drain region 221 and an N-type source region 222 are formed in the vicinity of the surface of the semiconductor region 204. Then, a gate electrode 223 is formed between the N-type drain region 221 and the N-type source region 222 on the semiconductor region 204. In this example, the gate electrode 223 leads to the photodiode PD. In addition, in this example, the P-type semiconductor region 202 covering the side surface of the photodiode PD protrudes to cover a part of the side surface of the semiconductor region 204, but its configuration is not limited to the example above. The P-type semiconductor region 202 can have any depth. In one example, the upper surface of the semiconductor region 202 can be flush with the lower surface of the semiconductor region 204.

Figure 8:
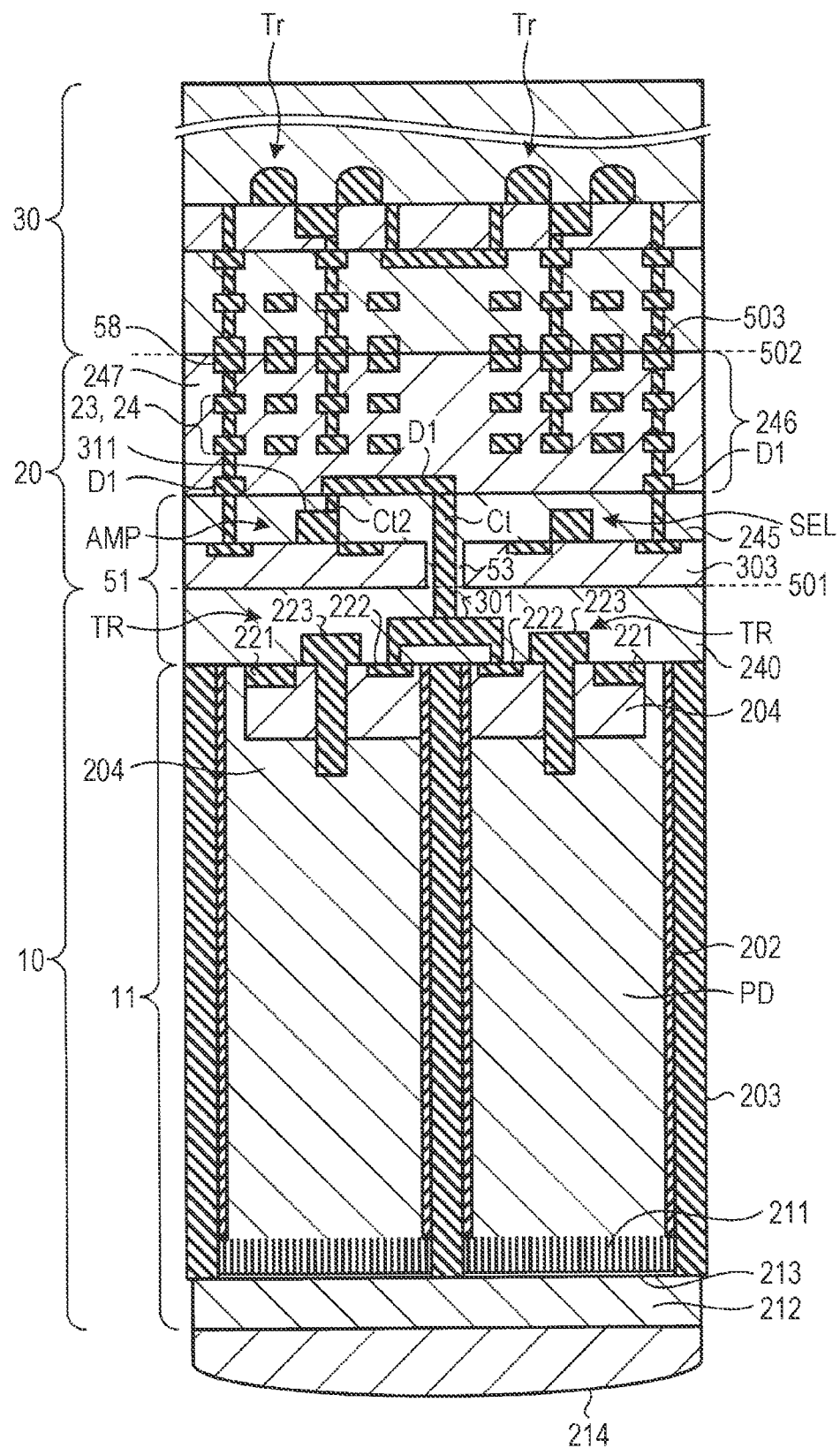
FIG. 8 is a diagram illustrating a modification of an N-type semiconductor region that constitutes a photodiode of a first embodiment.
Figure 9:
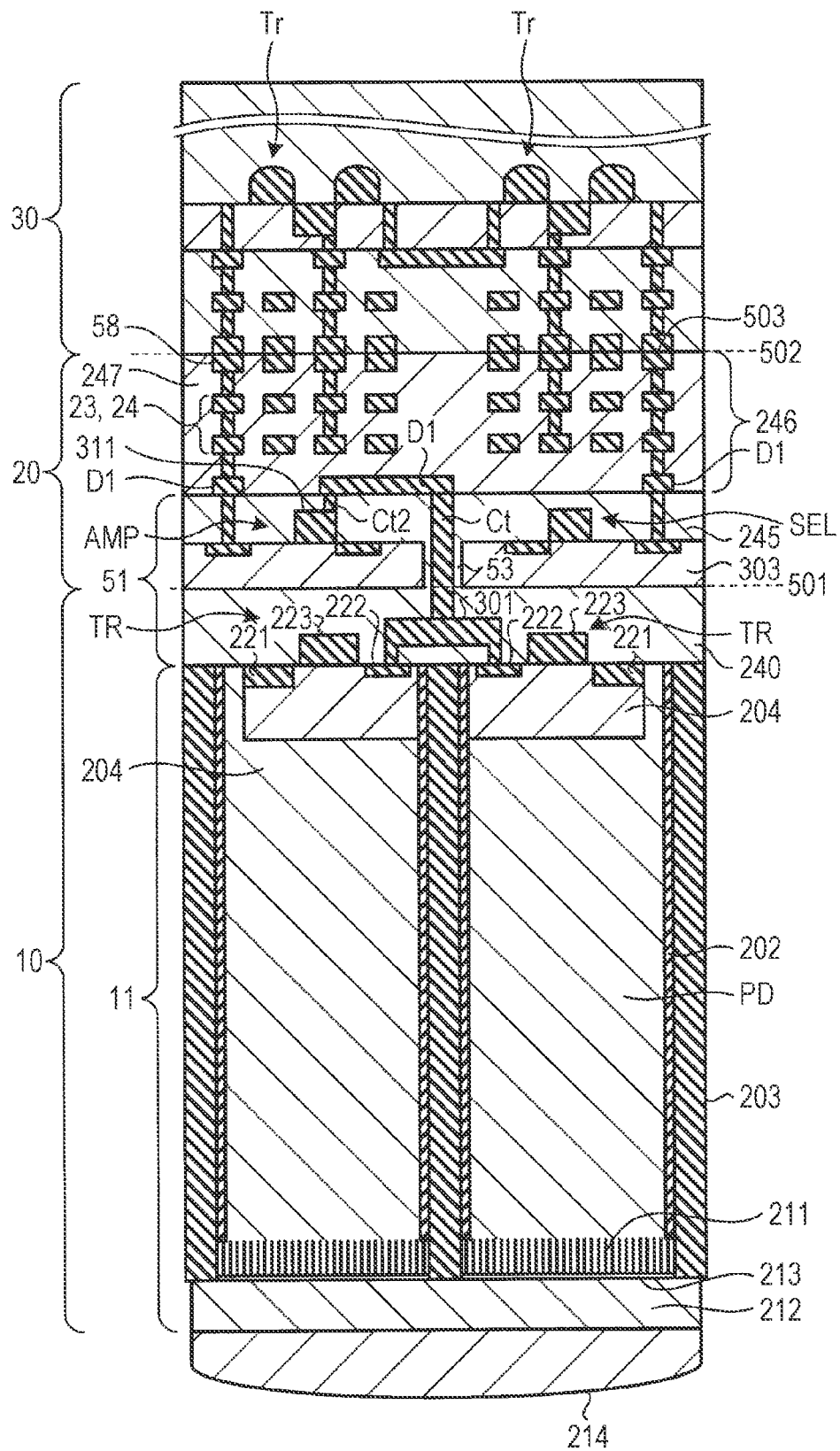
FIG. 9 is a diagram illustrating a modification of the structure of the image sensor of the first embodiment.

Further, the photodiode PD can have any depth, and in one example, as illustrated in FIG. 8, a part of the photodiode PD reaches the same height as the surface of the P-type semiconductor region 204 on which the transfer transistor TR is formed. In such a case, the P-type semiconductor region is preferably formed on the N-type photodiode PD, but its arrangement can be a form rather than the configuration illustrated in FIG. 8. Furthermore, in one example, as illustrated in FIG. 9, the gate electrode 223 of the transfer transistor TR can be formed on the semiconductor region 204 without leading to the photodiode PD. In other words, the transfer transistor TR can have a planar transfer gate (the gate electrode 223).

The description continues referring back to FIG. 7. As illustrated in FIG. 7, the source region 222 of each transfer transistor TR is connected to the wiring 301. In this example, the source region 222 is an N-type semiconductor region, so the wiring 301 is formed as P-type polysilicon. Each transfer transistor TR and the wiring 301 are covered with the insulating layer 240, and the semiconductor substrate 303 is formed on the insulating layer 240.

Moreover, it can be considered that the combination of the semiconductor substrate 303 and each element formed on the semiconductor substrate 303 corresponds to the "second substrate" of the present disclosure, or it can also be considered that only the semiconductor substrate 303 corresponds to the "second substrate" of the present disclosure. Similarly, for the first substrate 10, it can be considered that the combination of a base silicon substrate and each element formed on the silicon substrate corresponds to the "first substrate" of the present disclosure, or it can also be considered that only the silicon substrate corresponds to the "first substrate" of the present disclosure.

As described above, the second substrate 20 has a pixel transistor formed thereon. The pixel transistor includes at least the amplification transistor AMP. In this example, each transistor included in the pixel transistor is an N-channel MOS transistor, and the semiconductor substrate 303 is a P-type silicon substrate.

The wiring 301 is connected to the wiring D1 formed on the second substrate 20 via a contact Ct penetrating the semiconductor substrate 303. In this example, the second substrate 20 is configured by stacking an insulating layer 245 on top of the semiconductor substrate 303. The second substrate 20 has the insulating layer 245 as a part of the interlayer insulating film 51. The insulating layer 245 is provided in the gap between the semiconductor substrate 303 and the semiconductor substrate 31 described later. The second substrate 20 has one readout circuit 22 for every four sensor pixels 12. The second substrate 20 has the arrangement in which the readout circuit 22 is provided on the surface side (the side of the third substrate 30) of the semiconductor substrate 303. The second substrate 20 is joined to the first substrate 10 with the back surface of the semiconductor substrate 303 facing the front surface side of the semiconductor substrate 11. In other words, the second substrate 20 is joined to the first substrate 10 in a face-to-back orientation. The second substrate 20 further has an insulating layer 53 penetrating the semiconductor substrate 303 in the same layer as the semiconductor substrate 303. The second substrate 20 has the insulating layer 53 as a part of the interlayer insulating film 51. The insulating layer 53 is provided to cover the side surface of the contact Ct penetrating the semiconductor substrate 303.

The stacked structure having the first substrate 10 and the second substrate 20 has one contact Ct for each sensor pixel 12. The first substrate 10 and the second substrate 20 are electrically connected to each other via the contact Ct. Specifically, the contact Ct is electrically connected to the floating diffusion FD and the wiring D1 described later.

The stacked structure having the first substrate 10 and the second substrate 20 further has through wirings 47 and 48 (see FIG. 12 or the like described later) provided in the interlayer insulating film 51. The stacked structure has one through wiring 47 and one through wiring 48 for each sensor pixel 12. The through wirings 47 and 48 extend in the normal direction of the semiconductor substrate 303 and are provided to penetrate the semiconductor substrate 303. The first substrate 10 and the second substrate 20 are electrically connected to each other with the through wirings 47 and 48.

Specifically, the through wiring 47 is electrically connected to the P-type semiconductor region 204 of the semiconductor substrate 11 and the wirings in the second substrate 20. The through wiring 48 is electrically connected to the gate electrode 223 of the transfer transistor TR and the pixel drive line 23.

The above-mentioned contact Ct penetrates the insulating layer 245 and is connected to the wiring D1 included in a wiring layer 246 formed on the insulating layer 245. The wiring layer 246 includes, in one example, an insulating layer 247 and the plurality of pixel drive lines 23, the plurality of vertical signal lines 24, or the like provided in the insulating layer 247. The wiring layer 246 further has, in one example, a plurality of pad electrodes 58 in the insulating layer 47. Each pad electrode 58 includes, in one example, a metal such as copper (Cu) or aluminum (Al). Each pad electrode 58 is exposed on the surface of the wiring layer 246. Each pad electrode 58 is used for electrical connection between the second substrate 20 and the third substrate 30 and is used for joining the second substrate 20 and the third substrate 30 to each other. The plurality of pad electrodes 58 is provided, in one example, for each of the pixel drive line 23 and the vertical signal line 24 one by one. In this example, the total number of pad electrodes (or the total number of joints between the pad electrodes 58 and the pad electrodes 64 (described later) is smaller than the total number of sensor pixels 12 included in the first substrate 10.

The wiring D1 described above is connected to the gate electrode 311 of the amplification transistor AMP via a contact Ct2. Moreover, the region ranging from the source region 222 to the gate electrode 311 via the wiring 301 and the wiring D1 is a region that functions as the above-mentioned floating diffusion FD.

In other words, the wiring 301 aggregates the source region 222 (the output terminal side) of each transfer transistor TR of the first substrate 10. Then, the wiring 301 connects the aggregated source region 222 to the wiring D1 of the second substrate 20 via one contact Ct. The wiring D1 leads to the gate electrode 311 of the amplification transistor AMP shared by the source region 222 of each transfer transistor TR. Moreover, in this example, the wiring 301 is formed integrally, but its configuration is not limited to the example described above, and in one example, wirings formed as different materials can be coupled to each other. In one example, a wiring extending in the vertical direction from the source region 222 (the output terminal side or FD) of each transfer transistor TR and a common wiring extending in the horizontal direction are formed as different materials, and they can be coupled to each other to constitute the wiring 301.

In this example, the source region 222 (the output terminal side) of the transfer transistor TR corresponds to the "first element" provided for each photodiode PD among the plurality of elements formed on the first substrate 10. Besides, the gate electrode 311 (the gate) of the amplification transistor AMP corresponds to the "second element" to which a plurality of first elements is commonly connected. In addition, the wiring D1 is a wiring leading to the second element shared by the plurality of first elements and corresponds to the "first wiring" formed on the second substrate 20. In addition, the wiring D1 also corresponds to the "second wiring formed on the second substrate 20". Furthermore, the wiring 301 corresponds to the "second wiring", which is connected to the first wiring via one contact Ct and to which a plurality of first elements is connected. In addition, as described above, the wiring 301 is connected (indirectly connected) to the respective corresponding photodiodes PDs via the source region 222 of the transfer transistor TR. In other words, it can be considered that the wiring 301 is the "first wiring formed on the first substrate 10 and connected to the first photoelectric transducer and the second photoelectric transducer". Moreover, the term "connection" used herein includes not only a form of being directly connected but also a form of being indirectly connected as described above. In addition, the wiring 301 is connected to the source region 222 of each transfer transistor TR. In other words, it can be considered that the wiring 301 is connected to a first floating diffusion region connected to the first transfer transistor and a second floating diffusion region connected to the second transfer transistor. In addition, the contact Ct corresponds to a "third wiring formed to penetrate the first substrate 10 and the second substrate 20 and connected to the first wiring and the second wiring".

The third substrate 30 is configured by, in one example, stacking an interlayer insulating film 61 on the semiconductor substrate 31. The semiconductor substrate 31 is configured as a silicon substrate. The third substrate 30 has the logic circuit 32 provided on the front surface side of the semiconductor substrate 31. The third substrate 30 further has, in one example, a wiring layer 62 on the interlayer insulating film 61. The wiring layer 62 has, in one example, an insulating layer 63 and a plurality of pad electrodes 64 provided in the insulating layer 63. The plurality of pad electrodes 64 is electrically connected to the logic circuit 32. Each pad electrode 64 includes, for example, copper (Cu). Each pad electrode 64 is exposed on the front surface of the wiring layer 62. Each pad electrode 64 is used for electrical connection between the second substrate 20 and the third substrate 30 and is used for joining the second substrate 20 and the third substrate 30. In addition, the number of pad electrodes 64 is not necessarily plural, and even one pad electrode 64 can be electrically connected to the logic circuit 32. The second substrate 20 and the third substrate 30 are electrically connected to each other by joining the pad electrodes 58 and 64 mutually. In other words, the gate electrode 223 of the transfer transistor TR is electrically connected to the logic circuit 32 via the above-mentioned contact Ct and the pad electrodes 58 and 64. The third substrate 30 is joined to the second substrate 20 with the surface of the semiconductor substrate 31 facing the front surface side of the semiconductor substrate 303. In other words, the third substrate 30 is joined to the second substrate 20 in a face-to-face orientation.

Figure 10:
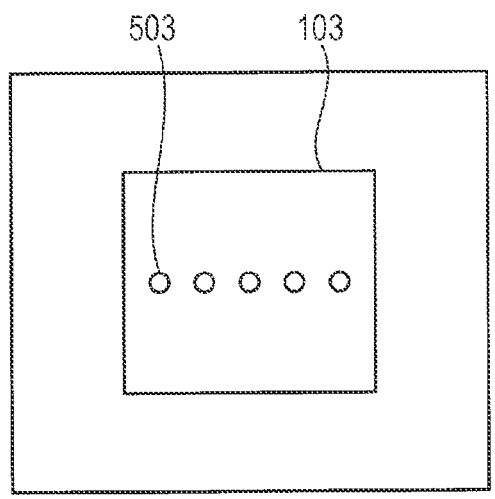
FIG. 10 is a diagram illustrating the arrangement of a joint point between a second substrate and a third substrate.
Figure 11:
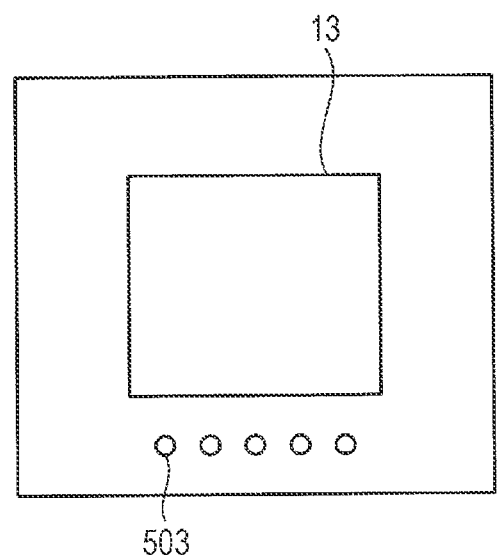
FIG. 11 is a diagram illustrating a modification of arrangement of joint points between the second substrate and the third substrate.

As illustrated in FIG. 10, a junction point 503 between the pad electrode 58 of the second substrate 20 and the pad electrode 64 of the third substrate 30 is arranged on top of the pixel region 13. However, its arrangement is not limited to the example described above, and in one example, the form as illustrated in FIG. 11 can be employed. In the form of FIG. 11, the junction point 503 between the pad electrode 58 of the second substrate 20 and the pad electrode 64 of the third substrate 30 is arranged on top of the outer region of the pixel region 13. In other words, the pad electrode 58 of the second substrate 20 can be disposed outside the pixel region 13 and can be connected to the pad electrode 64 of the third substrate 30.

Figure 12:
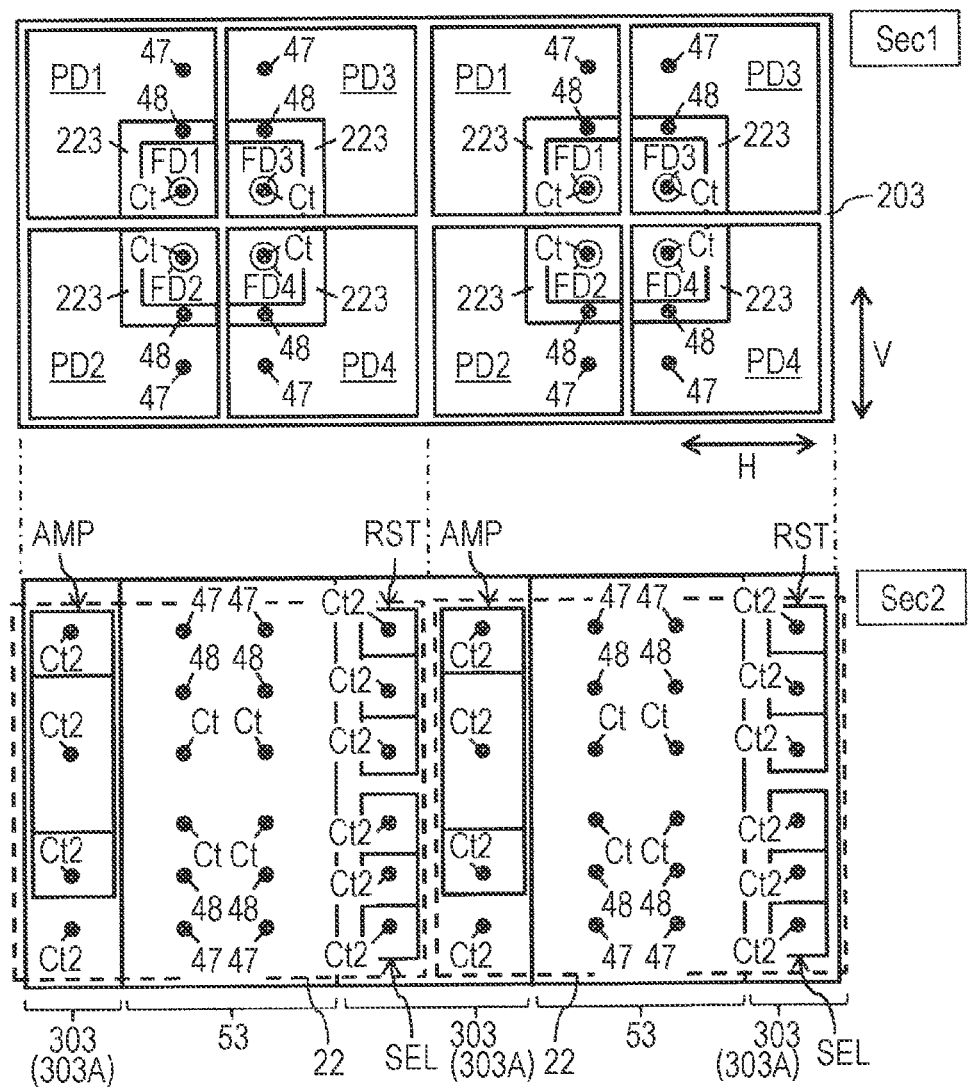
FIG. 12 is a diagram illustrating an example of a cross-sectional configuration in the horizontal direction of the image sensor of FIG. 1.
Figure 13:
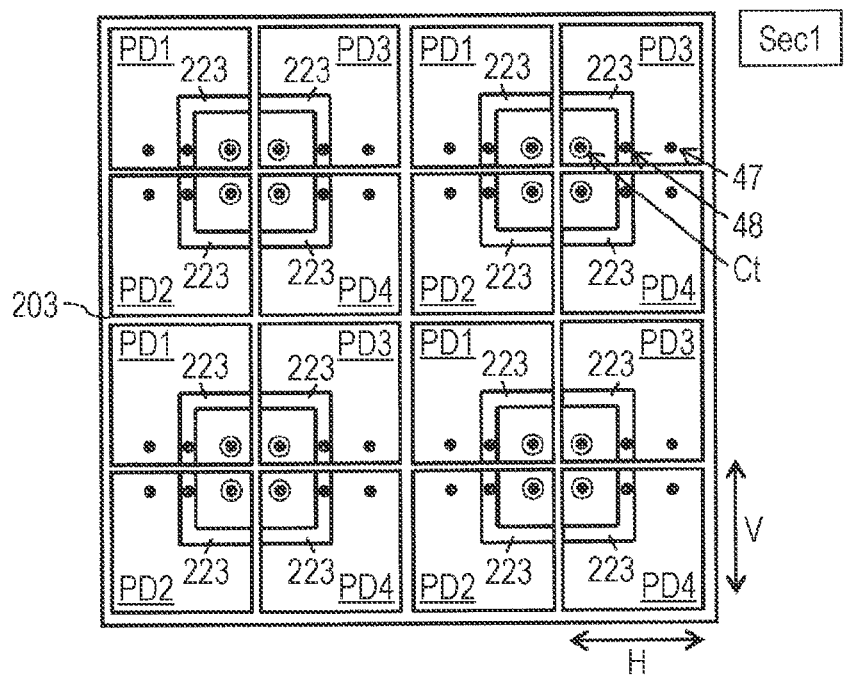
FIG. 13 is a diagram illustrating an example of a cross-sectional configuration in the horizontal direction of the image sensor of FIG. 1.
Figure 13:
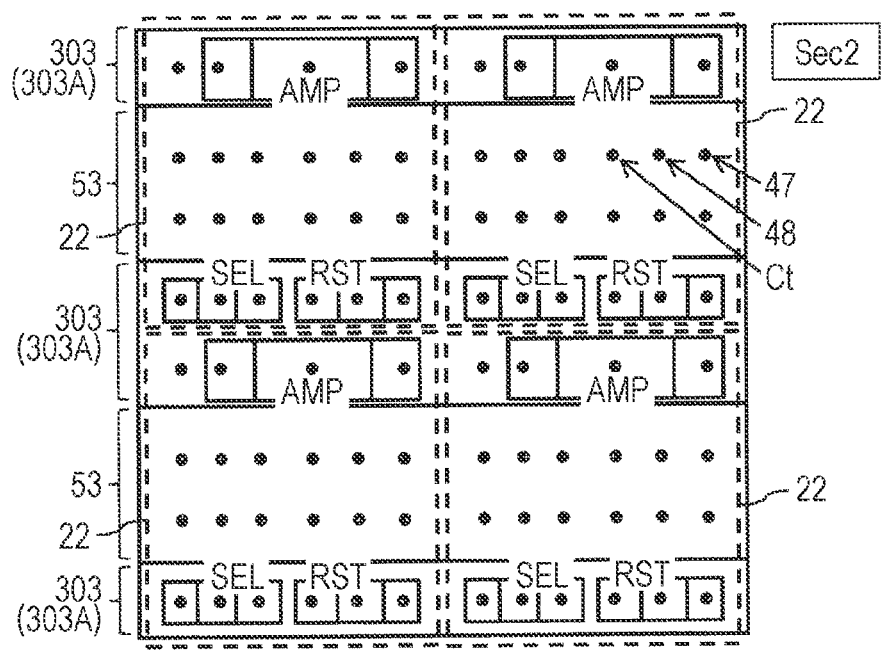

FIGS. 12 and 13 illustrate an example of the cross-sectional configuration in the horizontal direction of the image sensor 1. The upper views of FIGS. 12 and 13 illustrate an example of the cross-sectional configuration of a cross-section Sec1 of FIG. 7, and the lower views of FIGS. 12 and 13 illustrate the cross-sectional configuration of a cross-section Sec2 of FIG. 7. FIG. 12 illustrates a configuration in which two sets of two-by-two, four sensor pixels 12 are arranged in a second direction V2. FIG. 13 illustrates a configuration in which four sets of two-by-two four sensor pixels 12 are arranged in a first direction V1 and the second direction V2. Moreover, in the upper sectional views of FIGS. 12 and 13, a view illustrating an example of the front surface configuration of the semiconductor substrate 11 is superimposed on a view illustrating an example of the cross-sectional configuration of the cross-section Sec1 of FIG. 7, but the insulating layer 240 is omitted. In addition, in the lower sectional views of FIGS. 12 and 13, a view illustrating an example of the front surface configuration of the semiconductor substrate 303 is superimposed on a view illustrating an example of the cross-sectional configuration of the cross-section Sec2 of FIG. 7.

As illustrated in FIGS. 12 and 13, a plurality of through wirings 54, the plurality of through wirings 48, and the plurality of through wirings 47 are arranged side by side in a strip-shape in the plane of the first substrate 10 in the first direction V1 (vertical direction in FIG. 12 and horizontal direction in FIG. 13). Moreover, FIGS. 12 and 13 illustrate a case where the plurality of through wirings 54, the plurality of through wirings 48, and the plurality of through wirings 47 are arranged side by side in two lines in the first direction V1. The first direction V1 is parallel to one arrangement direction (e.g., column direction) of the two arrangement directions (e.g., row direction and column direction) of the plurality of sensor pixels 12 arranged in a matrix. In the four sensor pixels 12 sharing the readout circuit 22, the four floating diffusion regions FDs are arranged close to each other, in one example, through the pixel separation portion 203. In the four sensor pixels 12 sharing the readout circuit 22, the gate electrodes 223 of the four transfer transistors TRs are arranged to surround the four floating diffusion regions FDs. In one example, the four gate electrodes 223 form a ring shape.

The insulating layer 53, which exists in the portion of the semiconductor substrate 303 mentioned above through which the contact Ct penetrates, includes a plurality of blocks extending in the first direction V1. The semiconductor substrate 303 extends in the first direction V1 and includes a plurality of island-shaped blocks 303A arranged side by side in the second direction V2 orthogonal to the first direction V1 via the insulating layer 53 described above. Each block 303A is provided with, in one example, a plurality of sets of reset transistors RSTs, amplification transistors AMPS, and selection transistors SELs. One readout circuit 22 shared by four sensor pixels 12 includes, in one example, the reset transistor RST, the amplification transistor AMP, and the selection transistor SEL in a region facing four sensor pixels 12. One readout circuit 22 shared by four sensor pixels 12 includes, in one example, the amplification transistor AMP in the block 303A to the immediate left of the insulating layer 53, and includes the reset transistor RST and the selection transistor SEL in the block 303A to the immediate right of the insulating layer 53.

FIGS. 14, 15, 16, and 17 illustrate examples of the wiring layout of the image sensor 1 in the horizontal plane. FIGS. 14 to 17 illustrate an exemplary case where one readout circuit 22 shared by four sensor pixels 12 is provided in a region facing four sensor pixels 12. The wirings illustrated in FIGS. 14 to 17 are provided, in one example, in different layers of the wiring layer 246.

Figure 14:
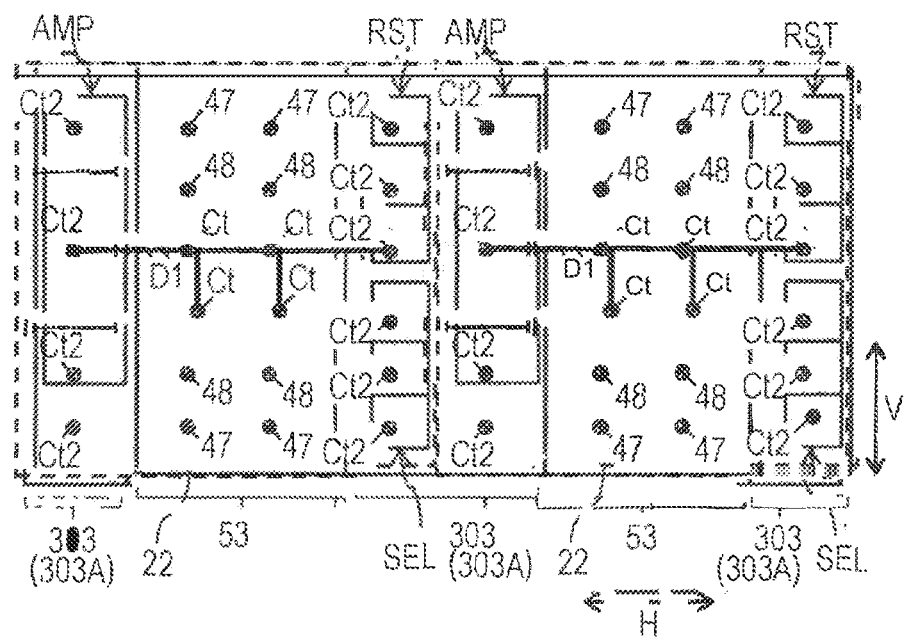
FIG. 14 is a diagram illustrating an example of a wiring layout in a horizontal plane of the image sensor of FIG. 1.

The four contacts Cts adjacent to each other are, in one example, electrically connected to the wiring D1, as illustrated in FIG. 14. The four contacts Cts adjacent to each other are further electrically connected to the gate of the amplification transistor AMP included in the block 303A to the immediate left of the insulating layer 53. The contacts Cts are also electrically connected to the gate of the reset transistor RST included in the block 303A to the immediate right of the insulating layer 53. Such connection is performed, in one example, via the wiring D1 and the contact Ct2, as illustrated in FIG. 14.

Figure 15:
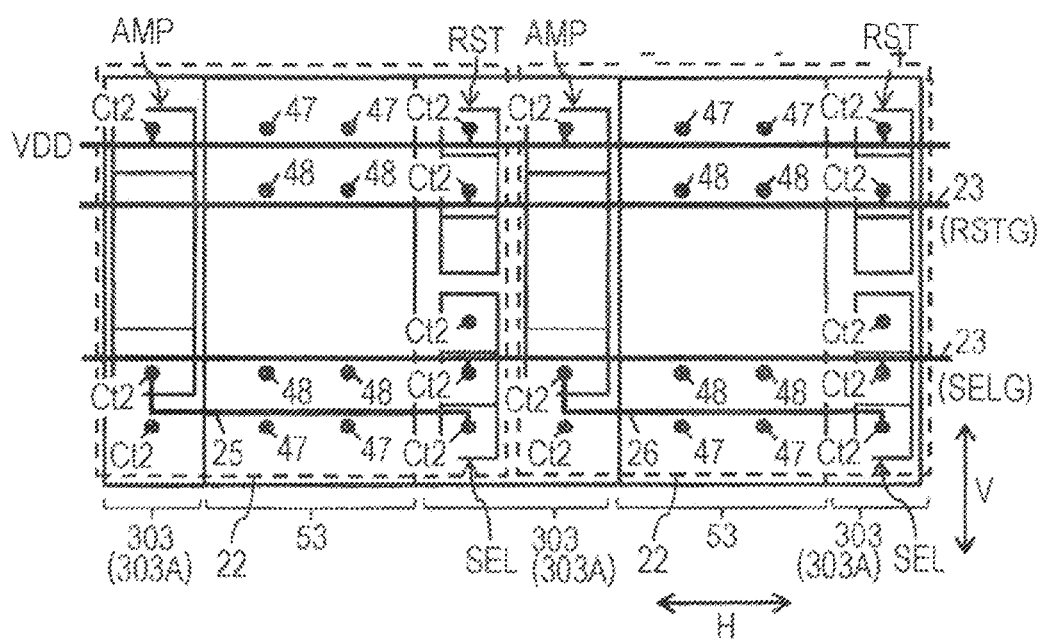
FIG. 15 is a diagram illustrating an example of a wiring layout in a horizontal plane of the image sensor of FIG. 1.

The power supply line VDD is arranged, in one example, at a position facing each of the readout circuits 22 arranged side by side in the second direction V2, as illustrated in FIG. 15. The power supply line VDD is electrically connected to the drain of the amplification transistor AMP and the drain of the reset transistor RST of each of the readout circuits 22 arranged side by side in the second direction V2 via the contact Ct2, in one example, as illustrated in FIG. 15. The two pixel drive lines 23 are arranged, in one example, at a position facing each of the readout circuits 22 arranged side by side in the second direction V2, as illustrated in FIG. 15. One of the pixel drive lines 23 is, in one example, a wiring RSTG electrically connected to the gate of the reset transistor RST of each of the readout circuits 22 arranged side by side in the second direction V2, as illustrated in FIG. 15. The other pixel drive line 23 is, in one example, a wiring SELG electrically connected to the gate of the selection transistor SEL of each of the readout circuits 22 arranged side by side in the second direction V2, as illustrated in FIG. 15. In each readout circuit 22, the source of the amplification transistor AMP and the drain of the selection transistor SEL are, in one example, electrically connected to each other via a wiring 25, as illustrated in FIG. 15.

Figure 16:
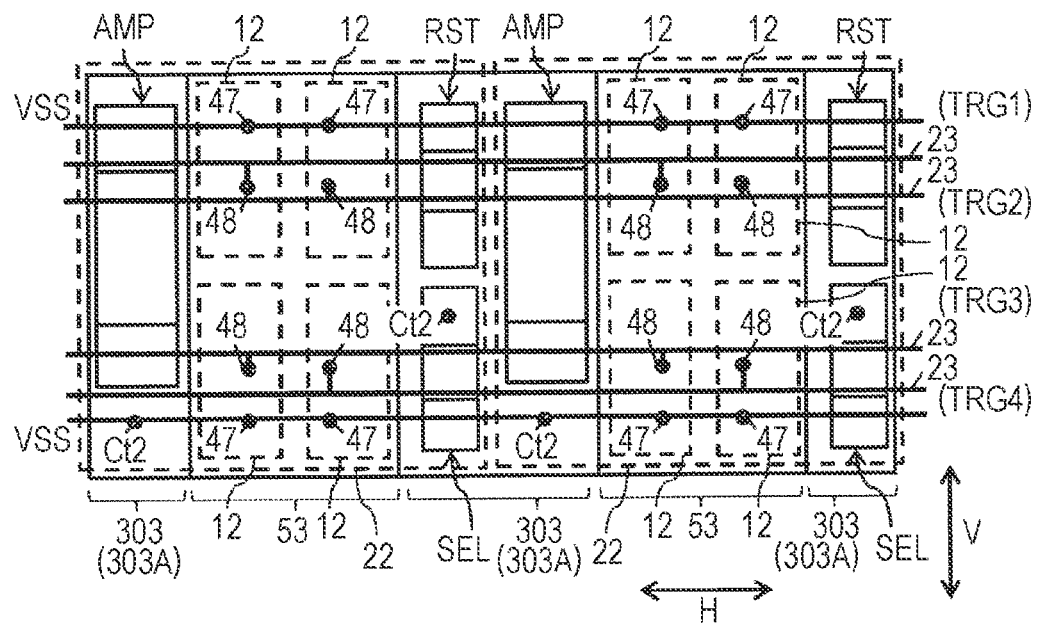
FIG. 16 is a diagram illustrating an example of a wiring layout in a horizontal plane of the image sensor of FIG. 1.

In one example, two power supply lines VSSs are arranged at a position facing each of the readout circuits 22 arranged side by side in the second direction V2, as illustrated in FIG. 16. Each power supply line VSS is electrically connected to, in one example, a plurality of through wirings 47 at a position facing each sensor pixel 12 arranged side by side in the second direction V2, as illustrated in FIG. 16. The four pixel drive lines 23 are arranged, in one example, at a position facing each of the readout circuits 22 arranged side by side in the second direction V2, as illustrated in FIG. 16. Each of the four pixel drive lines 23 is, in one example, a wiring TRG electrically connected to the through wiring 48 of one of the four sensor pixels 12 corresponding to the respective readout circuits 22 arranged side by side in the second direction V2, as illustrated in FIG. 16. In other words, the four pixel drive lines 23 (first control line) are electrically connected to the gate electrode 223 of the transfer transistor TR of each sensor pixel 12 arranged side by side in the second direction V2. In FIG. 16, an identification number (1, 2, 3, or 4) is attached to the end of each wiring TRG to distinguish between the wirings TRGs.

Figure 17:
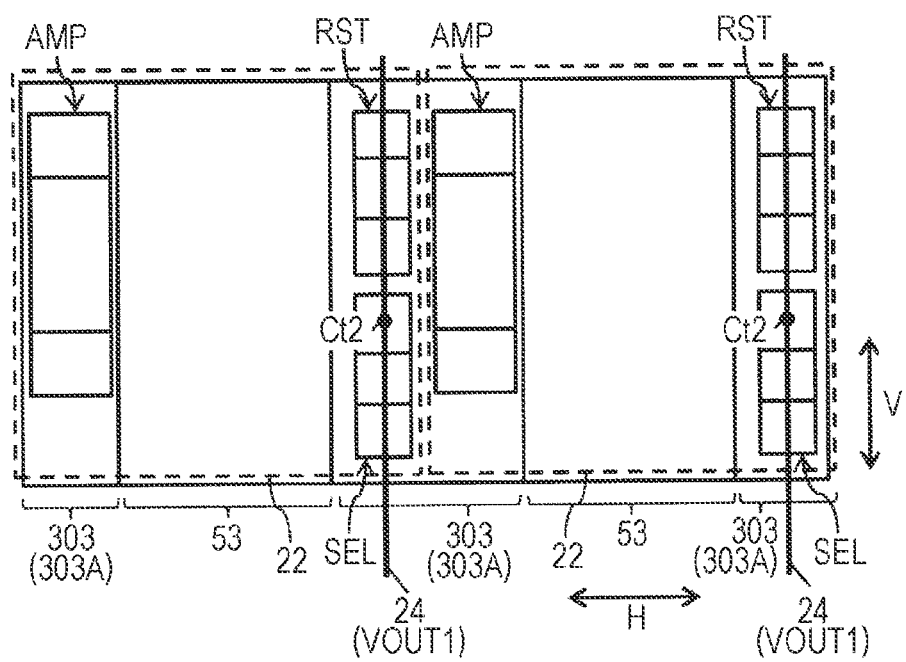
FIG. 17 is a diagram illustrating an example of a wiring layout in a horizontal plane of the image sensor of FIG. 1.

The vertical signal line 24 is arranged, in one example, at a position facing each readout circuit 22 arranged side by side in the first direction V1, as illustrated in FIG. 17. The vertical signal line 24 (output line) is, in one example, electrically connected to the output terminal (source of the amplification transistor AMP) of each readout circuit 22 arranged side by side in the first direction V1, as illustrated in FIG. 17.

Figure 18:
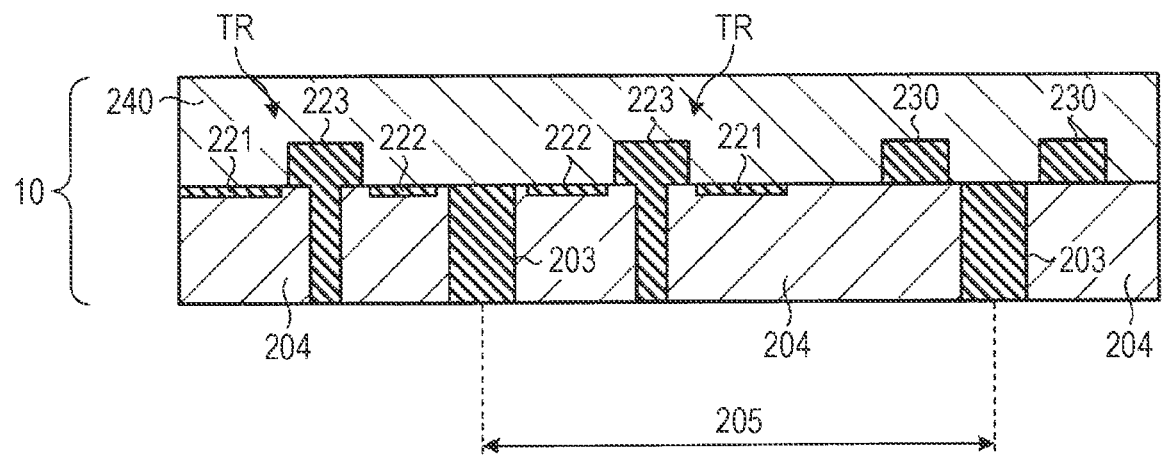
FIG. 18 is a diagram illustrated to describe an example of a method of manufacturing the image sensor of the first embodiment.

A method of manufacturing the image sensor 1 according to the present embodiment is now described. The semiconductor region and the pixel separation portion 203 are first formed in the first substrate 10 that is a silicon substrate, and the photodiode PD and the transfer transistor TR are provided for each pixel. As illustrated in FIG. 18, the N-type drain region 221 and the N-type source region 222 are formed in the vicinity of the surface of the P-type semiconductor region (P-well) 204 partitioned by the pixel separation portion 203. Then, the gate electrode 223 is formed between them. More specifically, an opening is defined between the N-type drain region 221 and the N-type source region 222 of the P-type semiconductor region 204. The opening leads to the photodiode PD (not illustrated in FIG. 18) existing below. Then, the gate electrode 223 is formed to fill the opening. In this example, the gate electrode 223 leads to a photodiode PD formed below the semiconductor region 204 (see FIG. 7). Moreover, a region 205 illustrated in FIG. 7 indicates a region for one pixel partitioned by the pixel separation portion 203.

Furthermore, on the P-type semiconductor region 204, an electrode 230 is formed. The electrode 230 is used for leading the photodiode PD to the reference potential line to which the reference potential (e.g., ground) is supplied. The electrode 230 is provided for each pixel and leads to the photodiode PD (not illustrated).

In this example, the transfer transistor TR is an N-channel type MOS transistor, and its drain region 221 is an N-type semiconductor region. Thus, the drain region 221 of the transfer transistor TR leads to the P-type semiconductor region 202 that covers the side surface of the photodiode PD. As can be seen from the circuit diagram of FIG. 2, terminal, which is not connected to the transfer transistor TR (input side terminal), of two terminals of the photodiode PD leads to the reference potential line. Thus, in this example, the photodiode PD is connected to the reference potential line via the electrode 230. Thus, the electrode 230 connected to the photodiode PD formed in the N-type semiconductor region is formed as P-type polysilicon.

As described above, the N-type drain region 221, the N-type source region 222, the gate electrodes 223, and the electrode 230 are provided for each pixel in the P-type semiconductor region 204, and then they are covered with the insulating layer 240. The insulating layer 240 is configured as an oxide film such as $SiO_2$.

Figure 19:
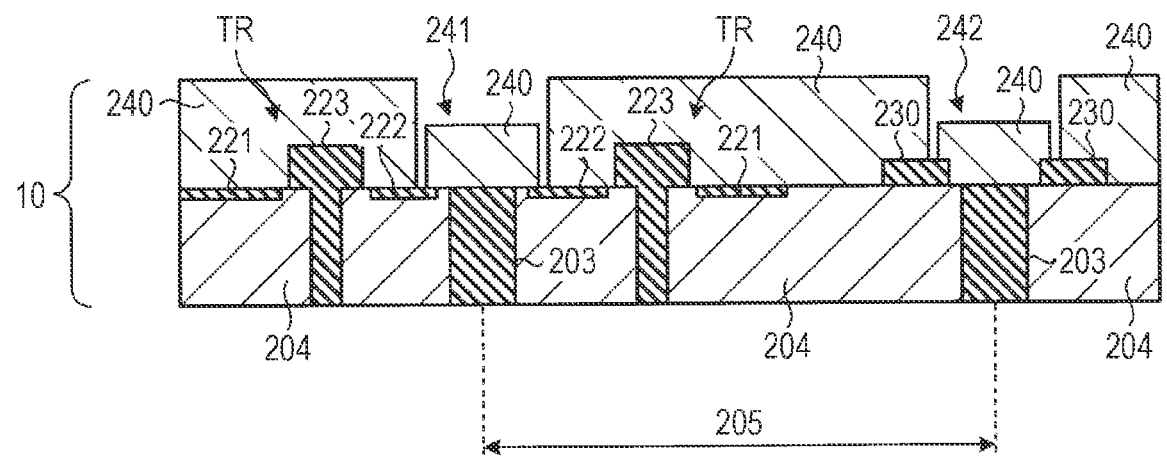
FIG. 19 is a diagram illustrated to describe an example of a method of manufacturing the image sensor of the first embodiment.

Subsequently, as illustrated in FIG. 19, the insulating layer 240 is etched to form a wiring groove 241 and a wiring groove 242. The wiring groove 241 is used to form a wiring 301a that aggregates the source regions 222 of the plurality of transfer transistors TRs. The wiring groove 242 is used to form a wiring 301b that aggregates the plurality of electrodes 230. The wiring 301a and the wiring 301b are often referred herein to as simply "wiring 301" unless they are necessary to be distinguished.

As described above, in this example, the source region 222 of the transfer transistor TR is an N-type semiconductor region, so the wiring 301a connected to the source region 222 is formed as P-type polysilicon. On the other hand, the electrode 230 is P-type polysilicon, so the wiring 301b connected to the electrode 230 is formed as N-type polysilicon.

In other words, in the case where the transfer transistor TR is an N-type transistor, the wiring 301a that aggregates the output terminal sides of the plurality of transfer transistors TR is formed as P-type polysilicon. In addition, as described above, in this case, the electrode 230 connected to the photodiode PD formed in the N-type semiconductor region is formed as P-type polysilicon. Thus, the wiring 301b that aggregates the plurality of electrodes 230 is formed as N-type polysilicon.

Figure 20:
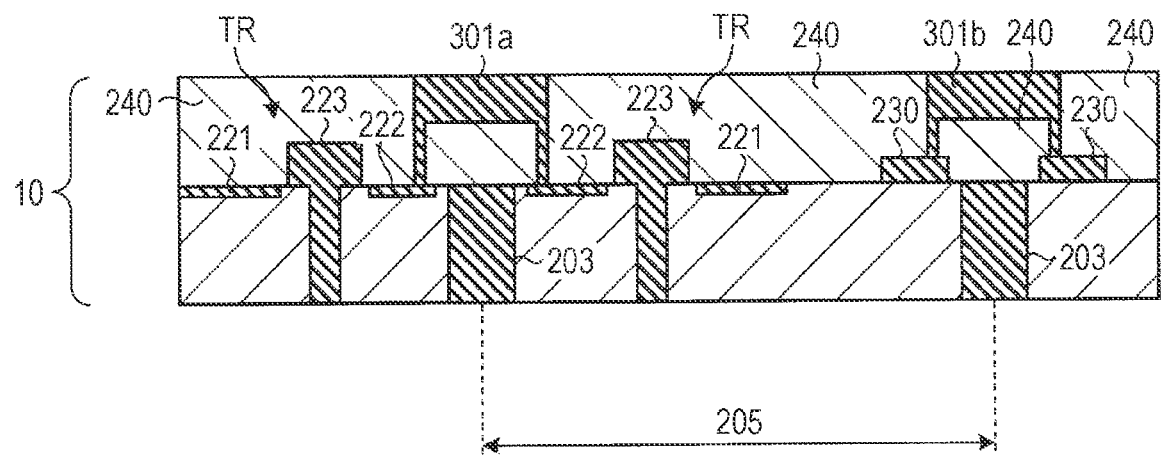
FIG. 20 is a diagram illustrated to describe an example of a method of manufacturing the image sensor of the first embodiment.

Subsequently, the P-type polysilicon, which is a material for the wiring 301a, is deposited to fill the wiring groove 241 formed in FIG. 19. The N-type polysilicon, which is a material for the wiring 301b, is deposited to fill the wiring groove 242. Then, the resultant deposit is polished using chemical mechanical polishing (CMP) to form the wiring 301a and the wiring 301b (see FIG. 20).

In this example, for each of four photodiodes PDs (for each set of four photodiode PDs), the wiring 301a is connected to the source regions 222 of four transfer transistors TRs having a one-to-one correspondence with the four photodiodes PDs. In other words, the wiring 301a aggregates the source regions 222 of the four transfer transistors TRs having a one-to-one correspondence with the four photodiodes PDs for each of the four photodiodes PDs. Then, the wiring 301a is connected to the wiring D1 via one contact Ct to connect the aggregated source region 222 to the wiring D1 of the second substrate 20 leading to the gate electrode 311 of the amplification transistor AMP shared by the source regions 222. In this example, one contact Ct is provided for every four source regions 222. In addition, in this example, the source regions 222 of the transfer transistor TR corresponds to the "first element", the gate electrode 311 of the amplification transistor AMP corresponds to the "second element". The wiring D1 corresponds to the "first wiring" or the "second wiring formed on the second substrate", and the wiring 301a corresponds to the "second wiring" or the "first wiring formed on the first substrate and connected to the first photoelectric transducer and the second photoelectric transducer". Moreover, the number of pixels as a constituent unit for aggregation by the wiring 301a is not limited to four and can be optional.

Further, in this example, for each of the four photodiodes PDs, the wiring 301b is connected to four electrodes 230 having a one-to-one correspondence with the four photodiodes PDs. In other words, for each of four photodiodes PDs, the wiring 301b aggregates four electrodes 230 having a one-to-one correspondence with the four photodiodes PDs. Then, the wiring 301b is connected to the wiring D1 via one contact Ct to connect the aggregated electrodes 230 to the wiring D1 of the second substrate 20 leading to the reference potential line shared by the electrodes 230. In this example, one contact Ct is provided for every four electrodes 230. Moreover, the wiring D1 leading to the reference potential line is different from the wiring D1 leading to the gate electrode 311 of the amplification transistor AMP described above (however, both are wirings formed on the insulating layer 245 of the second substrate 20). In addition, in this example, the electrode 230 corresponds to the "first element", and the reference potential line corresponds to the "second element". The wiring D1 corresponds to the "first wiring", and the wiring 301b corresponds to the "second wiring". Moreover, the number of pixels as a constituent unit for aggregation by the wiring 301b is not limited to four and can be optional. In addition, as described above, the wirings 301b are connected (indirectly connected) to the respective corresponding photodiodes PDs via each electrode 230. In other words, it can be considered that the wiring 301b also corresponds to the "first wiring formed on the first substrate and connected to the first photoelectric transducer and the second photoelectric transducer". In addition, it can be considered that the wiring D1 also corresponds to the "second wiring formed on the second substrate".

Moreover, in this example, it is assumed that the reference potential line is formed on the second substrate 20, but its configuration is not limited to the example above, and the reference potential line can be formed on, in one example, another substrate (such as the third substrate 30). In short, the "second element" is not limited to an element formed on the second substrate 20.

Figure 21:
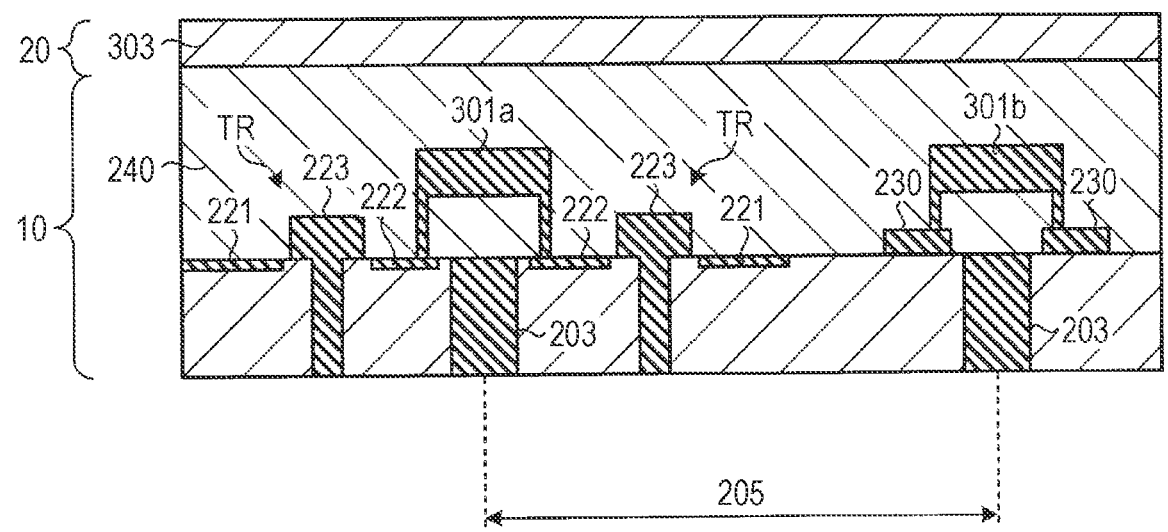
FIG. 21 is a diagram illustrated to describe an example of a method of manufacturing the image sensor of the first embodiment.

Subsequently, as illustrated in FIG. 21, the insulating layer 240 is deposited on the wiring 301a and the wiring 301b. Then, the P-type semiconductor substrate 303 is joined on top of the insulating layer 240 and is thinned.

Figure 22:
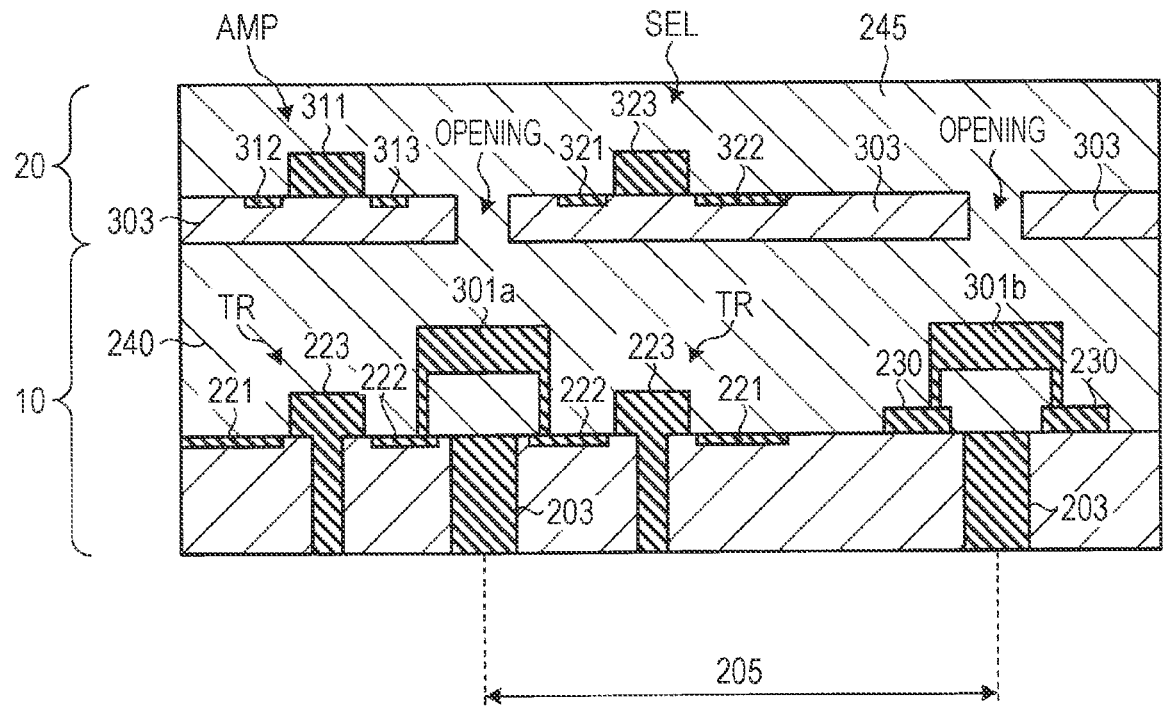
FIG. 22 is a diagram illustrated to describe an example of a method of manufacturing the image sensor of the first embodiment.

Subsequently, as illustrated in FIG. 22, a portion of the semiconductor substrate 303 that faces the wiring 301 is opened to form a pixel transistor on the semiconductor substrate 303. Moreover, in the example of FIG. 12, the amplification transistor AMP and the selection transistor SEL are illustrated, but the reset transistor RST (not illustrated) is also formed on the semiconductor substrate 303. As illustrated in FIG. 12, an N-type drain region 312 and an N-type source region 313 are formed in the vicinity of the surface of the semiconductor substrate 303. Then, the gate electrode 311 is formed between them to form the amplification transistor AMP.

Similar to the above description, an N-type drain region 321 and an N-type source region 322 are formed in the vicinity of the surface of the semiconductor substrate 303, a gate electrode 323 is formed between them to form the selection transistor SEL. Moreover, the reset transistor RST (not illustrated) is also formed in a similar manner. Then, the insulating layer 245 is formed (deposited) so that it covers the opening and the pixel transistor (such as amplification transistor AMP and selection transistor SEL) formed as described above.

Figure 23:
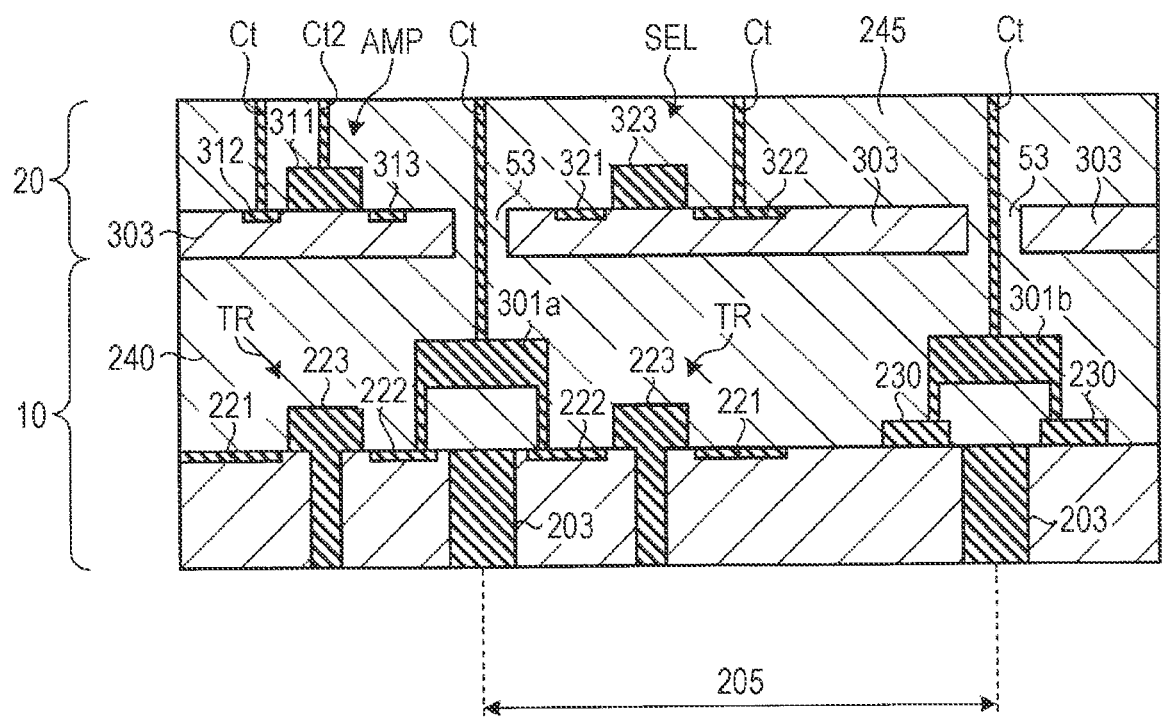
FIG. 23 is a diagram illustrated to describe an example of a method of manufacturing the image sensor of the first embodiment.

Subsequently, as illustrated in FIG. 23, the contacts Ct and Ct2 are formed for connecting the wiring 301 and each element of the second substrate 20 to the wiring D1. In this example, the contact Ct is provided for each of the drain region 312 of the amplification transistor AMP, the wiring 301, and the source region 322 of the selection transistor SEL. The contact Ct2 is provided for the gate electrode 311 of the amplification transistor AMP.

As a method of forming the contacts Ct and Ct2, in one example, a way is considered of etching the insulating layer to form an opening defining the contacts Ct and Ct2, forming a barrier layer for electrically insulating on the inner surface of the opening, then filling it with a material of the contacts Ct and Ct2. In this example, the insulating layer (the insulating layer covering the side surface of the contact Ct) provided at the opening of the semiconductor substrate 303 is the insulating layer 53 described above. Examples of the material of the contacts Ct and Ct2 include tungsten or the like. The barrier layer includes, in one example, Ti, TiN, Ta, TaN, or the like as material. However, the method of forming the contacts Ct and Ct2 and their materials are not limited to the example above and are optional, and various known techniques can be employed.

Figure 24:
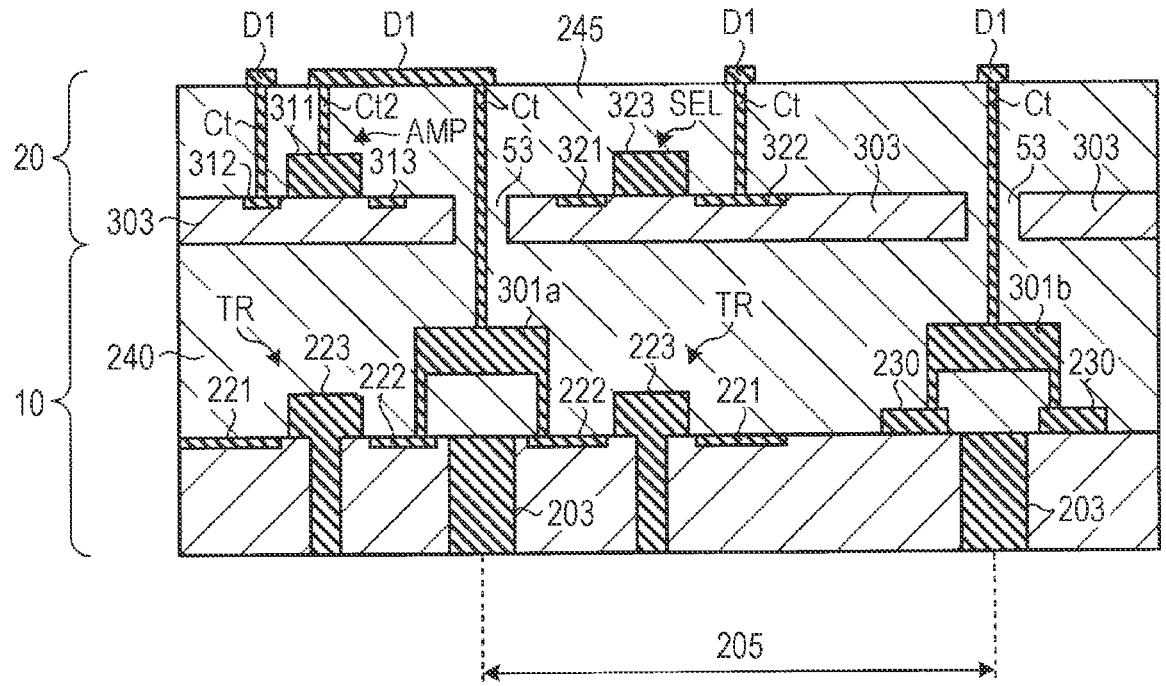
FIG. 24 is a diagram illustrated to describe an example of a method of manufacturing the image sensor of the first embodiment.

Subsequently, as illustrated in FIG. 24, the wiring D1 to which the contacts Ct and Ct2 are connected is formed on the insulating layer 245. In this example, the wiring D1 includes copper (Cu) as its material. Moreover, the method and material of forming the wiring D1 are optional, and various known techniques can be employed.

Figure 25:
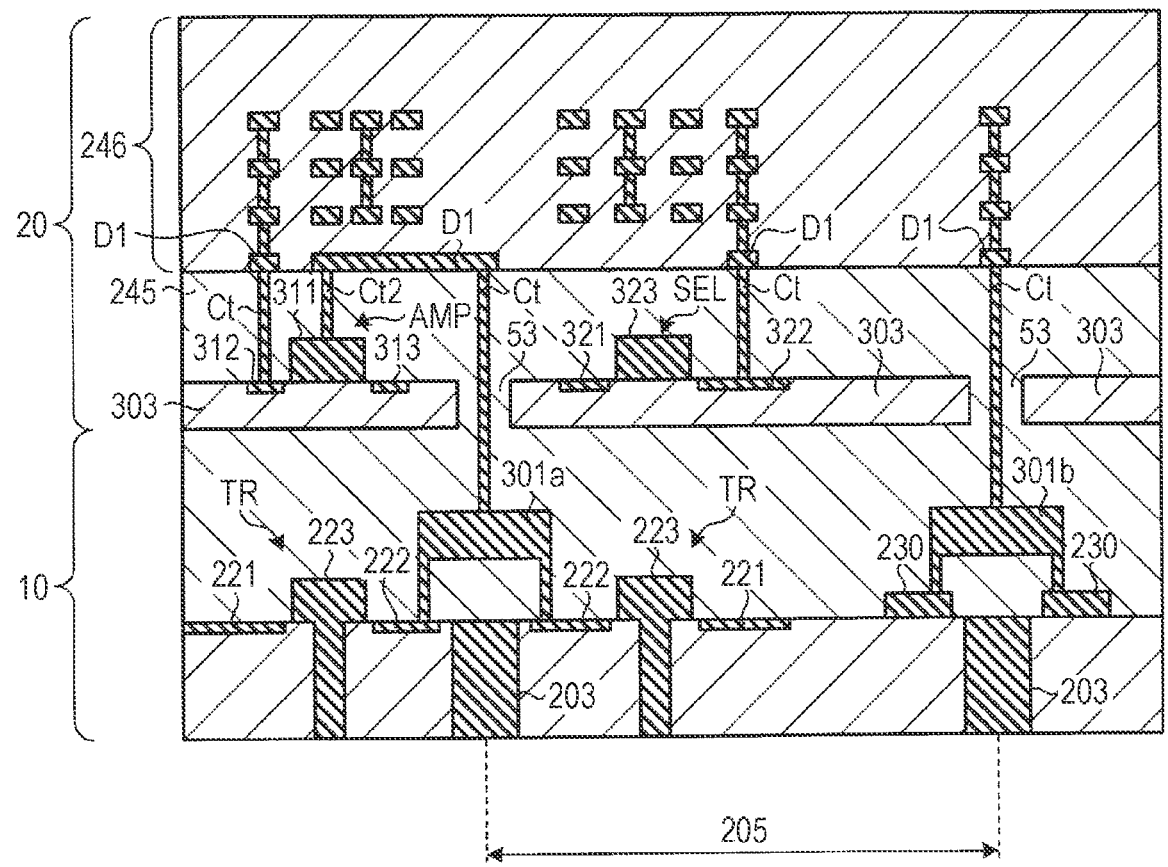
FIG. 25 is a diagram illustrated to describe an example of a method of manufacturing the image sensor of the first embodiment.

Subsequently, as illustrated in FIG. 25, the wiring layer 246 described above is formed on the insulating layer 245. Then, the third substrate 30 on which the peripheral circuit is formed is joined to form a color filter and an on-chip lens for each pixel. Then, the configuration illustrated in FIG. 7 can be obtained.

Figure 26:
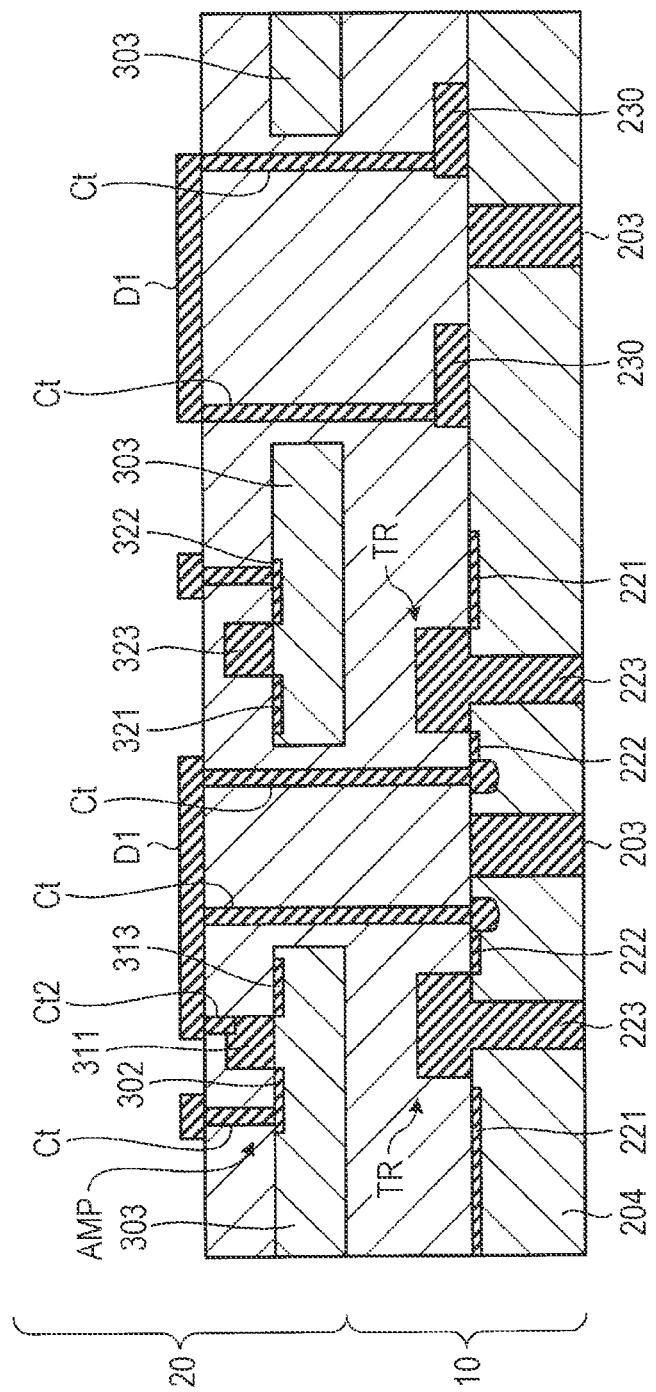
FIG. 26 is a diagram illustrating a part of a cross-section of an image sensor upon employing a configuration in which a wiring is not provided.

The operation and effect of the image sensor 1 according to the present embodiment is now described. In this description, in one example, it is assumed that the wiring 301 (wiring 301a or wiring 301b) described above is not formed. In this configuration, as illustrated in FIG. 26, the source regions 222 (output terminal side) of the transfer transistors TRs are individually connected, via the contact Ct, to the wiring D1 leading to the gate electrode 311 of the amplification transistor AMP. In consideration of one shared constituent unit, it is necessary to connect four contacts Cts having a one-to-one correspondence with the source regions 222 of the four transfer transistors TRs to the wiring D1 of the second substrate 20 leading to the gate electrode 311 of the amplification transistor AMP. This increases the number of contacts of the wiring D1, and the area will also increase. In addition, the opening area of the semiconductor substrate 303 that is used to pass the contact Ct will also be large.

Further, in the configuration described above (configuration illustrated in FIG. 26), the electrodes 230 are also individually connected, via the contact Ct, to the wiring D1 leading to the reference potential line. In consideration of one shared constituent unit, it is necessary to connect four contacts Cts having a one-to-one correspondence with four electrodes 230 to the wiring D1 of the second substrate 20 leading to the reference potential line. This increases the number of contacts of the wiring D1, and the area will also increase. In addition, the opening area of the semiconductor substrate 303 that is used to pass the contact Ct will also be large.

Thus, in the configuration described above, the capacitance (parasitic capacitance) associated with the wiring D1 formed on the second substrate 20 is large, affecting the conversion efficiency of photoelectric conversion. In one example, the conversion efficiency of photoelectric conversion is liable to decrease.

Thus, the present embodiment provides the wiring 301 leading to the second element (the gate electrode 311 of the amplification transistor AMP or the reference potential line) shared by the plurality of first elements such as the output terminal side of the transfer transistor TR and the electrode 230. This wiring 301 is connected to the wiring D1 formed on the second substrate 20 via one contact Ct and is connected to the plurality of first elements.

In other words, the wiring 301 aggregates a plurality of first elements and is connected, via one contact Ct, to the wiring D1 leading to the second element shared by the plurality of first elements. Thus, it is sufficient that the number of contacts Cts formed in the wiring D1 used for connecting the plurality of first elements of the constituent unit for aggregation to the wiring D1 is only one, so it is possible to reduce the number of contacts and the area of the wiring D1. Thus, it is possible to reduce the capacitance associated with the wiring D1, improving the conversion efficiency of photoelectric conversion.

Figure 27:
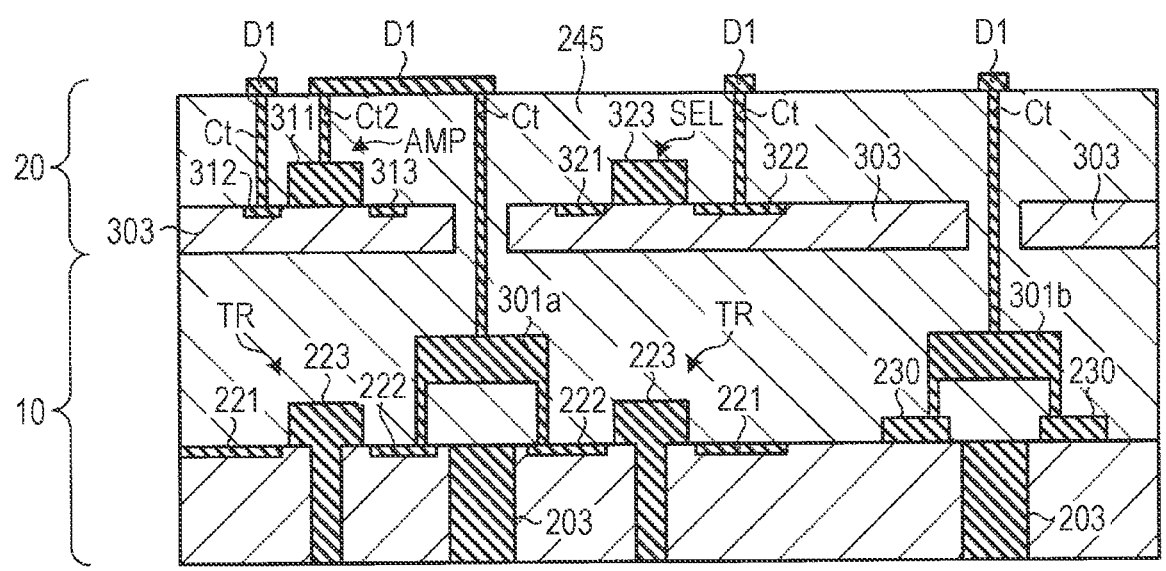
FIG. 27 is a diagram illustrating a part of a cross-section of the image sensor of the first embodiment.

More specifically, as illustrated in FIG. 27, the image sensor 1 according to the present embodiment is provided with the wiring 301a used for connecting the source region 222 (output terminal side) of each transfer transistor TR to the wiring D1 formed on the second substrate 20 via one contact Ct. The wiring D1 leads to the gate electrode 311 of the amplification transistor AMP that is shared by the source regions 222 of the respective transfer transistors TRs. In addition, the image sensor 1 according to the present embodiment is also provided with the wiring 301b used for connecting each electrode 230 to the wiring D1 formed on the second substrate 20 via one contact Ct. The wiring D1 is a wiring leading to the reference potential line to which each electrode 230 is commonly connected.

Figure 28:
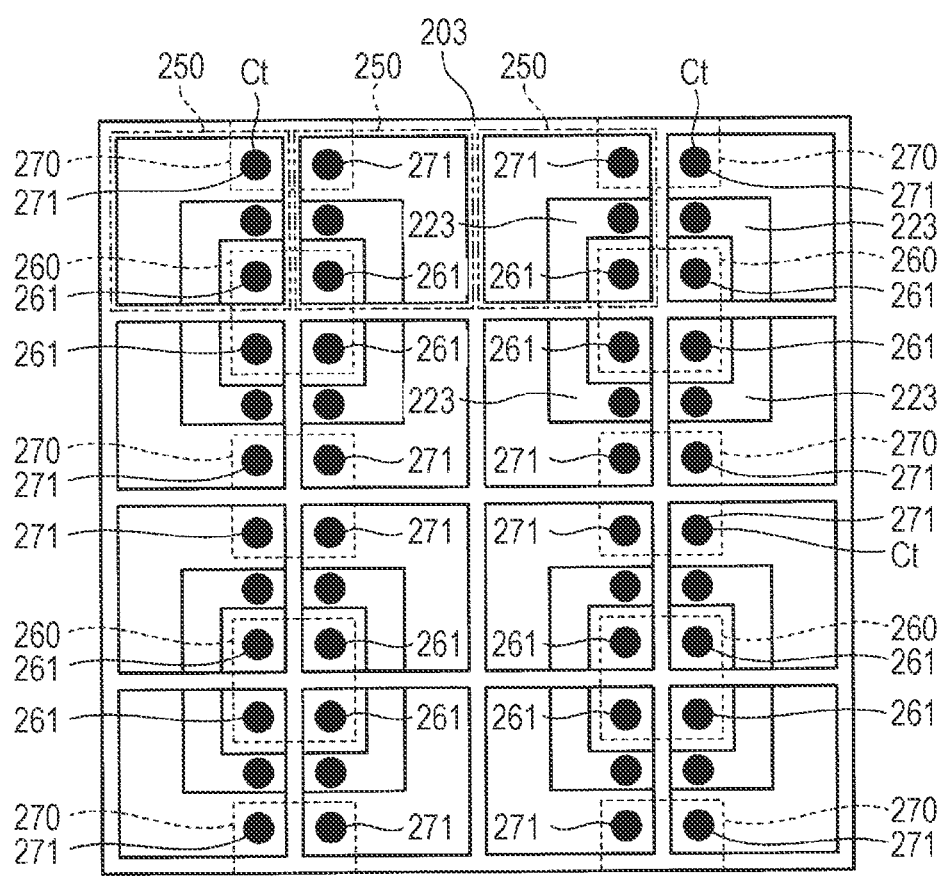
FIG. 28 is a schematic plan view of the first substrate of the first embodiment.

FIG. 28 is a schematic plan view of the first substrate 10 according to the present embodiment. Each of a plurality of regions 250 partitioned individually by the pixel separation portion 203 is a region corresponding to one pixel. As illustrated in FIG. 28, a region 260 indicates a set of connection points 261 between the source region 222 and the wiring 301a for each of the four transfer transistors TRs having a one-to-one correspondence with the four photodiodes PDs as a constituent unit of sharing the pixel transistors. In addition, as illustrated in FIG. 28, a region 270 indicates a set of connection points 271 between the electrodes 230 and the wiring 301b for each of the four electrodes 230 having a one-to-one correspondence with four photodiodes PDs as a constituent unit of sharing the reference potential line.

Figure 29:
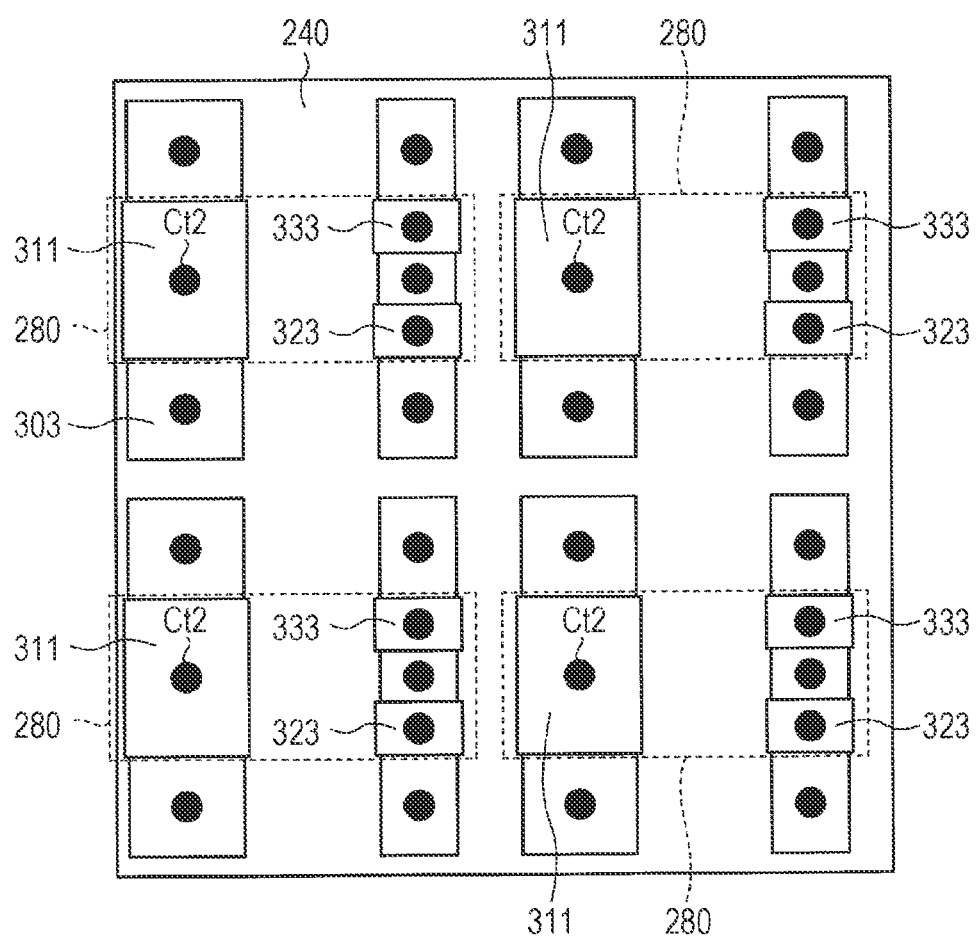
FIG. 29 is a schematic plan view of the second substrate of the first embodiment.

FIG. 29 is a schematic plan view of the second substrate 20 according to the present embodiment. As described above, for each of four photodiodes PDs, a pixel transistor shared by the four photodiodes PDs is formed on the second substrate 20. As illustrated in FIG. 29, a region 280 indicates a region where the gate electrode of the pixel transistor of one shared constituent unit circuit is formed. More specifically, it indicates a region where the gate electrode 311 of the amplification transistor AMP, the gate electrode 323 of the selection transistor SEL, and the gate electrode 333 of the reset transistor RST are formed.

Figure 30:
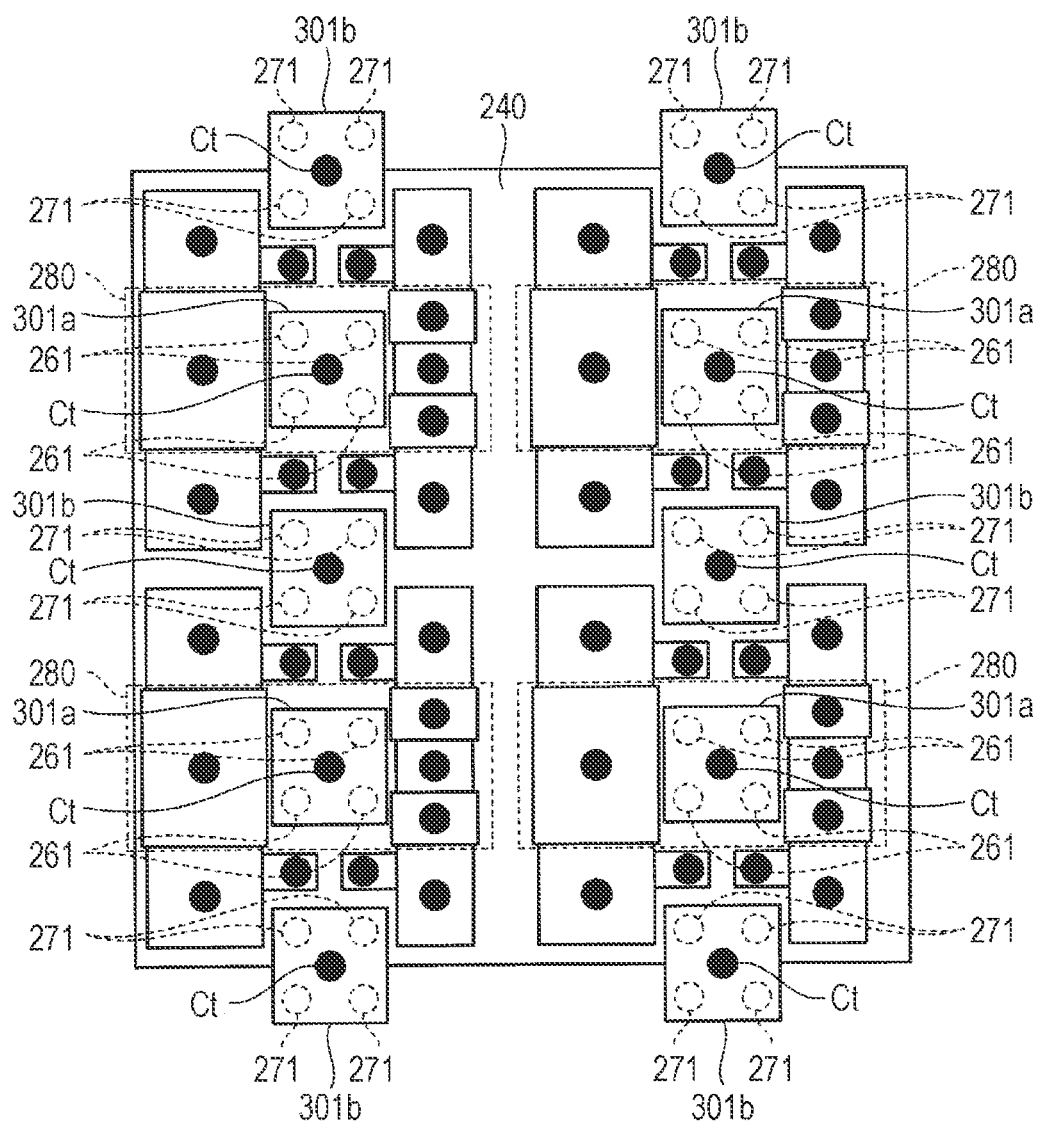
FIG. 30 is a schematic plan view of the arrangement in which the second substrate and the first substrate are arranged on top of each other according to the first embodiment.

FIG. 30 is a schematic plan view of the second substrate 20 and the first substrate 10 stacked on top of each other in the present embodiment. In the example of FIG. 30, for each set of four photodiodes PDs (the number of the sets is optional), the wiring 301a is connected to the source regions 222 of the four transfer transistors TRs having a one-to-one correspondence with the four photodiodes PDs included in the set. Then, the wiring 301a is connected, via one contact Ct, to the wiring D1 (not shown) leading to the gate electrode 311 of the amplification transistor AMP that is shared by the four source regions 222. In other words, for each of the four photodiodes PDs, the wiring 301a aggregates the source regions 222 of the four transfer transistors TRs having a one-to-one correspondence with the four photodiodes PDs. Then, the connection via one contact Ct to the wiring D1 leading to the gate electrode of the amplification transistor AMP shared by the source regions 222 is performed.

Thus, even one contact formed in the wiring D1 is sufficient to connect the source regions 222 to the wiring D1. Specifically, the contact is used to connect, to the wiring D1, the source regions 222 of the four transfer transistors TRs having a one-to-one correspondence with four photodiodes PDs as a constituent unit for aggregation. This makes it possible to reduce the number of contacts and the area of the wiring D1. Thus, it is possible to reduce the capacitance associated with the wiring D1, improving the conversion efficiency of photoelectric conversion.

Further, in the example of FIG. 30, the wiring 301b is connected, for each set of four photodiodes PDs, the four electrodes 230 having a one-to-one correspondence with the four photodiodes PDs included in the set. Then, the wiring 301b is connected, via one contact Ct, to the wiring D1 (not shown) leading to the reference potential line shared by the four electrodes 230. In other words, the wiring 301b aggregates, for each of four photodiodes PDs, the four electrodes 230 having a one-to-one correspondence with the four photodiodes PDs, and is connected, via one contact Ct, to the wiring D1 leading to the reference potential line shared by the electrodes 230.

Thus, even one contact formed in the wiring D1 is sufficient to connect the electrode 230 to the wiring D1. Specifically, the contact is used to connect the four electrodes 230, which have a one-to-one correspondence with four photodiodes PDs as a constituent unit for aggregation, to the wiring D1. This makes it possible to reduce the number of contacts and the area of the wiring D1. Thus, it is possible to reduce the capacitance associated with the wiring D1, improving the conversion efficiency of photoelectric conversion. Moreover, as described above, the wiring 301 (wiring 301a or wiring 301b) aggregates a plurality of first elements and is connected, via one contact Ct, to the wiring D1 leading to the second element shared by the plurality of first elements. However, the number of contacts Cts is not limited to the above example and can be two or more. In short, the wiring 301 is only necessary to have a form in which it is connected to the wiring D1 via the contact Ct smaller in number than the constituent unit for aggregation. Such a form makes it possible to reduce the number of contacts and the area of the wiring D1.

Moreover, in this example, the four pixels as a constituent unit aggregated by the wiring 301a and the four pixels as a constituent unit aggregated by the wiring 301b do not entirely match. Some of them (two pixels in this example) overlap, but the configuration is not limited to the above example.

Further, in the present embodiment, the first substrate 10 on which the photodiode PD is formed and the second substrate 20 on which the pixel transistor is formed are separately stacked on top of each other, so it is possible to reduce the area of the substrate (plane space). More specifically, the first substrate 10 and the second substrate 20 separated from each other make it possible to increase the areas of the photodiode PD and the pixel transistor, as compared with the configuration in which the photodiode PD and the pixel transistor are provided on the same substrate. This makes it possible to improve the photoelectric conversion efficiency and reduce the transistor noise.

Further, the first substrate 10 and the second substrate 20 separated from each other make it possible to increase the number of pixels per unit area, as compared with the configuration in which the photodiode PD and the pixel transistor are provided on the same substrate, improving the resolution.

Furthermore, as described above, in the present embodiment, for the inter-substrate connection, the first substrate 10 and the second substrate 20 are connected using the through electrode (the contact Ct and the through wiring 47 or 48) in the pixel region 13. The second substrate 20 and the third substrate 30 are joined using the pad electrodes 58 and 64. This reduces the area necessary for the inter-substrate connection as compared with the configuration in which a through via (through-silicon via, TSV) are provided in the peripheral area of the peripheral edge of the pixel region 13 to connect the substrates to each other, thereby reducing the chip size. Alternatively, it is possible to increase the pixel region 13 even with the same chip area. Moreover, it is more effective if the inter-substrate connections can be achieved within all the pixel regions.

Further, in the present embodiment, the wiring 301 (wiring 301a or wiring 301b) is provided on the light incident surface side (lower layer of the second substrate 20 in this example) of the second substrate 20 (see, e.g., FIG. 17). This configuration makes it sufficient for the opening formed in the region of the semiconductor substrate 303 of the second substrate 20 that faces the wiring 301 to have a size to allow one contact Ct to pass through. Thus, according to the present embodiment, it is possible to reduce the size of the opening formed in the semiconductor substrate 303.

Moreover, in the present embodiment described above, the output terminal side of the transfer transistor TR or the electrode 230 is given as an example of the "first element", and the gate electrode 311 of the amplification transistor AMP or the reference potential line is given as an example of the "second element". However, the configuration according to the embodiment of the present disclosure is not limited to the above examples. In short, the first element is only necessary to be an element provided for each of the photodiodes PDs among a plurality of elements formed on the first substrate 10. The second element is only necessary to be an element shared by the plurality of first elements among the elements formed on the second substrate 20.

Figure 31:
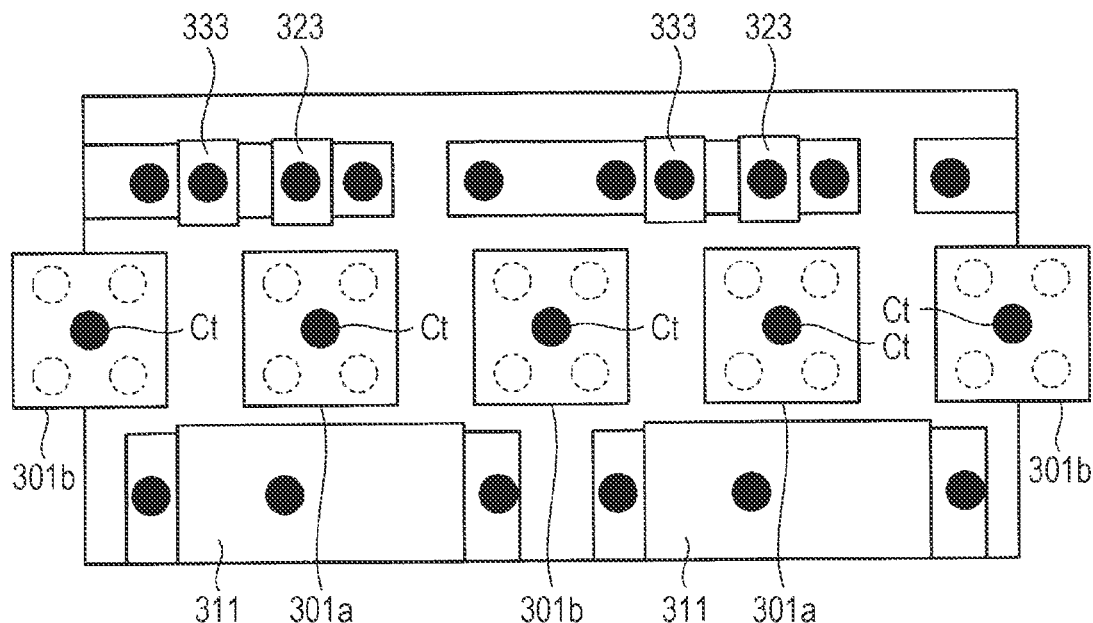
FIG. 31 is a diagram illustrating a modification of a wiring layout.
Figure 32:
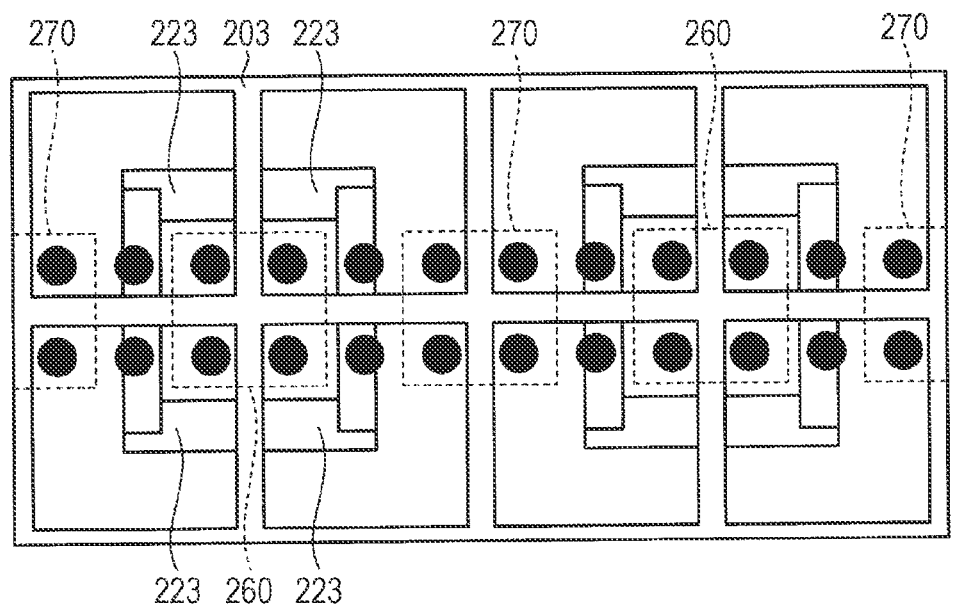
FIG. 32 is a schematic plan view of a first substrate according to a modification of the first embodiment.
Figure 33:
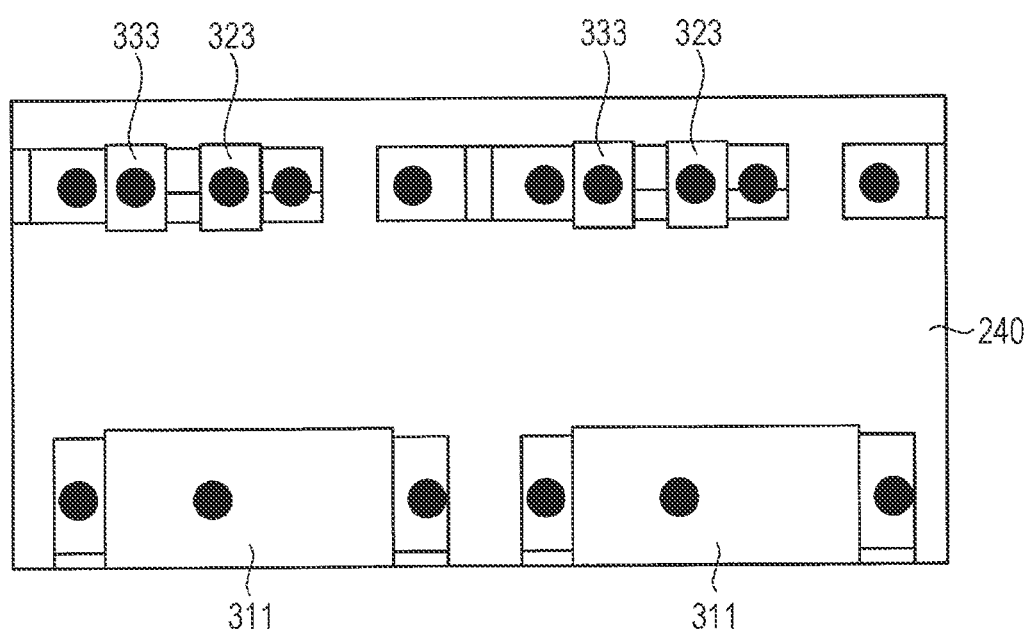
FIG. 33 is a schematic plan view of a second substrate according to a modification of the first embodiment.

Further, in the present embodiment, the wiring 301a and the wiring 301b are laid out alternately along the vertical direction (see FIG. 30), but the layout of the wiring is not limited to the example, and the layout of the wiring 301 can be optionally varied depending on the design conditions or the like. In one example, as illustrated in FIG. 31, the wiring 301a and the wiring 301b can be laid out alternately along the horizontal direction. FIG. 32 is a schematic plan view of the first substrate 10 in the case of the example described above, and FIG. 33 is a schematic plan view of the second substrate 20 in the case of the example described above. In FIGS. 32 and 33, the same reference numerals are given to the elements common to the embodiment described above.

3. Second Embodiment (Configuration Example of Image Sensor)

An example of the configuration of an image sensor according to the second embodiment is now described. Moreover, the basic configuration of the image sensor according to the present embodiment is the same as that of the image sensor 1 according to the first embodiment described above, so only the difference from the first embodiment described above is described. The configuration other than the difference is similar to that of the first embodiment described above.

In the first embodiment described above, the transfer transistor TR is configured as an N-channel type MOS transistor, but in the present embodiment, the transfer transistor TR is configured as a P-channel type MOS transistor (an example of a P-type transistor). Thus, the semiconductor region 204 formed on the photodiode PD is an N-type semiconductor region. The drain region 221 and the source region 222 of the transfer transistor TR formed near the front surface of the semiconductor region 204 are P-type semiconductor regions. Thus, the wiring 301a that aggregates the source regions 222 of the transfer transistor TR is formed as N-type polysilicon.

In other words, in the case where the transfer transistor TR is a P-type transistor, the wiring 301a, which is used for connecting the output terminal side of the plurality of transfer transistors TRs to the wiring D1 via one contact, is configured as N-type polysilicon.

Further, the N-type drain region 221 of the transfer transistor TR leads to the P-type semiconductor region that covers the side surface of the photodiode PD, so the photodiode PD is connected to the electrode 230. Thus, in this example, the electrode 230 is formed as N-type polysilicon, and the wiring 301b that aggregates the electrodes 230 is formed as P-type polysilicon.

In other words, in the present embodiment, the electrode 230 connected to the photodiode PD is formed as N-type polysilicon. The wiring 301b, which is used for connecting the plurality of electrodes 230 via one contact to the wiring D1, is formed as P-type polysilicon.

The configuration of the present embodiment described above also achieves a similar effect to the first embodiment described above. In other words, it is sufficient that the number of contacts Cts formed in the wiring D1 is only one, the contact Ct being used to connect a plurality of first elements (a plurality of first elements as a constituent unit for aggregation) such as the output terminal side of the transfer transistor TR formed on the first substrate 10 and the electrode 230 to the wiring D1. Thus, it is possible to reduce the number of contacts and the area of the wiring D1, enabling the capacitance associated with the wiring D1 to be reduced. This makes it possible to improve the photoelectric conversion efficiency.

4. Third Embodiment (Configuration Example of Image Sensor)

An example of the configuration of an image sensor according to the third embodiment is now described. Moreover, the basic configuration of the image sensor according to the present embodiment is the same as that of the image sensor 1 according to the first embodiment described above, so only the difference from the first embodiment described above is described. The configuration other than the difference is similar to that of the first embodiment described above.

In the first embodiment described above, the wiring (wiring 301a or wiring 301b) is formed as polysilicon, but its configuration is not limited to the above example, and the wiring 301 including, in one example, tungsten (W) can be formed. This makes it possible to reduce the resistance of the wiring 301, as compared with the case where the wiring 301 is formed as polysilicon.

Further, such configuration also achieves a similar effect to the first embodiment described above. In other words, it is sufficient that the number of contacts Cts formed in the wiring D1 is only one, the contact Ct being used to connect a plurality of first elements (a plurality of first elements as a constituent unit for aggregation) such as the output terminal side of the transfer transistor TR formed on the first substrate 10 and the electrode 230 to the wiring D1. Thus, it is possible to reduce the number of contacts and the area of the wiring D1, enabling the capacitance associated with the wiring D1 to be reduced. This makes it possible to improve the photoelectric conversion efficiency.

5. Fourth Embodiment (Configuration Example of Image Sensor)

An example of the configuration of an image sensor according to the fourth embodiment is now described. Moreover, the basic configuration of the image sensor according to the present embodiment is the same as that of the image sensor 1 according to the first embodiment described above, so only the difference from the first embodiment described above is described. The configuration other than the difference is similar to that of the first embodiment described above.

Figure 34:
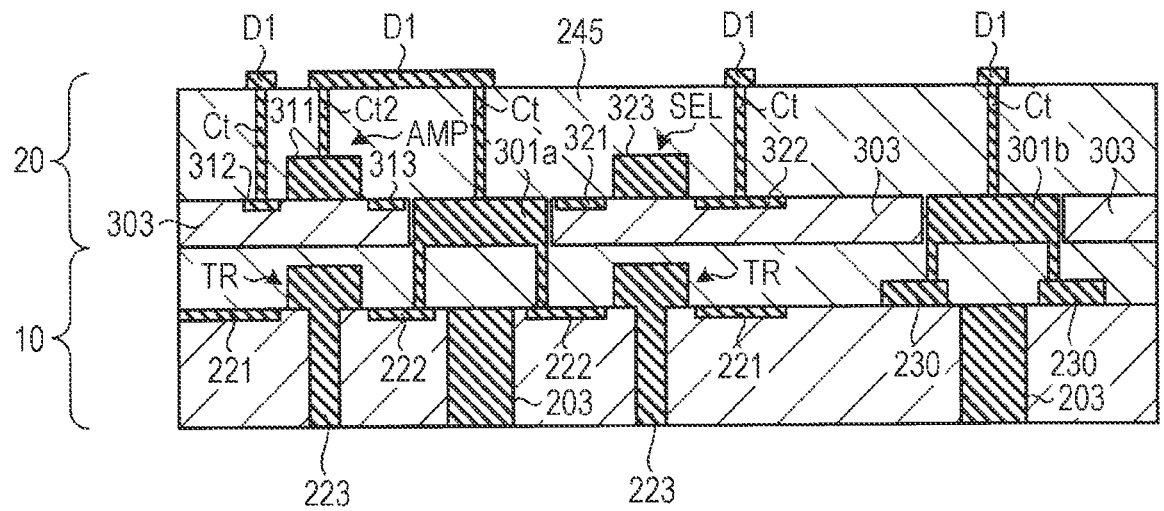
FIG. 34 is a diagram illustrating a part of a cross-section of the image sensor of a fourth embodiment.

In the present embodiment, as illustrated in FIG. 34, the wiring 301a and the wiring 301b are arranged in the respective corresponding openings formed in the second substrate 20 (the semiconductor substrate 303). In this description, the "opening formed in the second substrate 20" corresponds to the interior of the region of an insulating film 230 (in an insulating region). The insulating film 230 is formed between the first semiconductor region of the second substrate 20 (e.g., the region in which the amplification transistor AMP is formed) and the second semiconductor region of the second substrate 20 (e.g., the region in which the selection transistor SEL is formed). This achieves an advantageous effect that the height in the stacking direction can be reduced.

Further, such configuration also achieves a similar effect to the first embodiment described above. In other words, it is sufficient that the number of contacts Cts formed in the wiring D1 is only one, the contact Ct being used to connect a plurality of first elements (a plurality of first elements as a constituent unit for aggregation) such as the output terminal side of the transfer transistor TR formed on the first substrate 10 and the electrode 230 to the wiring D1. Thus, it is possible to reduce the number of contacts and the area of the wiring D1, enabling the capacitance associated with the wiring D1 to be reduced. This makes it possible to improve the photoelectric conversion efficiency.

Moreover, the present embodiment is applicable to the second embodiment described above. In one example, the wiring 301a can be arranged in the opening formed in the second substrate 20, the transfer transistor TR can be a P-type transistor, and the wiring 301a can be formed as N-type polysilicon. In addition, in one example, the wiring 301b can be arranged in the opening formed in the second substrate 20, the electrode 230 connected to the photodiode PD can be formed as N-type polysilicon, and the wiring 301b can be formed as P-type polysilicon.

Further, the present embodiment is also applicable to the third embodiment described above. In one example, the wiring 301 (wiring 301a or wiring 301b) can be arranged in the opening formed in the second substrate 20, and the wiring 301 can include tungsten (W).

6. Fifth Embodiment (Configuration Example of Image Sensor)

An example of the configuration of an image sensor according to the fifth embodiment is now described. Moreover, the basic configuration of the image sensor according to the present embodiment is the same as that of the image sensor 1 according to the first embodiment described above, so only the difference from the first embodiment described above is described. The configuration other than the difference is similar to that of the first embodiment described above.

Figure 35:
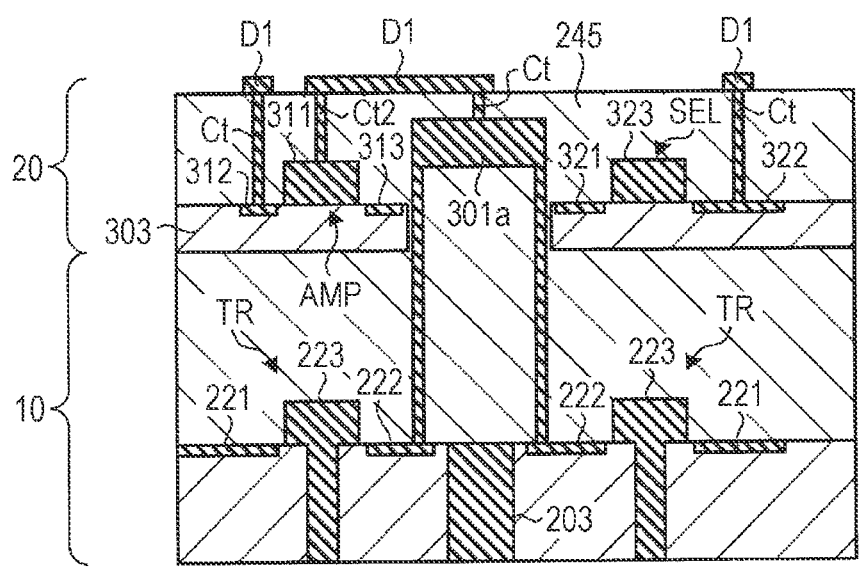
FIG. 35 is a diagram illustrating a part of a cross-section of the image sensor of a fifth embodiment.

In the present embodiment, the wiring 301 (wiring 301a or wiring 301b) is arranged between the second element (the gate electrode 311 of the amplification transistor AMP or the reference potential line) and the wiring D1. In one example, as illustrated in FIG. 35, the wiring 301a is arranged between the gate electrode 311 of the amplification transistor AMP formed on the second substrate 20 and the wiring D1.

This configuration also achieves a similar effect to the first embodiment described above. In other words, it is sufficient that the number of contacts Cts formed in the wiring D1 is only one, the contact Ct being used to connect a plurality of first elements (a plurality of first elements as a constituent unit for aggregation) such as the output terminal side of the transfer transistor TR formed on the first substrate 10 and the electrode 230 to the wiring D1. Thus, it is possible to reduce the number of contacts and the area of the wiring D1, enabling the capacitance associated with the wiring D1 to be reduced. This makes it possible to improve the photoelectric conversion efficiency.

Moreover, the present embodiment is applicable to the second embodiment described above. In one example, the wiring 301a can be arranged in the opening formed in the second substrate 20, and can be arranged between the gate electrode 311 of the amplification transistor AMP and the wiring D1, the transfer transistor TR can be a P-type transistor, and the wiring 301a can be formed as N-type polysilicon. In addition, in one example, the wiring 301b can be arranged between the reference potential line and the wiring D1, the electrode 230 connected to the photodiode PD can be formed as N-type polysilicon, and the wiring 301b can be formed as P-type polysilicon.

Further, the present embodiment is also applicable to the third embodiment described above. In one example, the wiring 301a can be arranged between the gate electrode 311 of the amplification transistor AMP and the wiring D1, and the wiring 301a can include tungsten (W). In addition, in one example, the wiring 301b can be arranged between the reference potential line and the wiring D1, and the wiring 301b can include tungsten (W).

7. Sixth Embodiment (Configuration Example of Image Sensor)

An example of the configuration of an image sensor according to the sixth embodiment is now described. Moreover, the basic configuration of the image sensor according to the present embodiment is the same as that of the image sensor 1 according to the first embodiment described above, so only the difference from the first embodiment described above is described. The configuration other than the difference is similar to that of the first embodiment described above.

Figure 36:
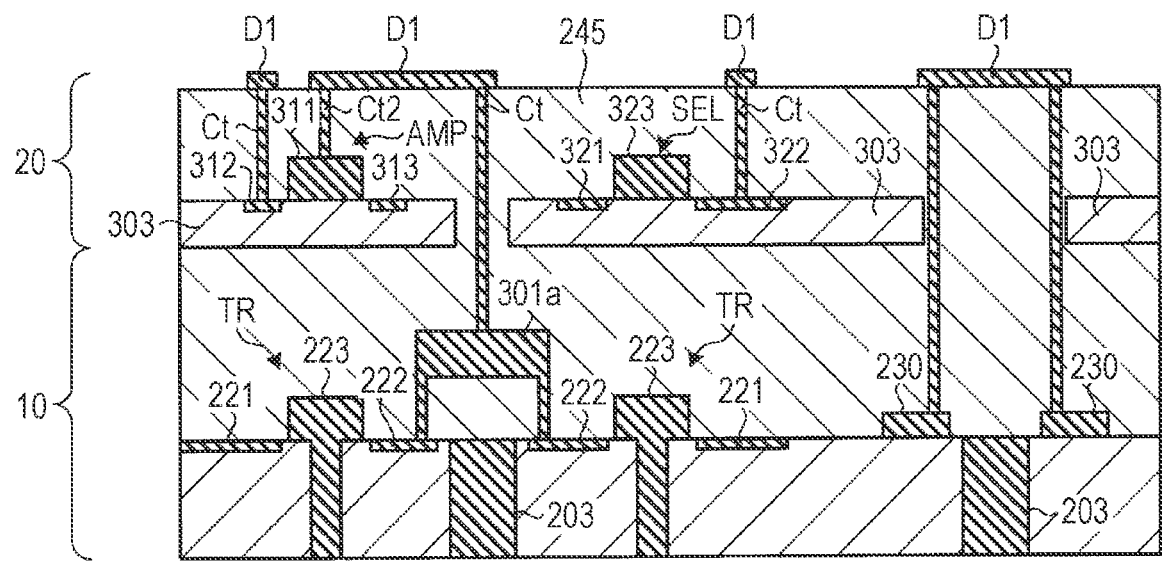
FIG. 36 is a diagram illustrating a part of a cross-section of the image sensor of a sixth embodiment.

In the present embodiment, as illustrated in FIG. 36, only the wiring 301a is provided. In this example, the wiring 301b described above is not provided, and the electrodes 230 are connected to the wiring D1 via the respective individual contacts.

This configuration makes it sufficient to set the number of contacts Cts formed in the wiring D1 to one. Specifically, the contact Ct is used to commonly connect the output terminal side of the plurality of transfer transistors TRs formed on the first substrate 10 to the wiring D1 (the wiring D1 leading to the gate electrode 311 of the amplification transistor AMP). Thus, it is possible to reduce the number of contacts and the area of the wiring D1 leading to the gate electrode 311 of the amplification transistor AMP.

Figure 37:
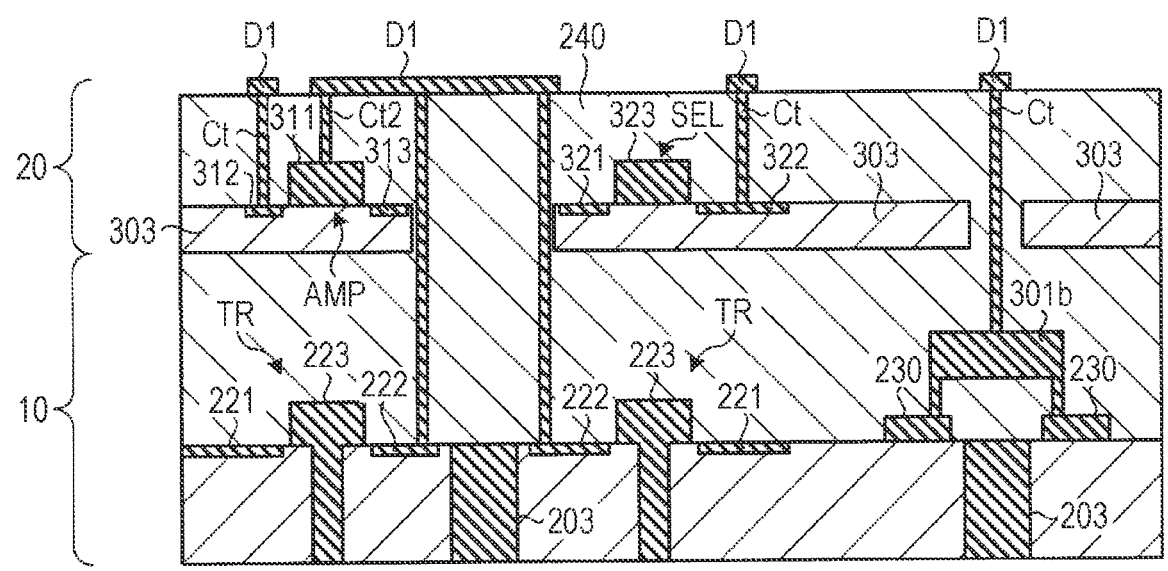
FIG. 37 is a diagram illustrating a part of a cross-section of an image sensor according to a modification of the sixth embodiment.

Further, in one example, as illustrated in FIG. 37, a configuration in which only the wiring 301b is provided is implementable. In this example, the wiring 301a described above is not provided, and the output terminal sides (the source regions 222 in this example) of the transfer transistors TRs are connected to the wiring D1 via the respective individual contacts.

This configuration also makes it sufficient to set the number of contacts Cts formed in the wiring D1 to one. Specifically, the contact Ct is used to commonly connect the plurality of electrode 230 formed on the first substrate 10 to the wiring D1 (wiring D1 leading to the reference potential line). Thus, it is possible to reduce the number of contacts and the area of the wiring D1 leading to the reference potential line.

In short, the configuration in which the wiring 301a is provided but the wiring 301b is not provided is implementable. On the contrary, the configuration in which the wiring 301b is provided but the wiring 301a is not provided is implementable.

Moreover, the present embodiment is also applicable to the second embodiment described above. The transfer transistor TR can be a P-type transistor, and the wiring 301a can be formed as N-type polysilicon. In addition, the electrode 230 connected to the photodiode PD can be formed as N-type polysilicon, and the wiring 301b can be formed as P-type polysilicon.

In addition, the present embodiment is also applicable to the third embodiment described above, and the wiring 301 (wiring 301a or wiring 301b) can include tungsten (W).

Further, the present embodiment is also applicable to the fourth embodiment described above. In one example, the wiring 301a can be arranged in the opening in the second substrate 20 in the configuration in which the wiring 301a is provided but the wiring 301b is not provided. In addition, in one example, the wiring 301b can be arranged in the opening formed in the second substrate 20 in the configuration in which the wiring 301b is provided but the wiring 301a is not provided.

Furthermore, the present embodiment is also applicable to the fifth embodiment described above. In one example, the wiring 301a can be arranged between the gate electrode 311 of the amplification transistor AMP and the wiring D1 in the configuration in which the wiring 301a is provided but the wiring 301b is not provided. In addition, in one example, the wiring 301b can be arranged between the reference potential line and the wiring D1 in the configuration in which the wiring 301b is provided but the wiring 301a is not provided.

In short, the present embodiment is applicable to each of the second to fifth embodiments described above.

8. Seventh Embodiment (Configuration Example of Electronic Apparatus)

Figure 38:
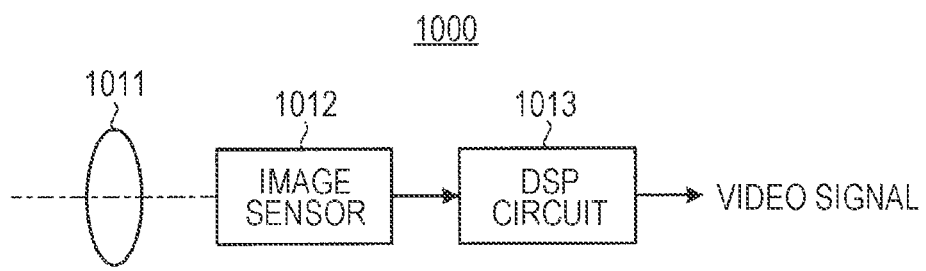
FIG. 38 is a diagram illustrating a configuration example of a camera that is an example of an electronic apparatus to which the image sensor of the present disclosure is applied.

The image sensor described in each of the embodiments described above is applicable to, in one example, an electronic apparatus including various mobile terminal devices such as digital still cameras, digital video cameras, and camera-equipped mobile phones, or printers. FIG. 38 is a diagram illustrating a configuration example of a camera 1000 that is an example of an electronic apparatus to which the image sensor of the present disclosure is applied. The camera 1000 is an example of a video camera capable of capturing a still image or a moving image.

As illustrated in FIG. 38, the camera 1000 includes at least a lens group 1011, an image sensor 1012, and a DSP circuit 1013.

The lens group 1011 takes in the incident light (image light) from a subject and guides it to the image sensor 1012. In this example, the lens group 1011 corresponds to an example of an "optical system" for guiding the incident light to the image sensor.

The image sensor 1012 converts the incident light into an electric signal and supplies it as a pixel signal to the DSP circuit 1013. The conversion is performed in pixel units. As the image sensor 1012, any of the image sensors of the respective embodiments described above is applied.

The DSP circuit 1013 performs predetermined image processes on the pixel signal supplied from the image sensor 1012. The DSP circuit 1013 outputs a set of pixel signals subjected to the processing (a set of pixel signals for one frame) in pixel units as a video signal. In this example, the DSP circuit 1013 corresponds to an example of a "processing unit" that processes a signal output from the image sensor.

The video signal output from the DSP circuit 1013 is temporarily stored in a frame memory or the like, and then recorded in a recording medium such as a digital versatile disk (DVD) or a flash memory. Alternatively, it is displayed on a display device such as a liquid crystal panel or an organic electroluminescence (EL) panel.

9. Modification

A modification of the image sensor 1 is now described.

[Modification A]

Figure 39:
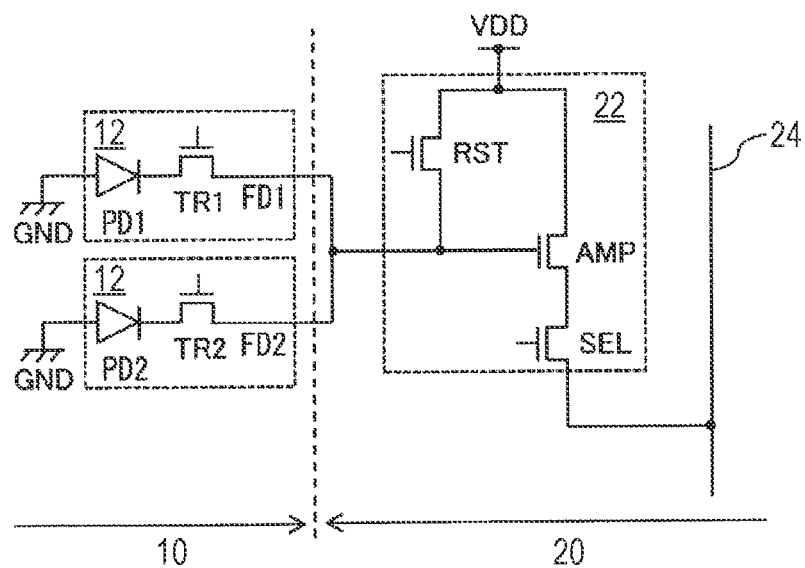
FIG. 39 is a diagram illustrating an example of the sensor pixel and the readout circuit of FIG. 1.
Figure 40:
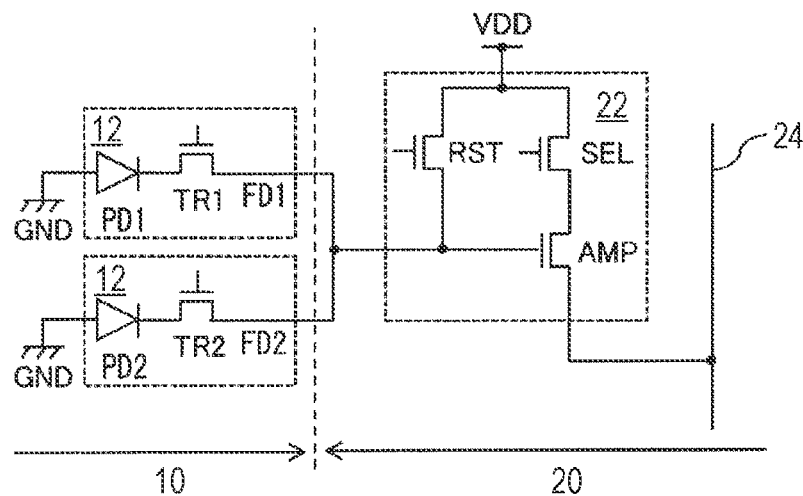
FIG. 40 is a diagram illustrating an example of the sensor pixel and the readout circuit of FIG. 1.

In each of the embodiments described above, the number of pixels in the shared constituent unit is four, but the number of pixels in the shared constituent unit is not limited to the above examples, and the number of pixels in the shared constituent unit can be optionally varied. In one example, as illustrated in FIGS. 39 and 40, the number of pixels in the shared constituent unit can be two. In other words, the second substrate 20 can have one readout circuit 22 for each of two sensor pixels 12. FIG. 39 illustrates a modification of the sensor pixel 12 and the readout circuit 22 illustrated in FIG. 2. FIG. 40 illustrates a modification of the sensor pixel 12 and the readout circuit 22 illustrated in FIG. 3.

Figure 41:
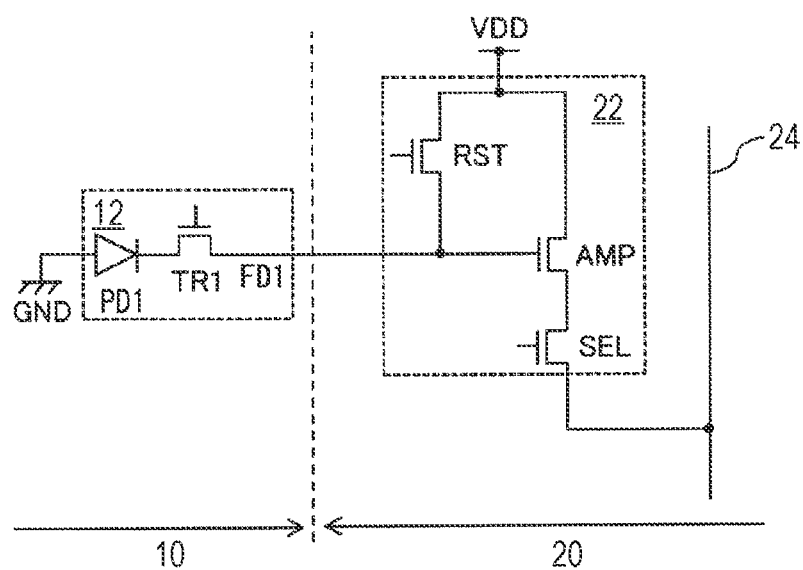
FIG. 41 is a diagram illustrating an example of the sensor pixel and the readout circuit of FIG. 1.
Figure 42:
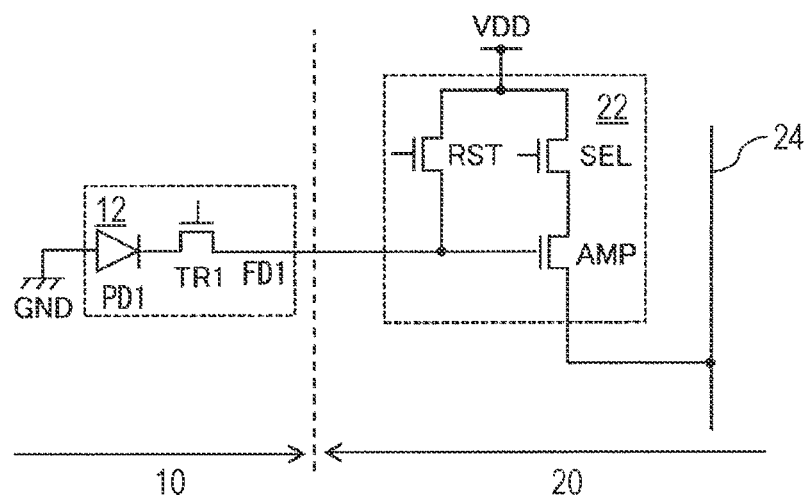
FIG. 42 is a diagram illustrating an example of the sensor pixel and the readout circuit of FIG. 1.

Further, in one example, as illustrated in FIGS. 41 and 42, the number of pixels in the shared constituent unit can be one. In other words, the second substrate 20 can have one readout circuit 22 for each of two sensor pixels 12. FIG. 41 illustrates a modification of the sensor pixel 12 and the readout circuit 22 illustrated in FIG. 2. FIG. 42 illustrates a modification of the sensor pixel 12 and the readout circuit 22 illustrated in FIG. 3.

[Modification B]

Figure 43:
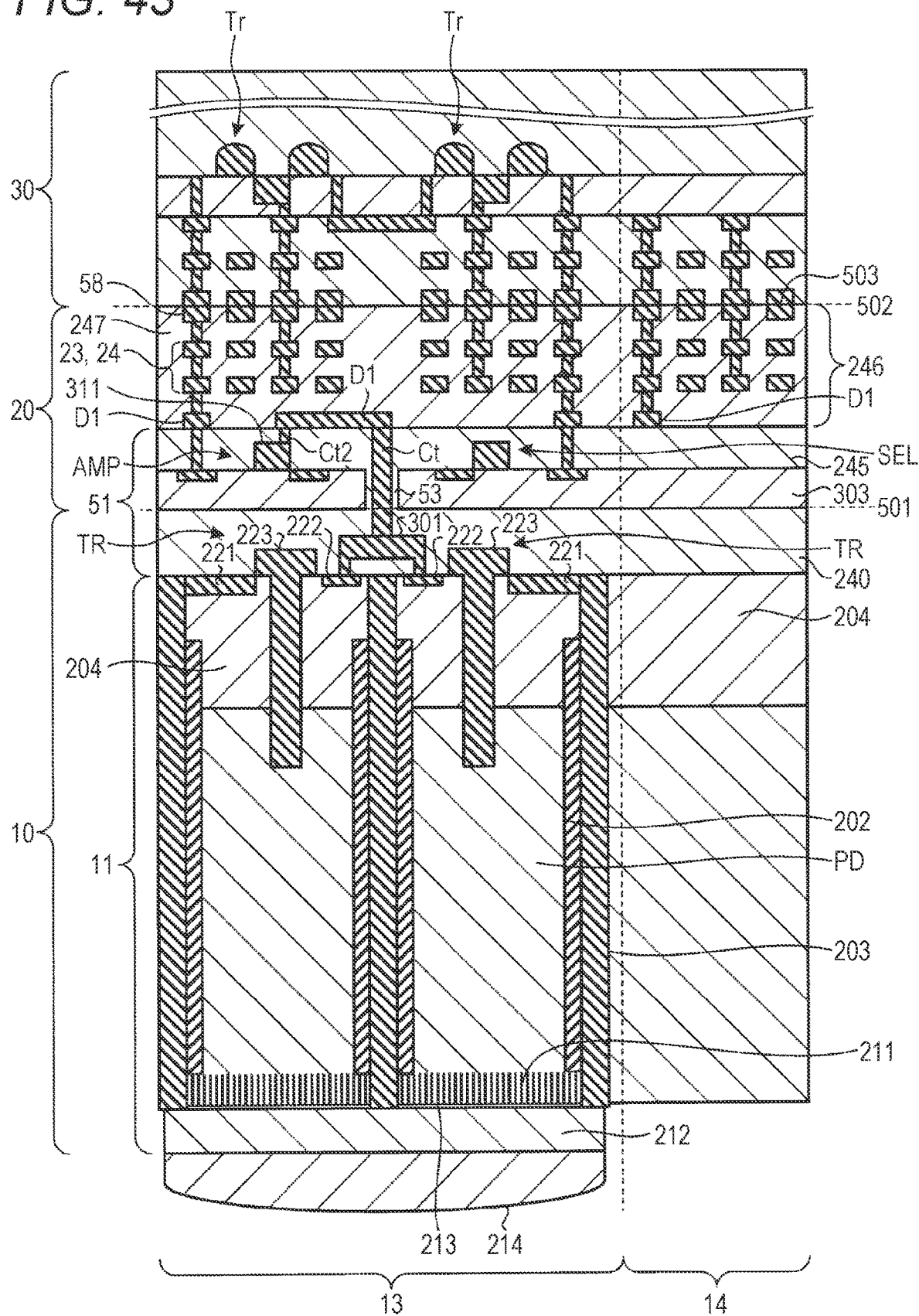
FIG. 43 is a diagram illustrating an example of a cross-sectional configuration in the vertical direction of the image sensor of FIG. 1.

FIG. 43 illustrates a modification of the cross-sectional configuration of the image sensor 1 in the vertical direction. In the present modification, the electrical connection between the second substrate 20 and the third substrate 30 is made in a region facing a peripheral region 14 of the first substrate 10. The peripheral region 14 corresponds to a frame region of the first substrate 10 and is provided on the peripheral edge of the pixel region 13. In the present modification, the second substrate 20 has the plurality of pad electrodes 58 in the region facing the peripheral region 14, and the third substrate 30 has a plurality of pad electrodes 64 in the region facing the peripheral region 14. The second substrate 20 and the third substrate 30 are electrically connected to each other by joining the pad electrodes 58 and 64 provided in the region facing the peripheral region 14.

As described above, in the present modification, the second substrate 20 and the third substrate 30 are electrically connected to each other by joining the pad electrodes 58 and 64 provided in the region facing the peripheral region 14. This makes it possible to reduce the possibility of hindering the miniaturization of the area per pixel as compared with the case where the pad electrodes 58 and 64 are joined to each other in the region facing the pixel region 13. Thus, it is possible to provide the image sensor 1 having the three-layer structure that does not hinder the miniaturization of the area per pixel while having the same chip size as the related art.

[Modification C]

Figure 44:
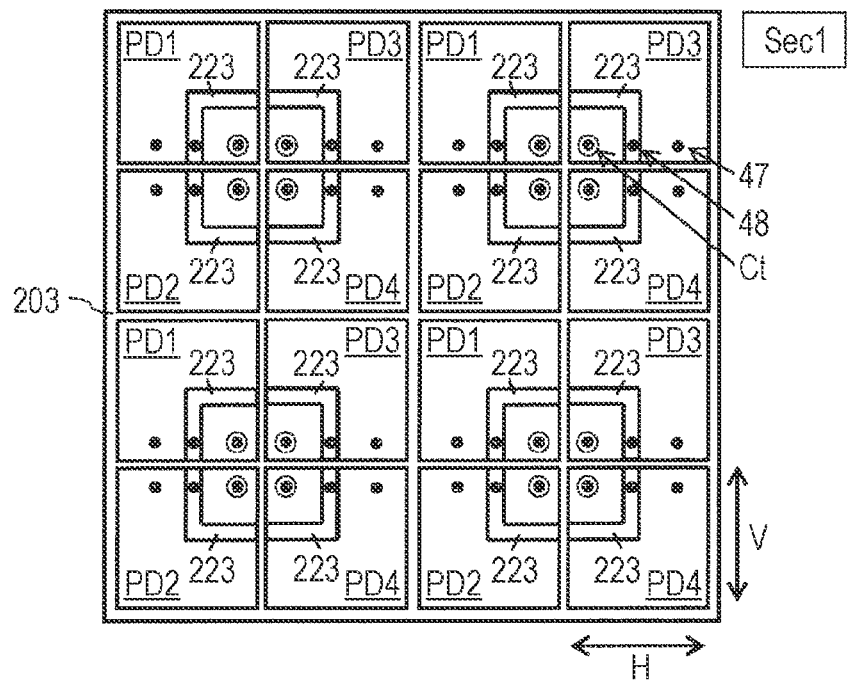
FIG. 44 is a diagram illustrating an example of a cross-sectional configuration in the horizontal direction of the image sensor of FIG. 1.
Figure 44:
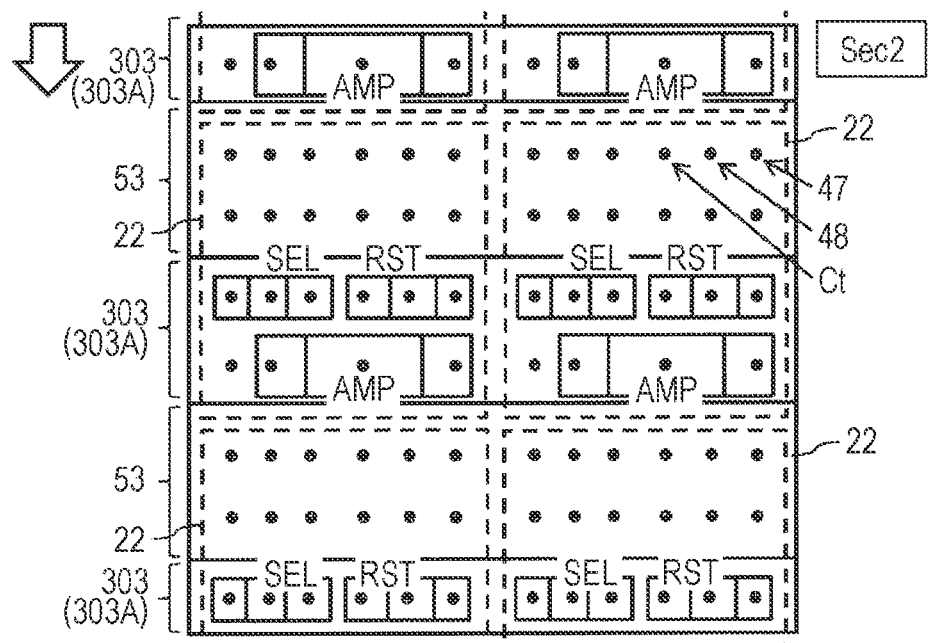
Figure 45:
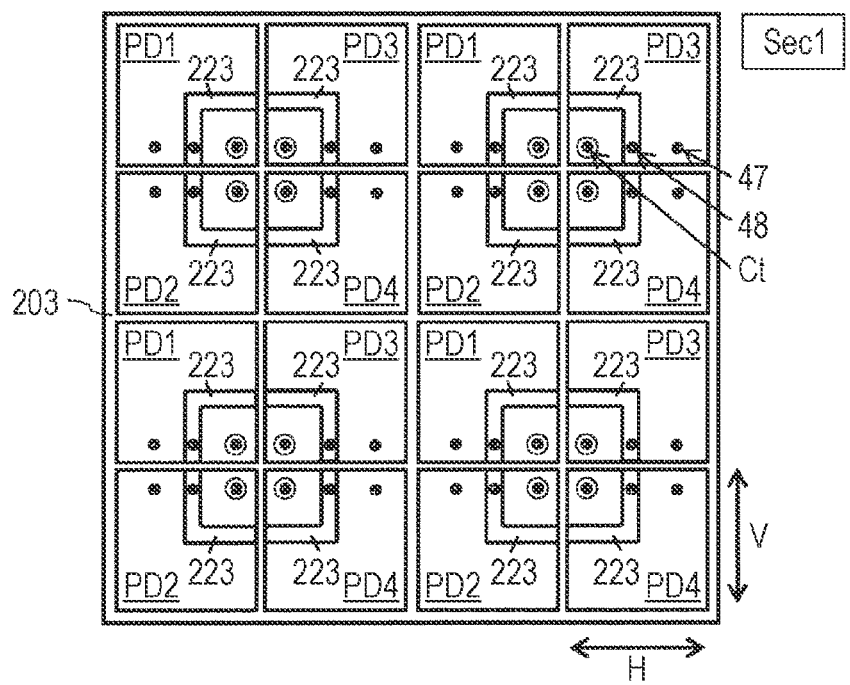
FIG. 45 is a diagram illustrating an example of a cross-sectional configuration in the horizontal direction of the image sensor of FIG. 1.
Figure 45:
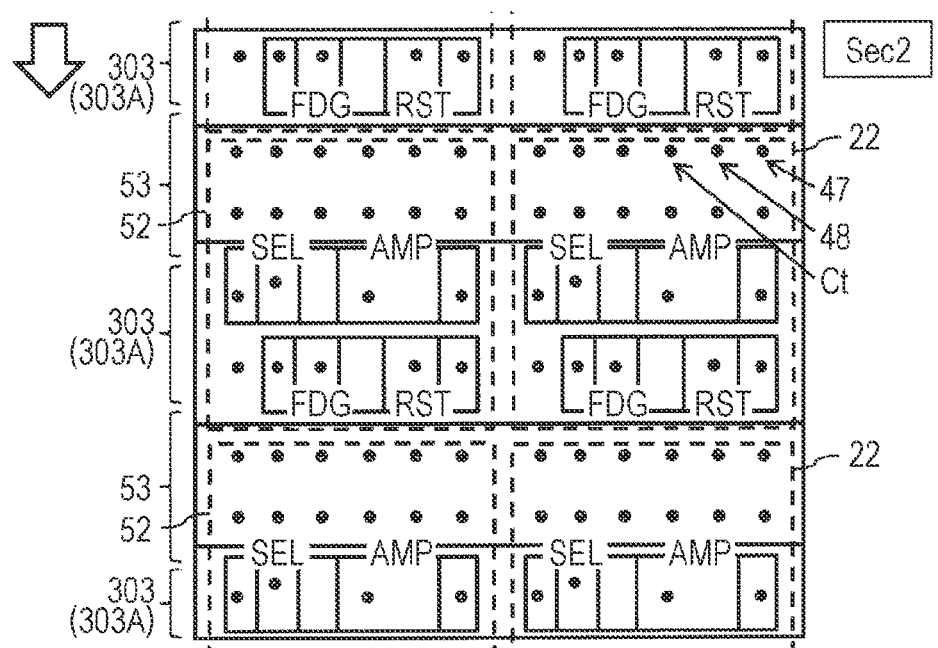

FIGS. 44 and 45 are diagrams illustrating modification examples of a cross-sectional configuration in the horizontal direction of the image sensor 1. The upper views of FIGS. 44 and 45 illustrate a modification example of the cross-sectional configuration of a cross-section Sec1 of FIG. 7, and the lower views of FIG. 23 illustrate a modification example of the cross-sectional configuration of a cross-section Sec2 of FIG. 7. Moreover, in the upper sectional views of FIGS. 44 and 45, a view illustrating a modification example of the front surface configuration of the semiconductor substrate 11 of FIG. 7 is superimposed on a view illustrating a modification example of the cross-sectional configuration of the cross-section Sec1 of FIG. 7, but the insulating layer 240 is omitted. In addition, in the lower sectional views of FIGS. 44 and 45, a view illustrating a modification example of the front surface configuration of the semiconductor substrate 303 is superimposed on a view illustrating a modification example of the cross-sectional configuration of the cross-section Sec2 of FIG. 7.

As illustrated in FIGS. 44 and 45, a plurality of contacts Ct, the plurality of through wirings 47, and the plurality of through wirings 48 (plurality of dots provided in a matrix in the drawings) are arranged side by side in a strip-shape in the plane of the first substrate 10 in the first direction V1 (horizontal direction in FIGS. 44 and 45). Moreover, FIGS. 44 and 45 illustrate a case where the plurality of contacts Ct, the plurality of through wirings 47, and the plurality of through wirings 48 are arranged side by side in two lines in the first direction V1. In the four sensor pixels 12 sharing the readout circuit 22, the four floating diffusion regions FDs are arranged close to each other, in one example, through the element separation portion 43. In the four sensor pixels 12 sharing the readout circuit 22, the four transfer gates TG (TG1, TG2, TG3, and TG4) are arranged to surround the four floating diffusion regions FDs. In one example, the four transfer gates TGs form a ring shape.

The insulating layer 53 includes a plurality of blocks extending in the first direction V1. The semiconductor substrate 303 extends in the first direction V1 and includes a plurality of island-shaped blocks 303A arranged side by side in the second direction V2 orthogonal to the first direction V1 via the insulating layer 53. Each block 303A is provided with, in one example, the reset transistors RSTs, amplification transistors AMPS, and selection transistors SELs. One readout circuit 22 shared by four sensor pixels 12 is not arranged straightly facing the four sensor pixels 12, and in one example, it is arranged shifting to the second direction V2.

In FIG. 44, one readout circuit 22 shared by four sensor pixels 12 includes, in the second substrate 20, the reset transistor RST, the amplification transistor AMP, and the selection transistor SEL in a region shifted from a region facing four sensor pixels 12 in the second direction V2. One readout circuit 22 shared by four sensor pixels 12 includes, in one example, the amplification transistor AMP, the reset transistor RST and the selection transistor SEL in one block 303A.

In FIG. 45, one readout circuit 22 shared by four sensor pixels 12 includes, in the second substrate 20, the reset transistor RST, the amplification transistor AMP, the selection transistor SEL, and the FD transfer transistor FDG in a region shifted from a region facing four sensor pixels 12 in the second direction V2. One readout circuit 22 shared by four sensor pixels 12 includes, in one example, the amplification transistor AMP, the reset transistor RST, the selection transistor SEL, and the FD transfer transistor FDG in one block 303A.

In the present modification, one readout circuit 22 shared by four sensor pixels 12 is not arranged to face the four sensor pixels 12 straightly, and in one example, is arranged shifting to the second direction V2 from a position straightly facing the four sensor pixels 12. In such a case, it is possible to shorten the wiring 25, or it is possible to omit the wiring 25 and configure the source of the amplification transistor AMP and the drain of the selection transistor SEL in a common impurity region. Consequently, it is possible to reduce the size of the readout circuit 22 or increase the size of other parts of the readout circuit 22.

[Modification D]

Figure 46:
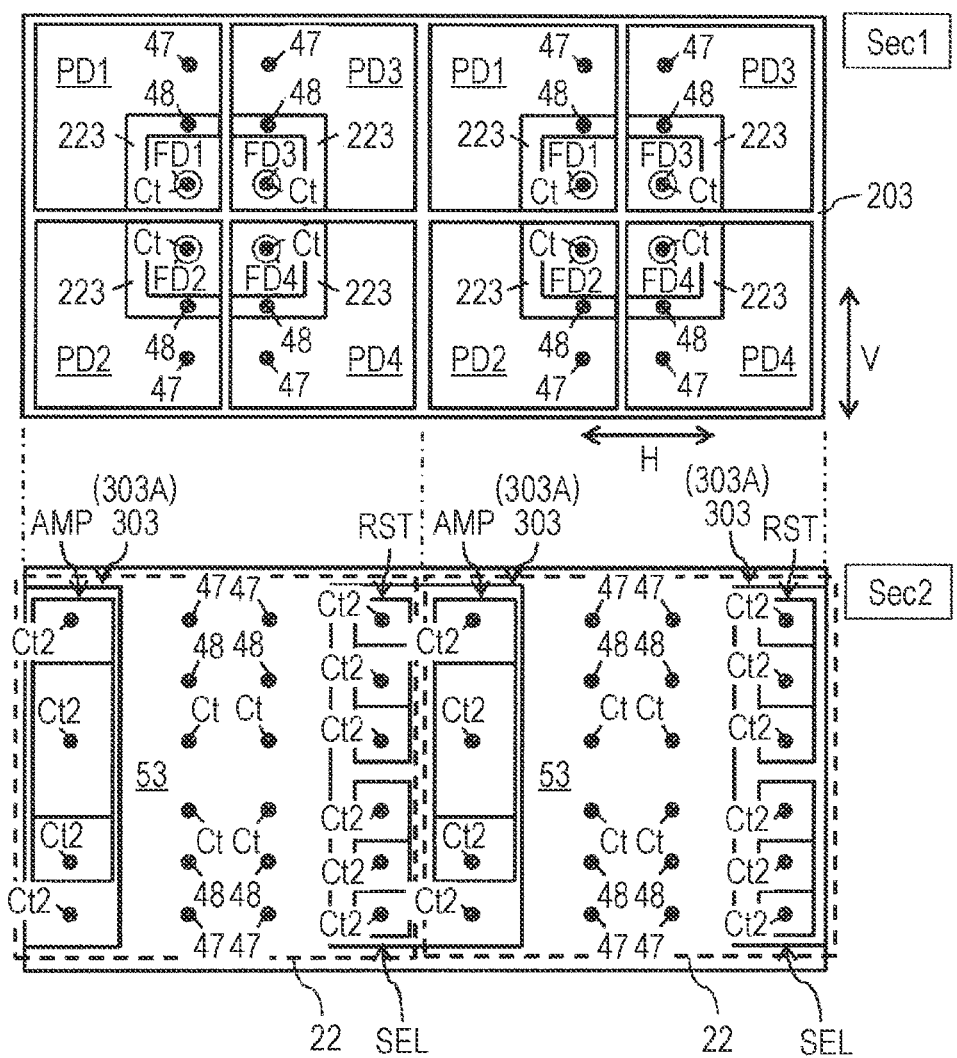
FIG. 46 is a diagram illustrating an example of a cross-sectional configuration in the horizontal direction of the image sensor of FIG. 1.

FIG. 46 illustrates a modification of the cross-sectional configuration of the image sensor 1 in the horizontal direction. FIG. 46 illustrates a modification of the cross-sectional configuration of FIG. 12.

In the present modification, the semiconductor substrate 303 includes the plurality of island-shaped blocks 303A arranged side by side in the first direction V1 and the second direction V2 via the insulating layer 53. Each block 303A is provided with, in one example, a set of reset transistor RST, amplification transistor AMP, and selection transistor SEL. In such a case, the use of the insulating layer 53 makes it possible to reduce or eliminate the crosstalk occurring between the readout circuits 22 adjacent to each other. It is also possible to reduce or eliminate the resolution deterioration on the reproduced image and the image quality deterioration due to color mixing.

[Modification E]

Figure 47:
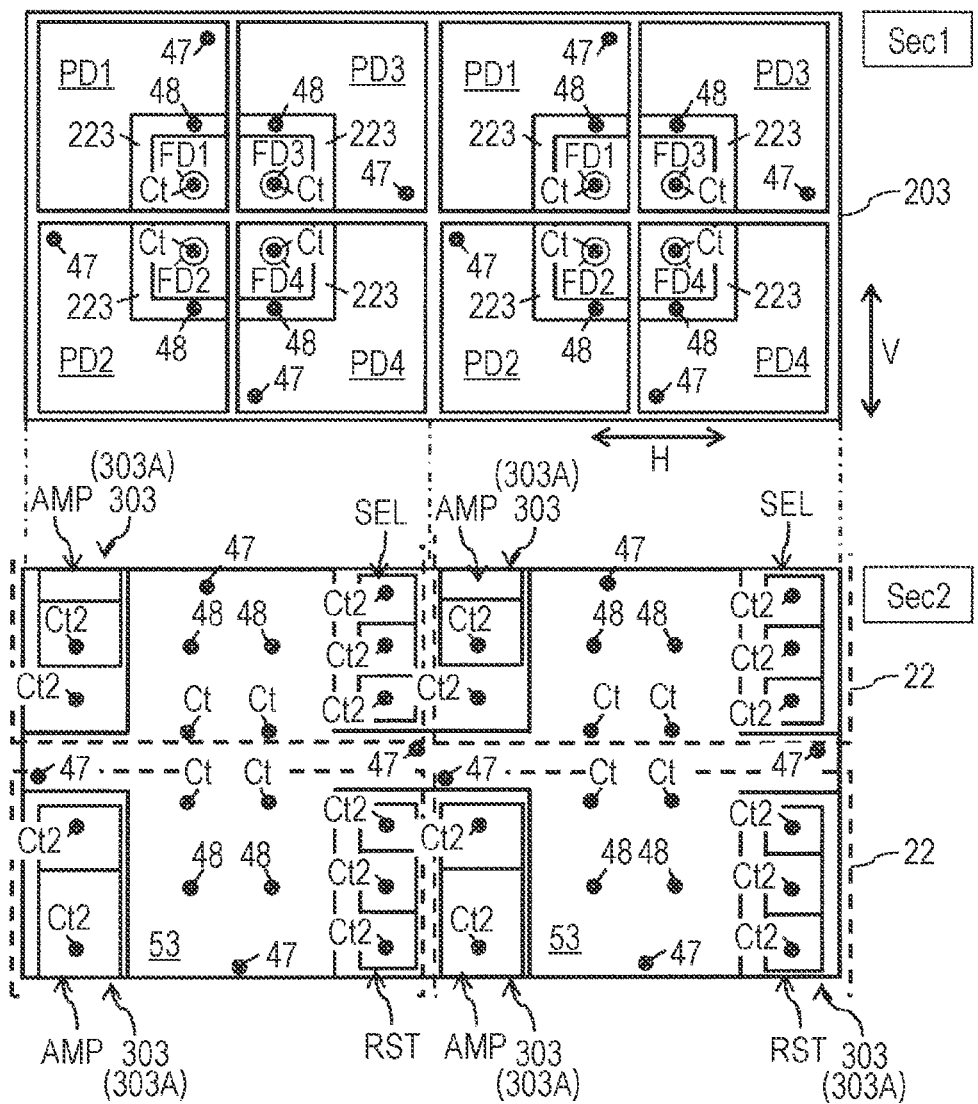
FIG. 47 is a diagram illustrating an example of a cross-sectional configuration in the horizontal direction of the image sensor of FIG. 1.

FIG. 47 illustrates a modification of the cross-sectional configuration of the image sensor 1 in the horizontal direction. FIG. 47 illustrates a modification of the cross-sectional configuration of FIG. 46.

In the present modification, one readout circuit 22 shared by four sensor pixels 12 is not arranged facing the four sensor pixels 12 straightly, and in one example, is arranged shifting to the first direction V1. In the present modification, further, as similar to the Modification D, the semiconductor substrate 303 includes the plurality of island-shaped blocks 303A arranged side by side in the first direction V1 and the second direction V2 via the insulating layer 53. Each block 303A is provided with, in one example, a set of reset transistor RST, amplification transistor AMP, and selection transistor SEL. In the present modification, the plurality of through wirings 47 and the plurality of contact Cts are further arranged in the second direction V2. Specifically, the plurality of through wirings 47 is arranged between four contacts Cts that share one readout circuit 22 and four through wiring contacts Cts that share other readout circuits 22 adjacent to the second direction V2 of the one readout circuit 22. In such a case, the use of the insulating layer 53 and the through wirings 47 makes it possible to reduce or eliminate the crosstalk occurring between the readout circuits 22 adjacent to each other. It is also possible to reduce or eliminate the resolution deterioration on the reproduced image and the image quality deterioration due to color mixing.

[Modification F]

Figure 48:
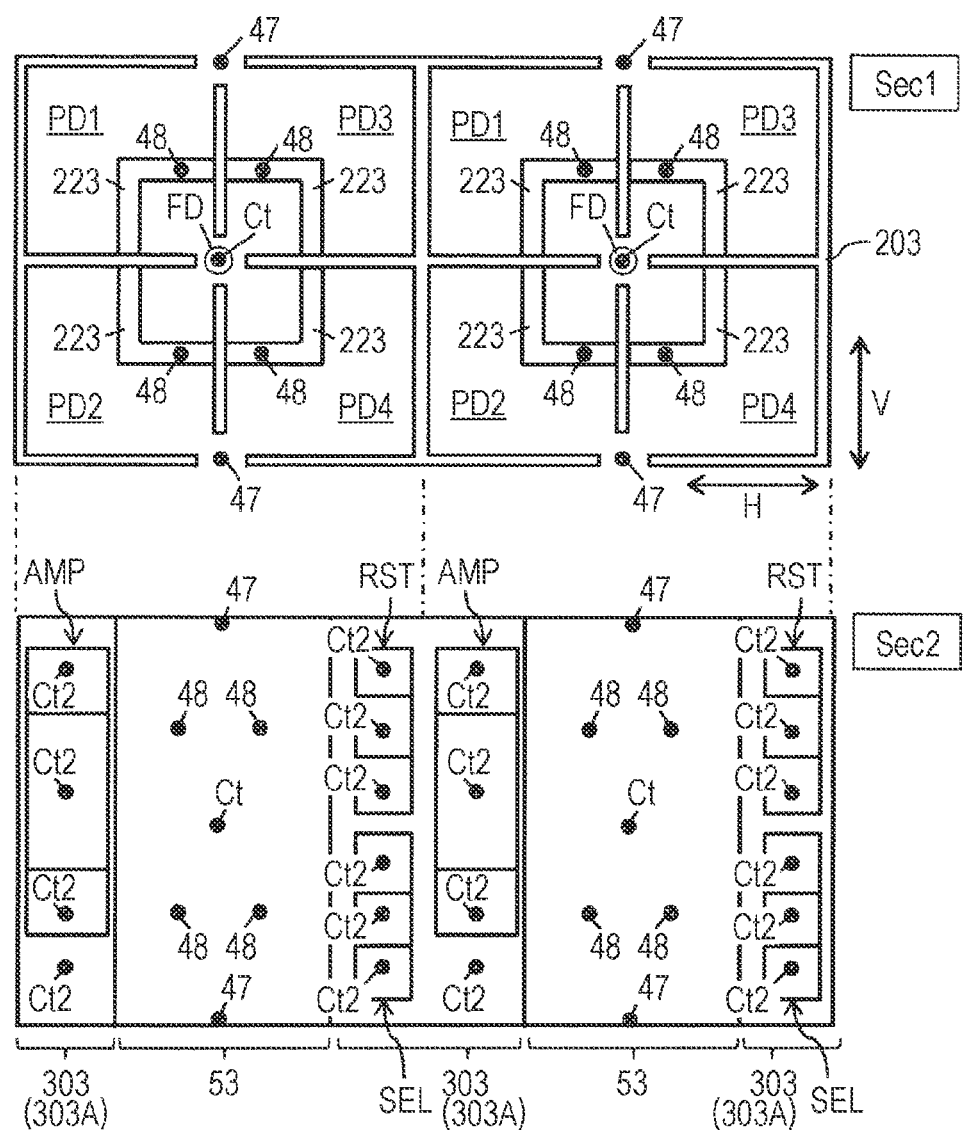
FIG. 48 is a diagram illustrating an example of a cross-sectional configuration in the horizontal direction of the image sensor of FIG. 1.

FIG. 48 illustrates an example of the cross-sectional configuration of the image sensor 1 in the horizontal direction. FIG. 48 illustrates a modification of the cross-sectional configuration of FIG. 12.

In the present modification, the first substrate 10 has the photodiode PD and the transfer transistor TR for each sensor pixel 12, and the floating diffusion FD is shared for each of the four sensor pixels 12. Thus, in the present modification, one contact Ct is provided for each of the four sensor pixels 12.

In a plurality of sensor pixels 12 arranged in a matrix, four sensor pixels 12 corresponding to the region obtained by shifting the unit region corresponding to the four sensor pixels 12 sharing one floating diffusion FD to the first direction V1 by one sensor pixel 12 is referred to as four sensor pixels 12A for the sake of convenience. In this case, in the present modification, the first substrate 10 shares the through wiring 47 for each of the four sensor pixels 12A. Thus, in the present modification, one through wiring 47 is provided for each of the four sensor pixels 12A.

In the present modification, the first substrate 10 has the pixel separation portion 203 that separates the photodiode PD and the transfer transistor TR for each sensor pixel 12. The element separation portion 43 does not surround the sensor pixel 12 entirely when viewed from the normal direction of the semiconductor substrate 11 and has a gap (an unformed region) near the floating diffusion FD (through wiring 54) and near the through wiring 47. Then, the gap allows the four sensor pixels 12 to share one through wiring 54 and allows the four sensor pixels 12A to share one through wiring 47. In the present modification, the second substrate 20 has the readout circuit 22 for each of the four sensor pixels 12 that share the floating diffusion FD.

Figure 49:
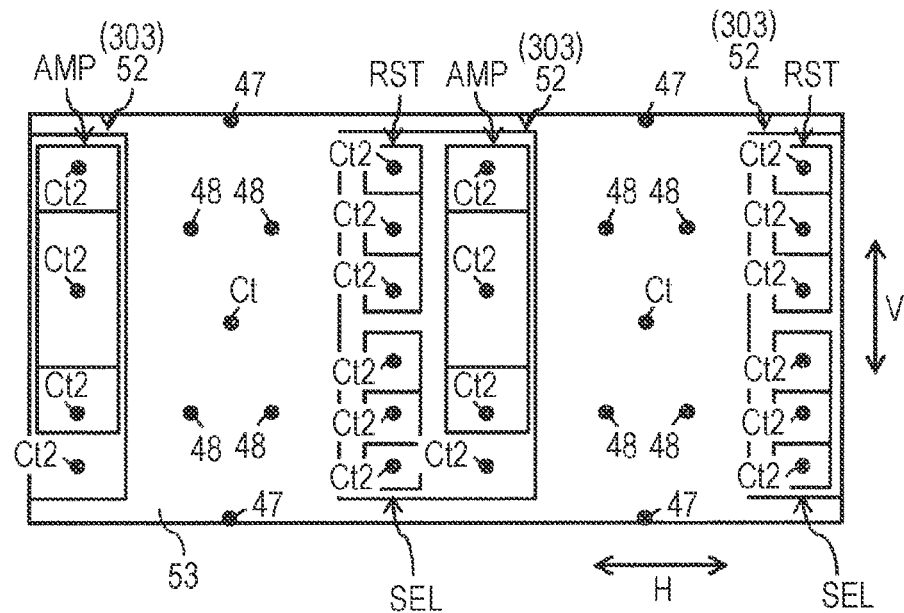
FIG. 49 is a diagram illustrating an example of a cross-sectional configuration in the horizontal direction of the image sensor of FIG. 1.

FIG. 49 illustrates an example of the cross-sectional configuration in the horizontal direction of the image sensor 1 according to the present modification. FIG. 49 illustrates a modification of the cross-sectional configuration of FIG. 46. In the present modification, the first substrate 10 has the photodiode PD and the transfer transistor TR for each sensor pixel 12, and the floating diffusion FD is shared for each of the four sensor pixels 12. Furthermore, the first substrate 10 has the pixel separation portion 203 that separates the photodiode PD and the transfer transistor TR for each sensor pixel 12.

Figure 50:
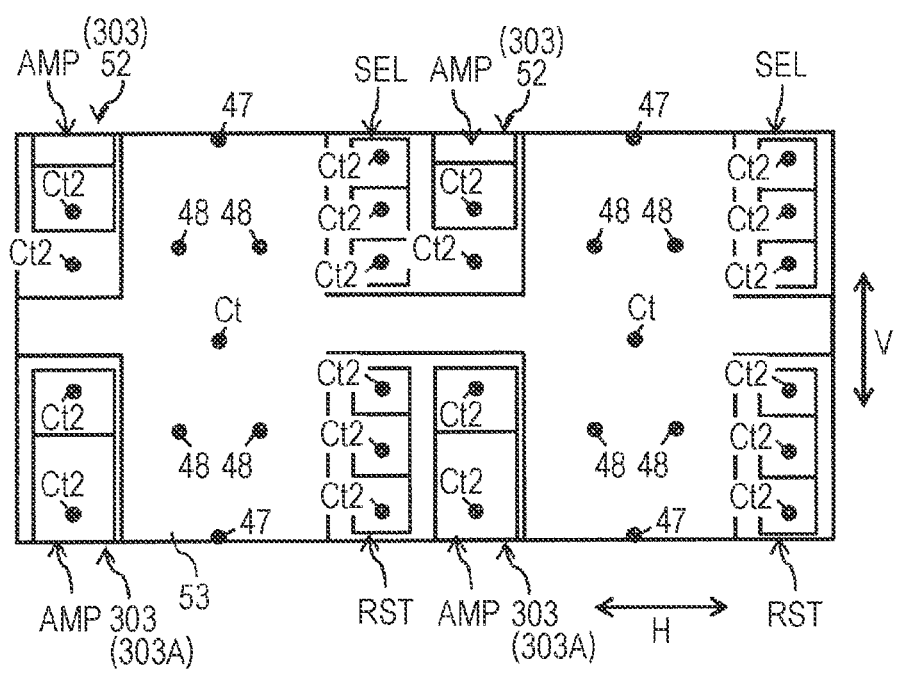
FIG. 50 is a diagram illustrating an example of a cross-sectional configuration in the horizontal direction of the image sensor of FIG. 1.

FIG. 50 illustrates an example of the cross-sectional configuration of the image sensor 1 according to the present modification in the horizontal direction. FIG. 50 illustrates a modification of the cross-sectional configuration of FIG. 47. In the present modification, the first substrate 10 has the photodiode PD and the transfer transistor TR for each sensor pixel 12, and the floating diffusion FD is shared for each of the four sensor pixels 12. Furthermore, the first substrate 10 has the pixel separation portion 203 that separates the photodiode PD and the transfer transistor TR for each sensor pixel 12.

[Modification G]

Figure 51:
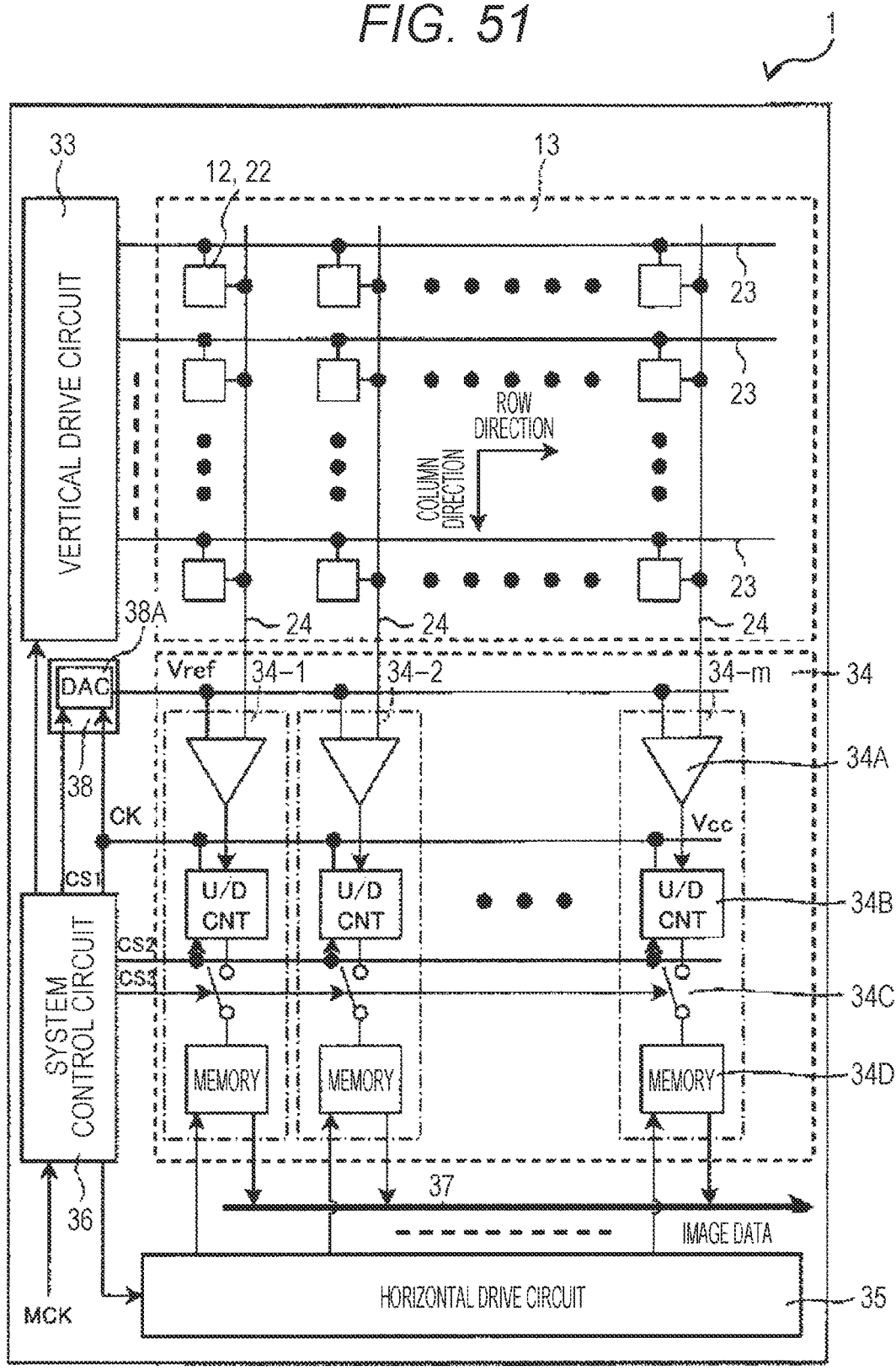
FIG. 51 is a diagram illustrating an example of a circuit configuration of an image capturing device that includes an image capturing device according to the embodiments described above and their modifications.

FIG. 51 illustrates an example of the circuit configuration of the image sensor 1 according to the modification. The image sensor 1 according to the present modification is a column-parallel ADC-equipped CMOS image sensor.

As illustrated in FIG. 51, the image sensor 1 according to the present modification has the pixel region 13 in which a plurality of sensor pixels 12 including a photoelectric transducer is arranged two-dimensionally in a matrix shape. The image sensor 1 also has the vertical drive circuit 33, the column signal processing circuit 34, the reference voltage supply unit 38, the horizontal drive circuit 35, the horizontal output line 37, and the system control circuit 36.

In this system configuration, the system control circuit 36 generates a clock signal, a control signal, or the like as a reference for the operation of the vertical drive circuit 33, the column signal processing circuit 34, the reference voltage supply unit 38, the horizontal drive circuit 35, and the like on the basis of a master clock MCK. The system control circuit 36 supplies the generated signal to the vertical drive circuit 33, the column signal processing circuit 34, the reference voltage supply unit 38, the horizontal drive circuit 35, and the like.

Further, the vertical drive circuit 33 is formed on the first substrate 10 together with each sensor pixel 12 in the pixel region 13, and is further formed on the second substrate 20 on which the readout circuit 22 is formed. The column signal processing circuit 34, the reference voltage supply unit 38, the horizontal drive circuit 35, the horizontal output line 37, and the system control circuit 36 are formed on the third substrate 30.

Although not illustrated in this figure, the sensor pixel 12 can have a configuration including, in one example, a transfer transistor TR that transfers the electric charge obtained by photoelectric conversion in the photodiode PD to the floating diffusion FD, in addition to the photodiode PD. In addition, although not illustrated in this figure, the readout circuit 22 can have a three-transistor configuration. The three-transistor configuration includes, in one example, a reset transistor RST that controls the potential of the floating diffusion FD, an amplification transistor AMP that outputs a signal corresponding to the potential of the floating diffusion FD, and a selection transistor SEL that performs pixel selection.

In the pixel region 13, the sensor pixels 12 are arranged two-dimensionally, the pixel drive lines 23 are wired for each row for the pixel arrangement of m rows and n columns, and the vertical signal lines 24 are wired for each column. Each end of each of the plurality of pixel drive lines 23 is connected to each output terminal corresponding to each row of the vertical drive circuit 33. The vertical drive circuit 33 is configured as a shift register or the like and controls the row addressing and row scanning of the pixel region 13 via the plurality of pixel drive lines 23.

The column signal processing circuit 34 has, in one example, analog-to-digital conversion circuits (ADCs) 34-1 to 34-$m$ provided for each pixel row in the pixel region 13, that is, for each vertical signal line 24. The column signal processing circuit 34 converts an analog signal output for each column from each sensor pixel 12 in the pixel region 13 into a digital signal and outputs it.

The reference voltage supply unit 38 has, in one example, a digital-to-analog conversion circuit (DAC) 38A as a means for generating a reference voltage Vref of a so-called ramp waveform whose level changes in an inclined manner over time. Moreover, the means for generating the reference voltage Vref of the ramp waveform is not limited to the DAC 38A.

The DAC 38A generates the reference voltage Vref of the ramp waveform on the basis of a clock CK given by the system control circuit 36 and supplies it to the ADCs 34-1 to 34-$m$ of the column processing unit 15, under the control of a control signal CS1 given by the system control circuit 36.

Moreover, each of the ADCs 34-1 to 34-$m$ has a configuration capable of selectively performing the AD conversion operation corresponding to each operation mode including a normal frame rate mode and a high-speed frame rate mode. The normal frame rate mode is a progressive scanning mode that reads out information from all sensor pixels 12. The high-speed frame rate mode is a mode in which the exposure time of the sensor pixel 12 is set to 1/N and the frame rate is increased N times, for example, twice as much as in the normal frame rate mode. The execution of this operation mode switching is controlled by control signals CS2 and CS3 given from the system control circuit 36. In addition, the system control circuit 36 is given instruction information used for switching the operation modes between the normal frame rate mode and the high-speed frame rate mode from an external system controller (not illustrated).

The ADCs 34-1 to 34-$m$ have the same configuration, and in this example, the ADC 34-$m$ is described as one example. The ADC 34-$m$ has a comparator 34A, a counting means such as an up/down counter (denoted as U/D CNT in the FIG. 34B, a transfer switch 34C, and a memory device 34D.

The comparator 34A compares a signal voltage Vx of the vertical signal line 24 corresponding to the signal output from each sensor pixel 12 in the n-th row of the pixel region 13 and the reference voltage Vref of the ramp waveform supplied from the reference voltage supply unit 38. In one example, if the reference voltage Vref is larger than the signal voltage Vx, the comparator's output Vco is "H" level, and if the reference voltage Vref is equal to or less than the signal voltage Vx, the output Vco is "L" level.

The up/down counter 34B is an asynchronous counter. The clock CK from the system control circuit 36 is given to the up/down counter 34B and the DAC 18A at the same time under control by the control signal CS2 given from the system control circuit 36. The up/down counter 34B measures a comparison period from the start of the comparison operation to the end of the comparison operation in the comparator 34A by performing a down count or an up count in synchronization with the clock CK.

Specifically, in the normal frame rate mode, in the readout operation of a signal from one sensor pixel 12, the comparison time upon the first readout operation is measured by performing the down count at the time of the first readout operation, and the second time. The comparison upon the second readout operation is measured by performing the up count at the time of the second readout operation.

On the other hand, in the high-speed frame rate mode, the comparison time upon the first readout operation is measured by holding a count result for the sensor pixel 12 in one row as it is and performing the down count at the time of the first readout operation from the previous count result for the sensor pixel 12 in the next row. The comparison time upon the second readout operation is measured by performing the up count at the time of the second readout operation.

The transfer switch 34C is, in the normal frame rate mode, turned on (closed) at the time when the counting operation of the up/down counter 34B for the sensor pixel 12 in one row is completed under control by the control signal CS3 given from the system control circuit 36. The transfer switch 34C transfers the count result of the up/down counter 34B to the memory device 34D.

On the other hand, in one example, at the high-speed frame rate of N=2, the transfer switch 34C is turned off (open) at the time when the counting operation of the up/down counter 34B for the sensor pixel 12 in one row is completed and is turned on at the time when the counting operation of the up/down counter 34B for the sensor pixel 12 in the next row is completed. The count result for the two vertical pixels of the up/down counter 34B is transferred to the memory device 34D.

In this way, the analog signals supplied from each sensor pixel 12 in the pixel region 13 via the vertical signal line 24 for each column is converted into an N-bit digital signal by each operation of the comparator 34A and the up/down counter 34B in the ADCs 34-1 to 34-$m$ and stored in the memory device 34D.

The horizontal drive circuit 35 includes a shift register or the like, and controls the column addressing and column scanning of the ADCs 34-1 to 34-$m$ in the column signal processing circuit 34. Under the control of the horizontal drive circuit 35, the N-bit digital signals AD-converted by each of the ADCs 34-1 to 34-$m$ are sequentially read out to the horizontal output line 37 and are output as image capturing data via the horizontal output line 37.

Moreover, although not illustrated in particular because it is not directly related to the present disclosure, it is possible to provide a circuit or the like that performs various types of signal processing on the image capturing data output via the horizontal output line 37, in addition to the constituent components described above.

In the image sensor 1 equipped with the column-parallel ADC according to the present modification having the configuration described above, it is possible to selectively transfer the count result of the up/down counter 34B to the memory device 34D via the transfer switch 34C. Thus, it is possible to control independently the counting operation of the up/down counter 34B and the readout operation of the count result of the up/down counter 34B to the horizontal output line 37.

[Modification H]

Figure 52:
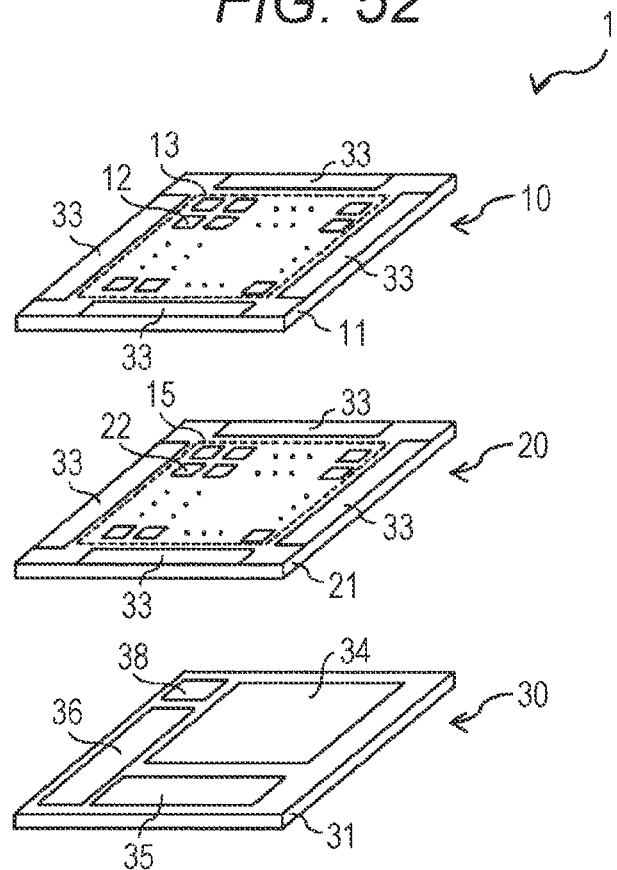
FIG. 52 is a diagram illustrating an example in which the image sensor of FIG. 51 is configured by stacking three substrates on top of each other.

FIG. 52 illustrates an example in which the image sensor 1 of FIG. 51 is configured by stacking three substrates (first substrate 10, second substrate 20, and third substrate 30) on top of each other. In the present modification, on the first substrate 10, the pixel region 13 including a plurality of sensor pixels 12 is formed in the central portion thereof, and the vertical drive circuit 33 is formed around the pixel region 13. In addition, on the second substrate 20, a readout circuit region 15 including a plurality of readout circuits 22 is formed in the central portion thereof, and the vertical drive circuit 33 is formed around the readout circuit region 15. On the third substrate 30, the column signal processing circuit 34, the horizontal drive circuit 35, the system control circuit 36, the horizontal output line 37, and the reference voltage supply unit 38 are formed. Thus, the structure in which the substrates are electrically connected to each other prevents the increase in the size of the chip and the inhibition of the miniaturization of the area per pixel, similar to the embodiments described above and their modifications. Thus, it is possible to provide the image sensor 1 having a three-layer structure that does not hinder the miniaturization of the area per pixel while having the same chip size as the related art. Moreover, the vertical drive circuit 33 can be formed only on the first substrate 10 or only on the second substrate 20.

[Modification I]

Figure 53:
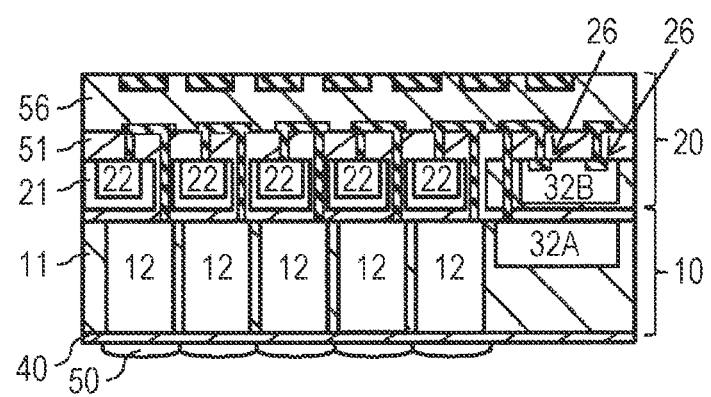
FIG. 53 is a diagram illustrating an example in which a logic circuit is individually formed on a substrate provided with a sensor pixel and on a substrate provided with a readout circuit.

FIG. 53 illustrates a modification of the cross-sectional configuration of the image sensor 1 according to the present modification. In the first embodiment and its modification, the image sensor 1 is configured by stacking three substrates (first substrate 10, second substrate 20, and third substrate 30) on top of each other. However, in the first embodiment and its modification, the image sensor 1 can be configured by stacking two substrates (first substrate 10 and second substrate 20) on top of each other. In this case, in one example, as illustrated in FIG. 53, the logic circuit 32 is formed separately in the first substrate 10 and the second substrate 20. In this example, one circuit 32A of the logic circuit 32 is provided on the side of the first substrate 10. The circuit 32A is provided with a transistor having a gate structure in which a high dielectric constant film including a material capable of withstanding a high-temperature process (e.g., high-k) and a metal gate electrode are stacked on top of each other. On the other hand, the other circuit 32B is provided on the side of the second substrate 20 and has a low-resistance region 26 formed thereon. The low-resistance region 26 includes a silicide prepared on the surface of the impurity diffusion region in contact with the source electrode and the drain electrode by performing the process using a self-aligned silicide (salicide) such as $CoSi_2$ or NiSi. The low-resistance region including a silicide is formed as a compound of the material of the semiconductor substrate and the metal. Thus, a high-temperature process such as thermal oxidation can be employed upon forming the sensor pixel 12. In addition, in the case where the circuit 32B provided on the side of the second substrate 20 of the logic circuit 32 is provided with the low-resistance region 26 including a silicide on the surface of the impurity diffusion region in contact with the source electrode and the drain electrode, it is possible to reduce the contact resistance. Thus, it is possible to increase the calculation speed in the logic circuit 32.

Figure 54:
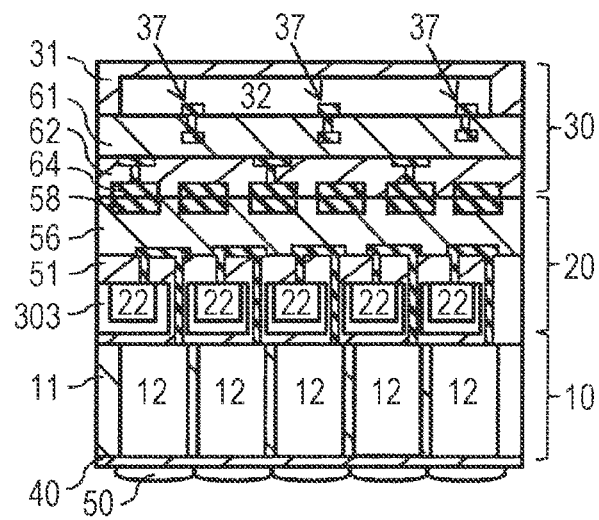
FIG. 54 is a diagram illustrating an example in which a logic circuit is formed on a third substrate.

FIG. 54 illustrates a modification of the cross-sectional configuration of the image sensor 1 according to the first embodiment and its modification described above. The logic circuit 32 of the third substrate 30 according to the first embodiment and its modification described above can have a low-resistance region 37 formed thereon. The low-resistance region 37 includes a silicide prepared on the surface of the impurity diffusion region in contact with the source electrode and the drain electrode by performing the process using a self-aligned silicide (salicide) such as $CoSi_2$ or NiSi. Thus, a high-temperature process such as thermal oxidation can be employed upon forming the sensor pixel 12. In addition, in the case where the logic circuit 32 is provided with the low-resistance region 37 including a silicide on the surface of the impurity diffusion region in contact with the source electrode and the drain electrode, it is possible to reduce the contact resistance. Thus, it is possible to increase the calculation speed in the logic circuit 32.

10. Application Example

Figure 55:
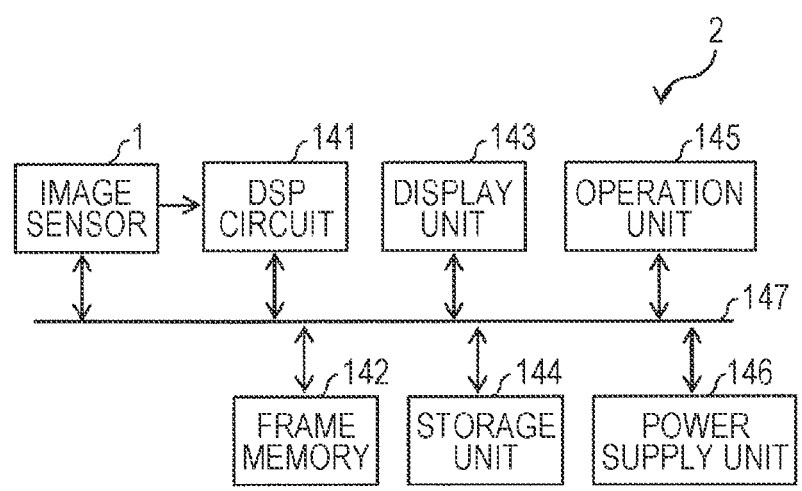
FIG. 55 is a diagram illustrating an example of a schematic configuration of an image capturing system having the image sensor.

FIG. 55 illustrates an example of a schematic configuration of an image capturing system 2 having the image sensor 1.

The image capturing system 2 is, in one example, an electronic apparatus including an image capturing device such as a digital still camera or a video camera and a mobile terminal device such as a smartphone or a tablet terminal. The image capturing system 2 includes, for example, the image sensor 1, a DSP circuit 141, a frame memory 142, a display unit 143, a storage unit 144, an operation unit 145, and a power supply unit 146. In the image capturing system 2, the image sensor 1, the DSP circuit 141, the frame memory 142, the display unit 143, the storage unit 144, the operation unit 145, and the power supply unit 146 are connected to each other via a bus line 147.

The image sensor 1 outputs image data corresponding to the incident light. The DSP circuit 141 is a signal processing circuit that processes the signal (image data) output from the image sensor 1. The frame memory 142 temporarily holds the image data processed by the DSP circuit 141 in frame units. The display unit 143 is a panel-type display device such as a liquid crystal panel or an organic electroluminescence (EL) panel and displays a moving image or a still image captured by the image sensor 1. The storage unit 144 records the image data of the moving image or still image captured by the image sensor 1 on a recording medium such as a semiconductor memory or a hard disk. The operation unit 145 issues an operation command for various functions of the image capturing system 2 in response to the user's operation. The power supply unit 146 appropriately supplies the targets to be powered with various power sources serving as operating power sources for the image sensor 1, the DSP circuit 141, the frame memory 142, the display unit 143, the storage unit 144, and the operation unit 145.

The image capturing procedure in the image capturing system 2 is now described.

Figure 56:
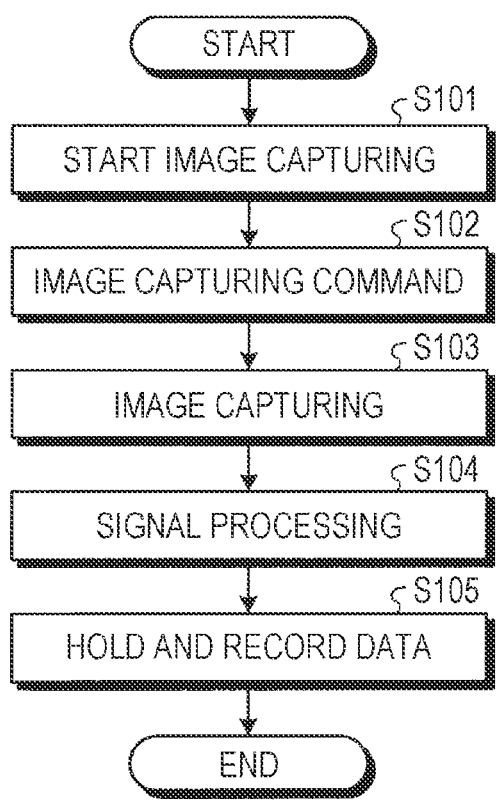
FIG. 56 is a diagram illustrating an example of an image capturing procedure in the image capturing system of FIG. 55.

FIG. 56 illustrates an example of a flowchart of an image capturing operation in the image capturing system 2. The user instructs to start the image capturing by operating the operation unit 145 (step S101). Then, the operation unit 145 transmits an image capturing command to the image sensor 1 (step S102). Upon receiving the image capturing command, the image sensor 1 (specifically, the system control circuit 36) executes the image capturing in accordance with a predetermined image capturing mode (step S103).

The image sensor 1 outputs the image data obtained by the image capturing to the DSP circuit 141. In this description, the image data is data for all pixels of the pixel signal generated on the basis of the electric charge temporarily held in the floating diffusion FD. The DSP circuit 141 performs predetermined signal processing (e.g., noise reduction processing) on the basis of the image data input from the image sensor 1 (step S104). The DSP circuit 141 causes the frame memory 142 to hold the image data subjected to the predetermined signal processing, and the frame memory 142 stores the image data in the storage unit 144 (step S105). In this way, the image capturing in the image capturing system 2 is performed.

In the present application example, the image sensor 1 is applied to the image capturing system 2. Thus, it is possible to reduce the size of the image sensor 1 or achieve a high-definition image sensor, thereby providing a small-sized or high-definition image capturing system 2.

11. Usage Example

Usage Example 1

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 57:
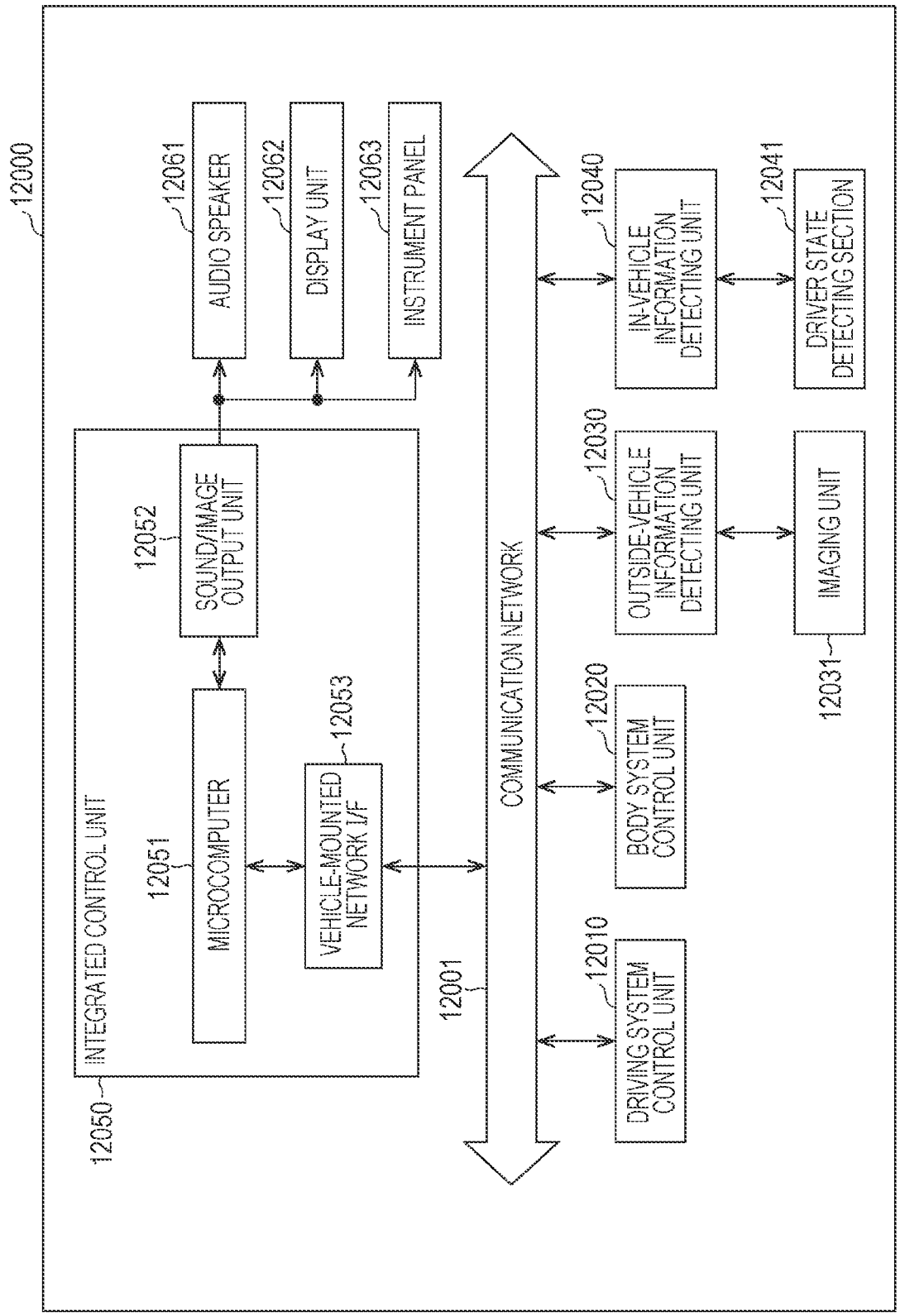
FIG. 57 is a block diagram depicting an example of schematic configuration of a vehicle control system.

FIG. 57 is a block diagram depicting an example of schematic configuration of a vehicle control system as an example of a mobile object control system to which the technology according to the present disclosure can be applied.

The vehicle control system 12000 includes a plurality of electronic control units connected to each other via a communication network 12001. In the example depicted in FIG. 57, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output unit 12052, a vehicle-mounted network interface (I/F) 12053.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside or outside of the vehicle, obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle, obtained by the outside-vehicle information detecting unit 12030 or the in-vehicle information detecting unit 12040.

In addition, the microcomputer 12051 can output a control command to the body system control unit 12020 on the basis of the information about the outside of the vehicle, obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output unit 12052 transmits an output signal of at least one of a sound or an image to an output device capable of visually or auditorily notifying an occupant of the vehicle or the outside of the vehicle of information. In the example of FIG. 57, an audio speaker 12061, a display unit 12062, and an instrument panel 12063 are illustrated as the output device. The display unit 12062 may, for example, include at least one of an on-board display or a head-up display.

Figure 58:
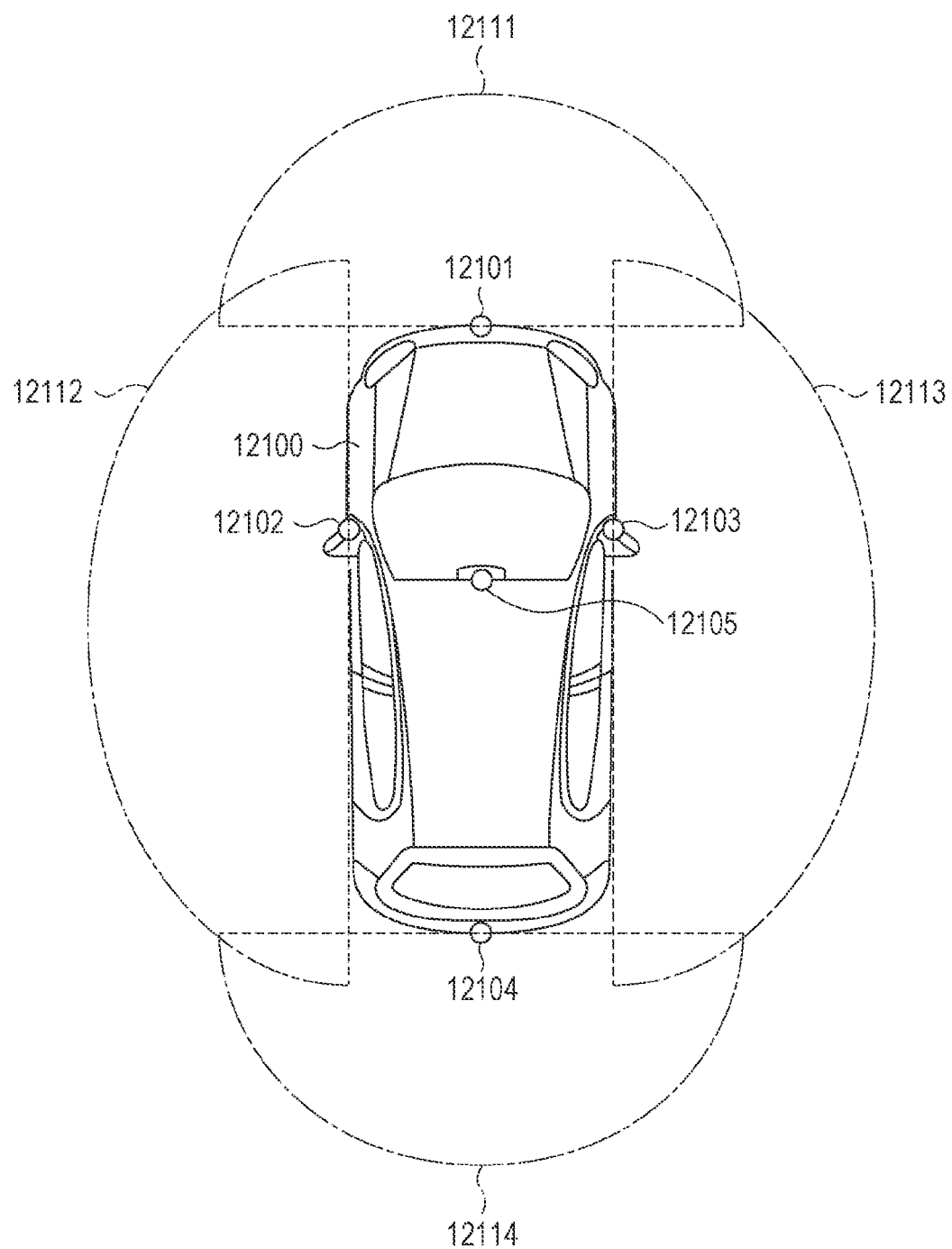
FIG. 58 is a diagram of assistance in explaining an example of installation positions of an outside-vehicle information detecting section and an imaging unit.

FIG. 58 is a diagram depicting an example of the installation position of the imaging unit 12031.

In FIG. 58, the vehicle 12100 includes imaging units 12101, 12102, 12103, 12104, and 12105 as the imaging unit 12031.

The imaging units 12101, 12102, 12103, 12104, and 12105 are positioned, for example, at the front nose, a side mirror, the rear bumper, the back door, and the upper part, or the like, of the windshield in the vehicle compartment of the vehicle 12100. The imaging unit 12101 provided to the front nose and the imaging unit 12105 provided to the upper portion of the windshield within the interior of the vehicle obtain mainly an image of the front of the vehicle 12100. The imaging units 12102 and 12103 attached to the side mirrors chiefly acquire images of the areas on the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Incidentally, FIG. 58 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the side mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of image sensors, or may be an image sensor having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/h). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output unit 12052 controls the display unit 12062 so that a square contour line for emphasis is displayed so as to be superimposed on the recognized pedestrian. Further, the sound/image output unit 12052 may also control the display unit 12062 so that an icon or the like representing the pedestrian is displayed at a desired position.

The description above is given of an exemplary mobile control system to which the technology according to the present disclosure is applicable. The technology according to the present disclosure can be applied to the imaging unit 12031 within the above-described configuration. Specifically, the image sensor 1 according to the embodiment and its modification described above is applicable to the imaging unit 12031. The technology according to the present disclosure applied to the imaging unit 12031 makes it possible to obtain the captured high-definition image with less noise. Thus, it is possible to perform highly accurate control using the captured image in the mobile object control system.

Usage Example 2

Figure 59:
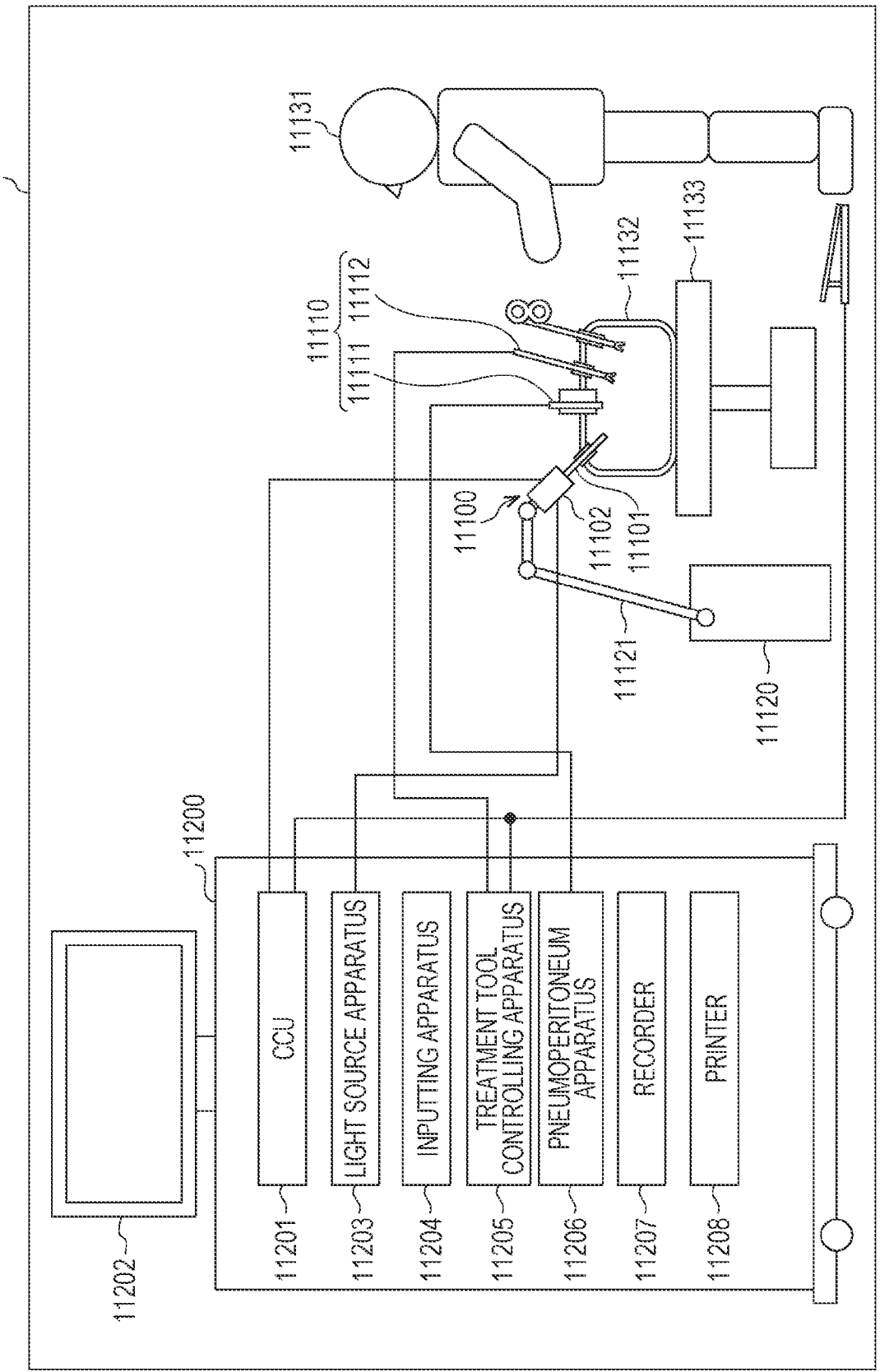
FIG. 59 is a view depicting an example of a schematic configuration of an endoscopic surgery system.

FIG. 59 is a view depicting an example of a schematic configuration of an endoscopic surgery system to which the technology according to the present disclosure (present technology) can be applied.

In FIG. 59, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which is included as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image sensor are provided in the inside of the camera head 11102 such that reflected light (observation light) from the observation target is condensed on the image sensor by the optical system. The observation light is photo-electrically converted by the image sensor to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region and the like to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or the like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image sensors of the camera head 11102 are controlled in synchronism with the irradiation timings, it is also possible to time-divisionally capture images corresponding to respective R, G and B. According to the method just described, a color image can be obtained even if a color filter is not provided for the image sensor.

Further, the light source apparatus 11203 may be controlled such that the intensity of light to be outputted is changed for each predetermined time. By controlling driving of the image sensor of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light of a body tissue, narrow band light observation (narrow band imaging) of imaging a certain tissue such as a blood vessel of a superficial portion of the mucous membrane or the like in a high contrast is performed by applying light of a narrower wavelength band in comparison with irradiation light upon ordinary observation (namely, white light). Alternatively, in special light observation, fluorescent observation for obtaining an image from fluorescent light generated by irradiation of excitation light may also be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue, for example. The light source apparatus 11203 can be configured to supply such narrow-band light and/or excitation light suitable for special light observation as described above.

Figure 60:
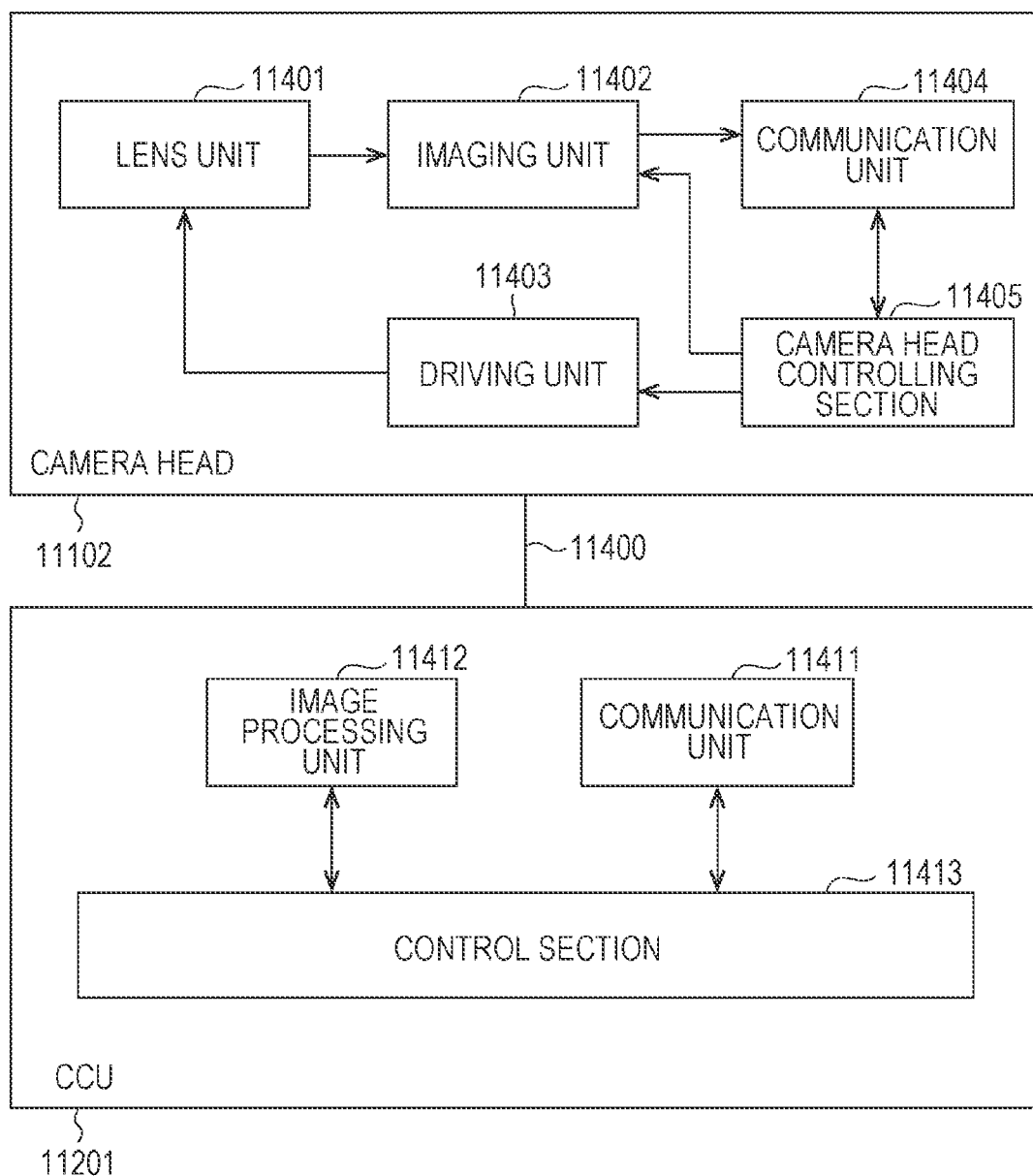
FIG. 60 is a block diagram depicting an example of a functional configuration of the camera head and the CCU.

FIG. 60 is a block diagram depicting an example of a functional configuration of the camera head 11102 and the CCU 11201 depicted in FIG. 59.

The camera head 11102 includes a lens unit 11401, an imaging unit 11402, a driving unit 11403, a communication unit 11404 and a camera head controlling section 11405. The CCU 11201 includes a communication unit 11411, an image processing unit 11412 and a control section 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes image sensors. The number of image sensors which is included by the imaging unit 11402 may be one (so-called single-plate type) or a plural number (so-called multi-plate type). Where the imaging unit 11402 is configured as that of the multi-plate type, for example, image signals corresponding to respective R, G and B are generated by the image sensors, and the image signals may be synthesized to obtain a color image. The imaging unit 11402 may also be configured so as to have a pair of image sensors for acquiring respective image signals for the right eye and the left eye ready for three dimensional (3D) display. If 3D display is performed, then the depth of a living body tissue in a surgical region can be comprehended more accurately by the surgeon 11131. It is to be noted that, in a case where the imaging unit 11402 is configured as that of multi-plate type, a plurality of systems of lens units 11401 is provided corresponding to the individual image sensors.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling section 11405. Consequently, the magnification and the focal point of a picked up image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling section 11405. The control signal includes information regarding image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be appropriately designated by the user or may be set automatically by the control section 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling section 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control section 11413 performs various kinds of control relating to image picking up of a surgical region or the like by the endoscope 11100 and display of a picked up image obtained by image picking up of the surgical region or the like. For example, the control section 11413 creates a control signal for controlling driving of the camera head 11102.

Further, the control section 11413 controls, on the basis of an image signal for which image processes have been performed by the image processing unit 11412, the display apparatus 11202 to display a picked up image in which the surgical region or the like is imaged. Thereupon, the control section 11413 may recognize various objects in the picked up image using various image recognition technologies. For example, the control section 11413 can recognize a surgical tool such as forceps, a particular living body region, bleeding, mist when the energy device 11112 is used and so forth by detecting the shape, color and so forth of edges of objects included in a picked up image. The control section 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description above is given of an example of the endoscopic surgery system to which the technology according to the present disclosure is applicable. The technology according to the present disclosure is suitably applicable to the imaging unit 11402 provided on the camera head 11102 of the endoscope 11100 in the configuration described above. The technology according to the present disclosure applied to the imaging unit 11402 makes it possible to reduce the size of the imaging unit 11402 or achieve high-definition image capturing unit. Thus, it is possible to provide a small-sized or high-definition endoscope 11100.

Although the description for the present disclosure is given above in view of the embodiments and the modifications, application examples and usage examples thereof, the technical scope of the present disclosure is not limited to the above-described embodiments and the like as they are, and various changes and variations can be made without departing from the spirit and scope of the present disclosure. In addition, the constituent elements described in different embodiments and modifications may be combined arbitrarily.

Moreover, the effects in the embodiments described in the present specification are merely illustrative and are not restrictive, and other effects are achievable.

Additionally, the present technology may also be configured as below.

(1)

An image sensor including:

a first substrate having a plurality of photoelectric transducers formed on the first substrate;

a second substrate having a pixel transistor for each of sets of two or more of the photoelectric transducers as a constituent unit, the pixel transistor being shared by the set and formed on the second substrate; and a second wiring which is connected to a first wiring formed on the second substrate via one contact, and is connected to a plurality of first elements, the first wiring leading to a second element shared by a plurality of first elements among a plurality of elements formed on the first substrate, each of the plurality of first elements being formed for each of the photoelectric transducers.

(2)

The image sensor according to (1), in which the second wiring is connected, for each set of two or more of the photoelectric transducers, to a plurality of the first elements having a one-to-one correspondence with two or more of the photoelectric transducers included in the set, and the second wiring is connected, via one contact, to the first wiring leading to the second element shared by the plurality of the first elements.

(3)

The image sensor according to (1) or (2), in which the second wiring is arranged closer to a light incident surface side than the second substrate.

(4)

The image sensor according to any one of (1) to (3), in which the first substrate has a transfer transistor formed on the first substrate and used for transferring, for each photoelectric transducer, an electric signal output from the photoelectric transducer to the pixel transistor, the second substrate has the pixel transistor formed on the second substrate, the pixel transistor including at least one amplification transistor configured to, for each one or more of the sets, amplify and output an electric signal transferred from each of two or more of the transfer transistors included in the set, the first element includes an output terminal side of the transfer transistor, and the second element includes a gate of the amplification transistor.

(5)

The image sensor according to claim 4, in which the output terminal side of the transfer transistor is a floating diffusion temporarily holding the electric signal output from the photoelectric transducer.

(6)

The image sensor according to (4) or (5), in which the transfer transistor is an N-type transistor, and the second wiring is formed as P-type polysilicon.

(7)

The image sensor according to (6), in which the first element includes an electrode connected to the photoelectric transducer, the second element includes a reference potential line supplied with a reference potential, the electrode is formed as P-type polysilicon, and the second wiring used for connecting a plurality of the electrodes, via one contact, to the first wiring leading to the reference potential line is formed as N-type polysilicon.

(8)

The image sensor according to (4), in which the transfer transistor is a P-type transistor, and the second wiring is formed as N-type polysilicon.

(9)

The image sensor according to (8), in which the first element includes an electrode connected to the photoelectric transducer, the second element includes a reference potential line supplied with a reference potential, the electrode is formed as N-type polysilicon, and the second wiring used for connecting a plurality of the electrodes, via one contact, to the first wiring leading to the reference potential line is formed as P-type polysilicon.

(10)

The image sensor according to any one of (1) to (4), in which the first element includes an electrode connected to the photoelectric transducer, and the second element includes a reference potential line supplied with a reference potential.

(11)

The image sensor according to any one of (1) to (4) or (10), in which the second wiring is formed including tungsten.

(12)

The image sensor according to any one of (1), (2), or (4) to (11), in which the second wiring is arranged in an insulating region formed between a first semiconductor region of the second substrate and a second semiconductor region of the second substrate.

(13)

The image sensor according to any one of (1), (2), or (4) to (11), in which the second wiring is arranged between the second element and the first wiring.

(14)

An electronic apparatus including:

an image sensor;

an optical system configured to guide incident light to the image sensor; and a processing unit configured to process a signal output from the image sensor, in which the image sensor includes a first substrate having a plurality of photoelectric transducers formed on the first substrate, a second substrate having a pixel transistor for each of sets of two or more of the photoelectric transducers as a constituent unit, the pixel transistor being shared by the set and formed on the second substrate, and a second wiring which is connected to a first wiring formed on the second substrate via one contact, and is connected to a plurality of first elements, the first wiring leading to a second element shared by a plurality of first elements among a plurality of elements formed on the first substrate, each of the plurality of first elements being formed for each of the photoelectric transducers.

(15)

An image sensor including:

a first substrate having a first photoelectric transducer and a second photoelectric transducer formed on the first substrate;

a first wiring formed on the first substrate and connected to the first photoelectric transducer and the second photoelectric transducer;

a second substrate having a pixel transistor formed on the second substrate, the pixel transistor being connected to the first photoelectric transducer and the second photoelectric transducer;

a second wiring formed on the second substrate; and a third wiring formed to penetrate the first substrate and the second substrate and connected to the first wiring and the second wiring.

(16)

The image sensor according to (15), in which the pixel transistor has at least one of an amplification transistor, a reset transistor, and a selection transistor.

(17)

The image sensor according to (15) or (16), in which the first substrate has a first transfer transistor connected to the first photoelectric transducer and a second transfer transistor connected to the second photoelectric transducer.

(18)

The image sensor according to (17), in which the first wiring is connected to a first floating diffusion region connected to the first transfer transistor and a second floating diffusion region connected to the second transfer transistor.

(19)

The image sensor according to (18), further including:

a third substrate stacked on the second substrate and having a logic circuit configured to process a signal generated by the first photoelectric transducer or the second photoelectric transducer.

(20)

An electronic apparatus including:

an image sensor;

an optical system configured to guide incident light to the image sensor; and a processing unit configured to process a signal output from the image sensor, in which the image sensor includes a first substrate having a first photoelectric transducer and a second photoelectric transducer formed on the first substrate;

a first wiring formed on the first substrate and connected to the first photoelectric transducer and the second photoelectric transducer;

a second substrate having a pixel transistor formed on the second substrate, the pixel transistor being connected to the first photoelectric transducer and the second photoelectric transducer;

a second wiring formed on the second substrate; and a third wiring formed to penetrate the first substrate and the second substrate and connected to the first wiring and the second wiring.

REFERENCE SIGNS LIST

1 Image sensor
10 First substrate
20 Second substrate
30 Third substrate
202 Semiconductor region
203 Pixel separation portion
204 Semiconductor region
221 Drain region
222 Source region
223 Gate electrode
301a, 301b Wiring
311 Gate electrode
312 Drain region
313 Source region
321 Drain region
322 Source region
323 Gate electrode
AMP Amplification transistor
Ct, Ct2 Contact
D1 Wiring
PD Photodiode
RST Reset transistor
SEL Selection transistor
TR Transfer transistor

The invention claimed is:

1. An image sensor comprising:

a first substrate having a plurality of photoelectric transducers formed on the first substrate;

a second substrate having a pixel transistor for each of sets of two or more of the photoelectric transducers as a constituent unit, the pixel transistor being shared by the set and formed on the second substrate; and a second wiring which is connected to a first wiring formed on the second substrate via one contact, and is connected to a plurality of first elements, the first wiring leading to a second element shared by a plurality of first elements among a plurality of elements formed on the first substrate, each of the plurality of first elements being formed for each of the photoelectric transducers.

2. The image sensor according to claim 1, wherein the second wiring is connected, for each set of two or more of the photoelectric transducers, to a plurality of the first elements having a one-to-one correspondence with two or more of the photoelectric transducers included in the set, and the second wiring is connected, via one contact, to the first wiring leading to the second element shared by the plurality of the first elements.

3. The image sensor according to claim 1, wherein the second wiring is arranged closer to a light incident surface side than the second substrate.

4. The image sensor according to claim 1, wherein the first substrate has a transfer transistor formed on the first substrate and used for transferring, for each photoelectric transducer, an electric signal output from the photoelectric transducer to the pixel transistor, the second substrate has the pixel transistor formed on the second substrate, the pixel transistor including at least one amplification transistor configured to, for each one or more of the sets, amplify and output an electric signal transferred from each of two or more of the transfer transistors included in the set, the first element includes an output terminal side of the transfer transistor, and the second element includes a gate of the amplification transistor.

5. The image sensor according to claim 4,
wherein the output terminal side of the transfer transistor is a floating diffusion temporarily holding the electric signal output from the photoelectric transducer.

6. The image sensor according to claim 4,
wherein the transfer transistor is an N-type transistor, and the second wiring is formed as P-type polysilicon.

7. The image sensor according to claim 6,
wherein the first element includes an electrode connected to the photoelectric transducer,
the second element includes a reference potential line supplied with a reference potential,
the electrode is formed as P-type polysilicon, and
the second wiring used for connecting a plurality of the electrodes, via one contact, to the first wiring leading to the reference potential line is formed as N-type polysilicon.

8. The image sensor according to claim 4,
wherein the transfer transistor is a P-type transistor, and the second wiring is formed as N-type polysilicon.

9. The image sensor according to claim 8,
wherein the first element includes an electrode connected to the photoelectric transducer,
the second element includes a reference potential line supplied with a reference potential,
the electrode is formed as N-type polysilicon, and
the second wiring used for connecting a plurality of the electrodes, via one contact, to the first wiring leading to the reference potential line is formed as P-type polysilicon.

10. The image sensor according to claim 1,
wherein the first element includes an electrode connected to the photoelectric transducer, and
the second element includes a reference potential line supplied with a reference potential.

11. The image sensor according to claim 1,
wherein the second wiring is formed including tungsten.

12. The image sensor according to claim 1,
wherein the second wiring is arranged in an insulating region formed between a first semiconductor region of the second substrate and a second semiconductor region of the second substrate.

13. The image sensor according to claim 1,
wherein the second element is arranged between the second wiring and the first wiring.

* * * * *